(12) United States Patent
Ohashi et al.

(10) Patent No.: US 9,104,110 B2
(45) Date of Patent: Aug. 11, 2015

(54) POLYMER, RESIST COMPOSITION AND PATTERNING PROCESS

(71) Applicant: SHIN-ETSU CHEMICAL CO., LTD., Tokyo (JP)

(72) Inventors: Masaki Ohashi, Joetsu (JP); Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 172 days.

(21) Appl. No.: 13/902,472

(22) Filed: May 24, 2013

(65) Prior Publication Data

US 2013/0323647 A1    Dec. 5, 2013

(30) Foreign Application Priority Data

Jun. 4, 2012  (JP) ................................ 2012-127062

(51) Int. Cl.
| | |
|---|---|
| G03F 7/039 | (2006.01) |
| G03F 7/38 | (2006.01) |
| G03F 7/004 | (2006.01) |
| C08F 224/00 | (2006.01) |
| C08F 220/68 | (2006.01) |
| C08F 220/30 | (2006.01) |
| C08F 220/24 | (2006.01) |
| C08F 220/28 | (2006.01) |
| C08F 220/38 | (2006.01) |
| G03F 7/038 | (2006.01) |

(52) U.S. Cl.
CPC .............. *G03F 7/38* (2013.01); *C08F 220/24* (2013.01); *C08F 220/28* (2013.01); *C08F 220/30* (2013.01); *C08F 220/38* (2013.01); *C08F 220/68* (2013.01); *C08F 224/00* (2013.01); *G03F 7/004* (2013.01); *G03F 7/039* (2013.01); *G03F 7/0382* (2013.01); *G03F 7/0392* (2013.01)

(58) Field of Classification Search
None
See application file for complete search history.

(56) References Cited

U.S. PATENT DOCUMENTS

| | | | |
|---|---|---|---|
| 5,650,483 A | 7/1997 | Malik et al. | |
| 5,705,702 A | 1/1998 | Osawa et al. | |
| 6,312,867 B1 | 11/2001 | Kinsho et al. | |
| 6,440,634 B1 | 8/2002 | Ohsawa et al. | |
| 6,830,866 B2 | 12/2004 | Kobayashi et al. | |
| 6,908,722 B2 | 6/2005 | Ebata et al. | |
| 7,482,108 B2 | 1/2009 | Matsumaru et al. | |
| 7,527,912 B2 | 5/2009 | Ohsawa et al. | |
| 7,531,290 B2 | 5/2009 | Kobayashi et al. | |
| 7,556,909 B2 | 7/2009 | Kobayashi et al. | |
| 7,569,326 B2 | 8/2009 | Ohsawa et al. | |
| 7,575,850 B2 | 8/2009 | Takata et al. | |
| 7,622,242 B2 | 11/2009 | Hatakeyama et al. | |
| 7,771,914 B2 | 8/2010 | Hatakeyama et al. | |
| 7,919,226 B2 | 4/2011 | Ohsawa et al. | |
| 7,956,142 B2 | 6/2011 | Nagai et al. | |
| 8,057,981 B2 | 11/2011 | Harada et al. | |
| 8,057,985 B2 | 11/2011 | Ohashi et al. | |
| 8,114,570 B2 | 2/2012 | Ohsawa et al. | |
| 8,114,571 B2 | 2/2012 | Ohashi et al. | |
| 8,173,354 B2 | 5/2012 | Ohsawa et al. | |
| 8,236,842 B2 | 8/2012 | Yoshida et al. | |
| 8,252,504 B2 | 8/2012 | Harada et al. | |
| 8,268,528 B2 | 9/2012 | Harada et al. | |
| 8,273,837 B2 | 9/2012 | Nagai et al. | |
| 8,283,104 B2 | 10/2012 | Ohashi et al. | |
| 8,313,886 B2 | 11/2012 | Harada et al. | |
| 2005/0208424 A1 | 9/2005 | Hasegawa et al. | |
| 2009/0280434 A1 | 11/2009 | Harada et al. | |
| 2010/0035185 A1 | 2/2010 | Hagiwara et al. | |
| 2010/0112482 A1 | 5/2010 | Watanabe et al. | |
| 2010/0304302 A1* | 12/2010 | Masunaga et al. | ......... 430/285.1 |
| 2011/0269074 A1 | 11/2011 | Aqad et al. | |

FOREIGN PATENT DOCUMENTS

| | | |
|---|---|---|
| JP | 08-311018 A | 11/1996 |
| JP | 09-15848 A | 1/1997 |
| JP | 2000-336121 A | 12/2000 |
| JP | 2001-122850 A | 5/2001 |
| JP | 2003-66612 A | 3/2003 |
| JP | 2004-2252 A | 1/2004 |
| JP | 2005-264103 A | 9/2005 |
| JP | 2006-45311 A | 2/2006 |
| JP | 2006-178317 A | 7/2006 |
| JP | 2007-145797 A | 6/2007 |
| JP | 2007-145803 A | 6/2007 |
| JP | 2007-145804 A | 6/2007 |
| JP | 2007-298569 A | 11/2007 |
| JP | 2008-94835 A | 4/2008 |
| JP | 2008-106045 A | 5/2008 |
| JP | 2008-122932 A | 5/2008 |

(Continued)

OTHER PUBLICATIONS

Kishikawa, Yasuhiro, et al., "Assessment of trade-off between resist resolution and sensitivity for optimization of hyper-NA immersion lithography", Proceedings of SPIE, 2007, vol. 6520, pp. 65203L-1-65203L-9.

(Continued)

*Primary Examiner* — Cynthia Hamilton
(74) *Attorney, Agent, or Firm* — Westerman, Hattori, Daniels & Adrian, LLP

(57) ABSTRACT

A photo or heat-sensitive polymer comprising recurring units having polymerizable anion-containing sulfonium salt and phenolic hydroxyl-containing recurring units is useful as a base resin to formulate a resist composition having high sensitivity, high resolution and low LWR.

16 Claims, 2 Drawing Sheets

(56) References Cited

FOREIGN PATENT DOCUMENTS

| | | |
|---|---|---|
| JP | 2008-133448 A | 6/2008 |
| JP | 2008-209917 A | 9/2008 |
| JP | 2009-7327 A | 1/2009 |
| JP | 2009-98638 A | 5/2009 |
| JP | 2009-191151 A | 8/2009 |
| JP | 2009-192784 A | 8/2009 |
| JP | 2009-258695 A | 11/2009 |
| JP | 2009-269953 A | 11/2009 |
| JP | 2009-276363 A | 11/2009 |
| JP | 2010-20204 A | 1/2010 |
| JP | 2010-77404 A | 4/2010 |
| JP | 2010-107695 A | 5/2010 |
| JP | 2010-134012 A | 6/2010 |
| JP | 2010-215608 A | 9/2010 |
| JP | 2010-250105 A | 11/2010 |
| JP | 2011-16746 A | 1/2011 |
| JP | 2011-42789 A | 3/2011 |
| JP | 2011-215619 A | 10/2011 |
| JP | 2012-72109 A | 4/2012 |
| WO | 2007/069640 A1 | 6/2007 |
| WO | 2008/056795 A1 | 5/2008 |

OTHER PUBLICATIONS

Van Steenwinckel, D., et al., "Lithographic Importance of Acid Diffusion in Chemically Amplified Resists", Proceedings of SPIE, 2005, vol. 5753, pp. 269-280.

Hutchinson, John M., "The Shot Noise Impact on Resist Roughness in EUV Lithography", Proceedings of SPIE, 1998, vol. 3331, pp. 531-536.

Brainard, Robert L. et al., "Shot Noise, LER and Quantum Efficiency of EUV Photoresists", Proceedings of SPIE, 2004, vol. 5374, pp. 74-85.

Kozawa, Takahiro et al., "Basic aspects of acid generation processes in chemically amplified resists for electron beam lithography", Proceedings of SPIE, 2005, vol. 5753, pp. 361-367.

Nakano, Atsuro et al., "Deprotonation mechanism of poly(4-hydroxystyrene) and its derivative", Proceedings of SPIE, 2005, vol. 5753, pp. 1034-1039.

Wang, Mingxing et al., "Novel Anionic Photoacid Generator(PAGs) and Photoresist for sub-50 nm Patterning by EUVL and EBL", Proceedings of SPIE, 2007, vol. 6519, pp. 65191F-1-65191F-6.

* cited by examiner

POLYMER, RESIST COMPOSITION AND PATTERNING PROCESS

CROSS-REFERENCE TO RELATED APPLICATION

This non-provisional application claims priority under 35 U.S.C. §119(a) on Patent Application No. 2012-127062 filed in Japan on Jun. 4, 2012, the entire contents of which are hereby incorporated by reference.

TECHNICAL FIELD

This invention relates to a polymer which is sensitive to high energy radiation or heat to generate sulfonic acid, a resist composition comprising the polymer, and a patterning process using the composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of wavelength 13.5 nm, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in Non-Patent Document 1. Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast.

A triangular tradeoff relationship among sensitivity, resolution, and roughness has been pointed out in Non-Patent Document 2. Specifically, acid diffusion must be suppressed in order to enlarge the exposure margin whereas a short acid diffusion distance of less than 50 nm leads to a rapid degradation of roughness.

The addition of an acid generator capable of generating a bulky acid is an effective means for suppressing acid diffusion. It was then proposed to incorporate in a polymer an acid generator of an onium salt having a polymerizable olefin. Patent Document 1 discloses a sulfonium salt having polymerizable olefin capable of generating a specific sulfonic acid and a similar iodonium salt. Patent Document 2 discloses a sulfonium salt having sulfonic acid directly attached to the main chain.

A tradeoff relationship between sensitivity and roughness has been pointed out. For example, Non-Patent Document 3 describes that sensitivity is in inverse proportion to roughness. It is expected that the roughness of a resist film is reduced by increasing the exposure dose to reduce shot noise. Non-Patent Document 4 describes a tradeoff between sensitivity and roughness in the EUV lithography in that a resist material containing a more amount of quencher is effective in reducing roughness, but suffers from a decline of sensitivity at the same time. There is a need to enhance the quantum efficiency of acid generation in order to overcome the problem.

With respect to the acid generating mechanism triggered by EB exposure, Non-Patent Document 5 reports that PAG releases acid through the mechanism that a polymer is excited by exposure so that electrons migrate to the PAG. Since the irradiation energy of EB or EUV is higher than the threshold value (10 eV) of ionization potential energy of a base polymer, it is presumed that the base polymer is readily ionized. An exemplary material of accelerating electron migration is hydroxystyrene.

It is reported in Non-Patent Document 6 that poly-4-hydroxystyrene has a higher acid generation efficiency in EB exposure than poly-4-methoxystyrene, indicating that poly-4-hydroxystyrene provides for efficient migration of electrons to PAG upon EB exposure.

Patent Document 3 discloses a resist material comprising a base resin having a sulfonium salt bound thereto wherein the sulfonium salt is liberated under the action of the generated acid. This resist material is less effective in reducing roughness (LWR) and has room for a further improvement in sensitivity.

Reported in Non-Patent Document 7 is a material obtained through copolymerization of hydroxystyrene for increasing the acid generation efficiency by electron migration, a methacrylate of PAG having sulfonic acid directly bonded to a polymer backbone for suppressing acid diffusion, and a methacrylate having an acid labile group. This material is still insufficient. A material having satisfactory sensitivity, resolution and roughness is desired.

CITATION LIST

Patent Document 1: JP-A 2006-045311 (U.S. Pat. No. 7,482, 108)
Patent Document 2: JP-A 2006-178317

Patent Document 3: JP-A 2011-215619
Non-Patent Document 1: SPIE Vol. 6520 65203L-1 (2007)
Non-Patent Document 2: SPIE Vol. 5753 p 269 (2005)
Non-Patent Document 3: SPIE Vol. 3331 p 531 (1998)
Non-Patent Document 4: SPIE Vol. 5374 p 74 (2004)
Non-Patent Document 5: SPIE Vol. 5753 p 361 (2005)
Non-Patent Document 6: SPIE Vol. 5753 p 1034 (2005)
Non-Patent Document 7: SPIE Vol. 6519 p 65191F-1 (2007)

SUMMARY OF INVENTION

An object of the present invention is to provide a specific polymer; a positive resist composition, typically chemically amplified positive resist composition comprising the specific polymer, which composition exhibits a higher sensitivity and resolution than the prior art positive resist compositions and minimal roughness (LWR), and forms a pattern of good profile after exposure; and a patterning process using the resist composition.

The inventors have found that a resist composition comprising a polymer comprising recurring units derived from a specific onium salt exhibits a high sensitivity, high resolution, and minimal LWR, and allows for precise micro-processing.

In one aspect, the invention provides a photo or heat-sensitive polymer comprising recurring units having the general formula (1A) or (1B) and recurring units having the general formula (2).

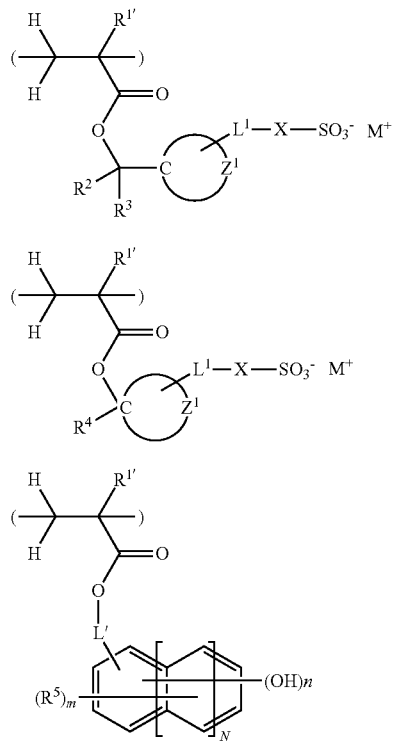

Herein $R^1$ is hydrogen, methyl or trifluoromethyl, $R^2$, $R^3$ and $R^4$ are each independently a straight, branched or cyclic $C_1$-$C_{15}$ monovalent hydrocarbon group, L is a single bond or a straight, branched or cyclic $C_1$-$C_{20}$ divalent hydrocarbon group which may be substituted with or separated by a heteroatom, X is a $C_1$-$C_5$ divalent alkylene group in which some or all hydrogen atoms may be substituted by fluorine atoms, each of $Z^1$ and $Z^2$ forms a $C_5$-$C_{15}$ alicyclic group with the carbon atom to which it is attached, $R^5$ is a halogen atom or $C_1$-$C_{10}$ alkyl group, L' is a single bond or $C_1$-$C_{10}$ divalent organic group which may be substituted with an oxygen atom, m is an integer of 0 to 3, n is an integer of 1 or 2, N is an integer of 0 to 2, $M^+$ is a sulfonium cation of the general formula (a) or iodonium cation of the general formula (b),

wherein $R^{101a}$, $R^{101b}$, and $R^{101c}$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^{101a}$, $R^{101b}$, and $R^{101c}$ may bond together to form a ring with the sulfur atom, $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom.

In a preferred embodiment, the recurring units (1A) or (1B) have the general formula (3A) or (3B).

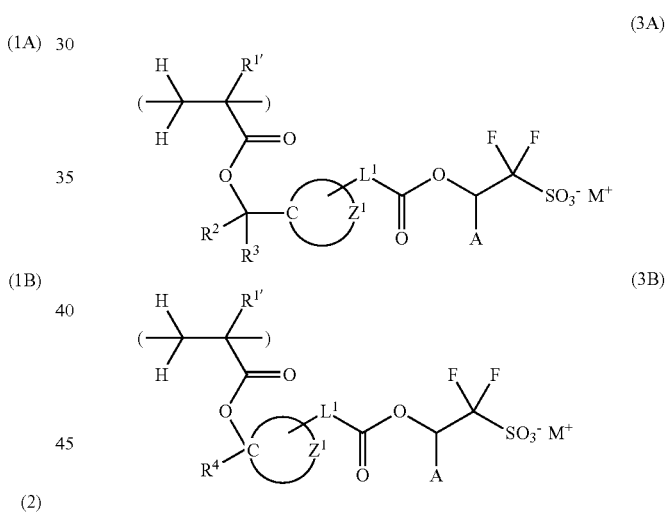

Herein $R^1$, $R^2$, $R^3$, $R^4$, $Z^1$, $Z^2$, and $M^+$ are as defined above, $L^1$ is a single bond or a straight, branched or cyclic $C_1$-$C_{20}$ divalent hydrocarbon group which may be substituted with or separated by a heteroatom, and A is hydrogen or trifluoromethyl.

The polymer may further comprise recurring units of at least one type selected from the general formulae (4) and (5).

-continued

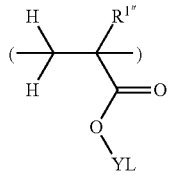
(5)

Herein $R^{1'}$ and $R^{1''}$ are each independently hydrogen, methyl or trifluoromethyl, Z is a single bond, phenylene group, naphthylene group or (backbone) —C(=O)—O—Z'—, Z' is a straight, branched or cyclic $C_1$-$C_{10}$ alkylene group which may contain a hydroxyl radical, ether bond, ester bond or lactone ring, or phenylene group or naphthylene group, XA is an acid labile group, and YL is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

In a second aspect, the invention provides a resist composition comprising the polymer defined above as a base resin, or a resist composition comprising the polymer defined above and a polymer free of recurring units having formulae (1A), (1B), (3A) and (3B) as base resin. Optionally, the resist composition comprises a basic compound, an organic solvent, a non-polymeric acid generator, and/or a surfactant which is insoluble in water and soluble in alkaline developer.

In a third aspect, the invention provides a pattern forming process comprising the steps of applying the resist composition defined above onto a substrate to form a coating, baking, exposing the coating to high-energy radiation, and developing the exposed coating in a developer.

In a preferred embodiment, the exposure step is carried out by immersion lithography using a liquid having a refractive index of at least 1.0 between the resist coating and a projection lens. More preferably, a protective film is coated on the resist coating prior to the exposure step. Then immersion lithography is carried out while the liquid is held between the protective film and the projection lens.

Most often, the high-energy radiation is EB or soft X-ray having a wavelength of 3 to 15 nm.

ADVANTAGEOUS EFFECTS OF INVENTION

The resist composition comprising the specific polymer as base resin exhibits a high sensitivity, high resolution, and minimal LWR. The resist composition is best suited as a precise micropatterning material, especially by EB and EUV lithography processes.

DESCRIPTION OF EMBODIMENTS

Figure 1:
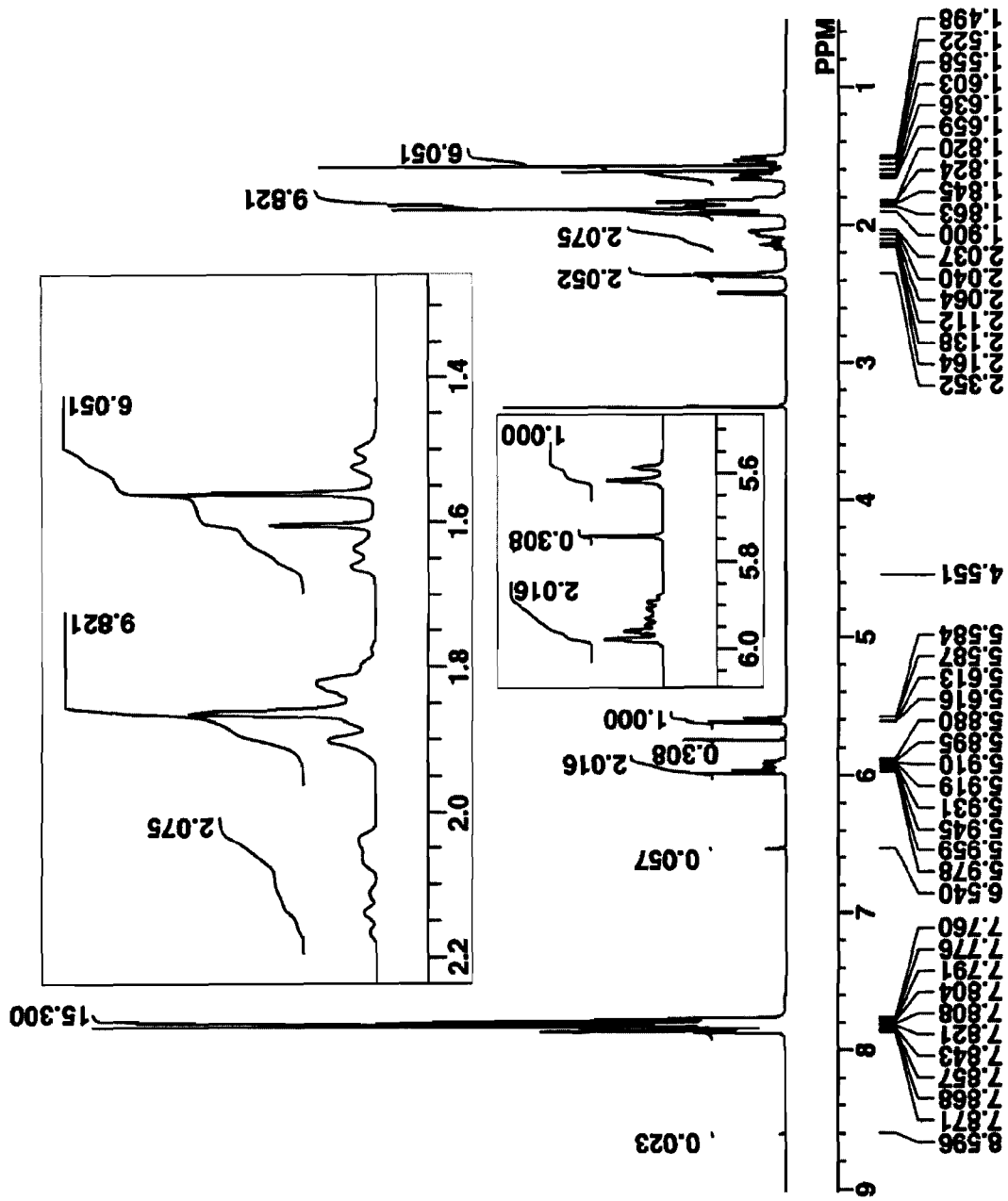
FIG. 1 is a diagram of $^1$H-NMR of PAG-1 in Synthesis Example 1-1.

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

The notation (Cn-Cm) means a group containing from n to m carbon atoms per group.

The abbreviations have the following meaning.

EB: electron beam
UV: ultraviolet
EUV: extreme ultraviolet
PAG: photoacid generator
PEB: post-exposure bake
LWR: line width roughness The term "high-energy radiation" is intended to encompass UV, deep UV, EUV, EB, x-ray, excimer laser, gamma-ray and synchrotron radiation.

One embodiment of the invention is a polymer or high-molecular-weight compound comprising recurring units having the general formula (1A) or (1B) and recurring units having the general formula (2).

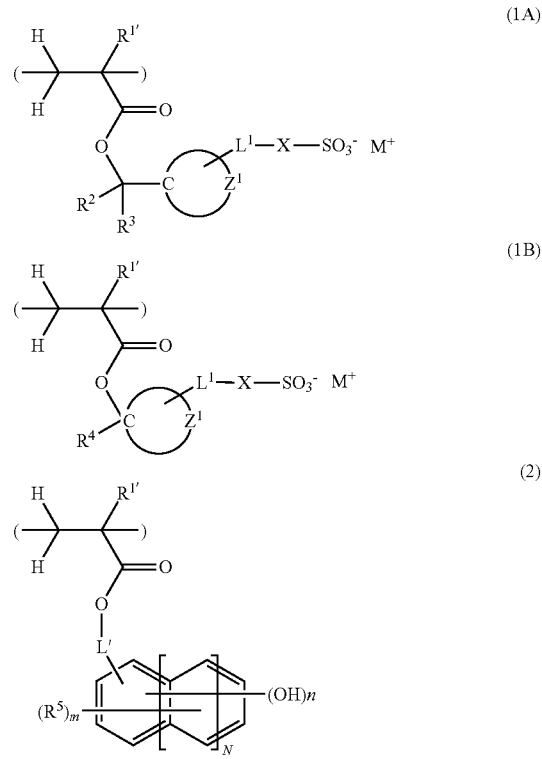

Herein $R^1$ is hydrogen, methyl or trifluoromethyl. $R^2$, $R^3$ and $R^4$ are each independently a straight, branched or cyclic $C_1$-$C_{15}$ monovalent hydrocarbon group. L is a single bond or a straight, branched or cyclic $C_1$-$C_{20}$ divalent hydrocarbon group which may be substituted with a heteroatom or separated by a heteroatom. X is a $C_1$-$C_5$ divalent alkylene group in which some or all hydrogen atoms may be substituted by fluorine atoms. Each of $Z^1$ and $Z^2$ forms a $C_5$-$C_{15}$ alicyclic group with the carbon atom to which it is attached. $R^5$ is a halogen atom or $C_1$-$C_{10}$ alkyl group. L' is a single bond or $C_1$-$C_{10}$ divalent organic group which may be substituted with an oxygen atom. The subscript m is an integer of 0 to 3, n is an integer of 1 or 2, and N is an integer of 0 to 2. $M^+$ is a sulfonium cation of the general formula (a) or iodonium cation of the general formula (b).

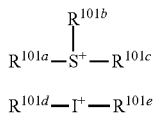

Herein $R^{101a}$, $R^{101b}$, and $R^{101c}$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^{101a}$, $R^{101b}$, and $R^{101c}$ may bond together to form a ring with the sulfur atom to which they are attached. $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached.

Below these recurring units are described in detail.

In formulae (1A) and (1B), $R^1$ is hydrogen, methyl or trifluoromethyl. $R^2$, $R^3$ and $R^4$ are each independently a straight, branched or cyclic $C_1$-$C_{15}$ monovalent hydrocarbon group. Suitable hydrocarbon groups of $R^2$, $R^3$ and $R^4$ include methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl. In formulae (1A) and (1B), $M^+$ is a sulfonium or iodonium cation of formula (a) or (b). In formula (a), $R^{101a}$, $R^{101b}$, and $R^{101c}$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^{101a}$, $R^{101b}$, and $R^{101c}$ may bond together to form a ring with the sulfur atom to which they are attached.

Specifically, suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxypropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, thienyl, 4-hydroxyphenyl; alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkylphenyl groups such as 2-methylphenyl, 3-methylphenyl, 4-methylphenyl, 4-ethylphenyl, 4-tert-butylphenyl, 4-n-butylphenyl and 2,4-dimethylphenyl; alkylnaphthyl groups such as methylnaphthyl and ethylnaphthyl; alkoxynaphthyl groups such as methoxynaphthyl, ethoxynaphthyl, n-propoxynaphthyl and n-butoxynaphthyl; dialkylnaphthyl groups such as dimethylnaphthyl and diethylnaphthyl; and dialkoxynaphthyl groups such as dimethoxynaphthyl and diethoxynaphthyl. Suitable aralkyl groups include benzyl, 1-phenylethyl and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. When any two or more of $R^{101a}$, $R^{101b}$, and $R^{101c}$ bond together to form a ring with the sulfur atom, exemplary cyclic structures have the following formulae.

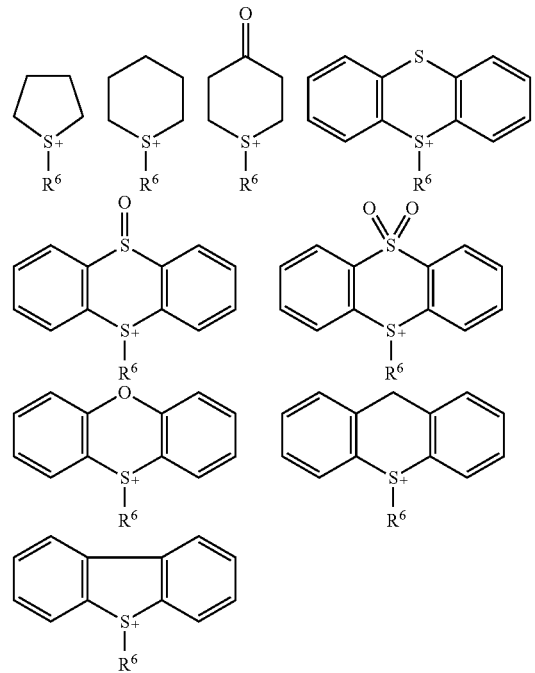

Herein $R^6$ is a substituted or unsubstituted, straight, branched or cyclic $C_1$-$C_{10}$ alkyl, alkenyl or oxoalkyl group, or a substituted or unsubstituted $C_6$-$C_{18}$ aryl, aralkyl or aryloxoalkyl group. Examples of the alkyl, alkenyl or oxoalkyl group or aryl, aralkyl or aryloxoalkyl group of $R^6$ are as exemplified above for $R^{101a}$, $R^{101b}$ and $R^{101c}$.

Illustrative examples of the sulfonium cation include alkylsulfonium cations such as trimethylsulfonium, tribenzylsulfonium, 2-oxocyclohexylcyclohexylmethylsulfonium, dimethylphenylsulfonium, dimethylnaphthylsulfonium, dimethyl(2-naphthyl)sulfonium, 4-hydroxyphenyldimethylsulfonium, 4-methoxyphenyldimethylsulfonium, diphenylmethylsulfonium, 1-(2-oxo-2-phenylethyl)tetrahydrothiophenium, 1-[2-(1-naphthyl)-2-oxoethyl]tetrahydrothiophenium, 1-[2-(2-naphthyl)-2-oxoethyl]tetrahydrothiophenium, diphenyl-2-thienylsulfonium, 1-(4-n-butoxyphenyl)tetrahydrothiophenium, 1-(4-methoxyphenyl)tetrahydrothiophenium, 1-(4-cyclohexyloxyphenyl)tetrahydrothiophenium, 1-{4-(2-methoxyethoxy)phenyl}tetrahydrothiophenium, 1-(4-benzyloxyphenyl)tetrahydrothiophenium, 1-(4-phenethyloxyphenyl)tetrahydrothiophenium, 1-{4-(2,2,2-trifluoroethoxy)phenyl}tetrahydrothiophenium, 1-(4-hydroxyphenyl)tetrahydrothiophenium, 1-(4-n-butoxy-1-naphthalenyl)tetrahydrothiophenium, 1-(2-n-butoxy-1-naphthalenyl)tetrahydrothiophenium, 1-(4-methoxy-1-naphthalenyl)tetrahydrothiophenium, 1-(2-methoxy-1-naphthalenyl)tetrahydrothiophenium, 1-(4-cyclohexyloxy-1-naphthalenyl)tetrahydrothiophenium, 1-(2-cyclohexyloxy-1-naphthalenyl)tetrahydrothiophenium, 1-[4-(2-methoxyethoxy)-1-naphthalenyl]tetrahydrothiophenium, 1-[2-(2-methoxyethoxy)-1-naphthalenyl]tetrahydrothiophenium, 1-(4-benzyloxy-1-naphthalenyl)tetrahydrothiophenium, 1-(2-benzyloxy-1-naphthalenyl)tetrahydrothiophenium, 1-(4-phenethyloxy-1-naphthalenyl)tetrahydrothiophenium, 1-(2-phenethyloxy-1-naphthalenyl)tetrahydrothiophenium, 1-[4-(2,2,2-trifluoroethoxy)-1-naphthalenyl]tetrahydrothiophenium, 1-[2-(2,2,2-trifluoroethoxy)-1-naphthalenyl]tetrahydrothiophenium, 1-(4-hydroxy-1-naphthalenyl)tetrahydrothiophenium, 1-(4-n-butoxyphenyl)tetrahydrothiopyranium, 1-(4-methoxyphenyl)tetrahydrothiopyranium, 1-(4-cyclohexyloxyphenyl)tetrahydrothiopyranium, 1-[4-(2-methoxyethoxy)phenyl]tetrahydrothiopyranium, 1-(4-benzyloxyphenyl)tetrahydrothiopyranium, 1-(4-phenethyloxyphenyl)tetrahydrothiopyranium, 1-[4-(2,2,2-trifluoroethoxy)phenyl]tetrahydrothiopyranium, 1-(4-hydroxyphenyl)tetrahydrothiopyranium, 1-(4-n-butoxy-1-naphthalenyl)tetrahydrothiopyranium, 1-(2-n-butoxy-1-naphthalenyl)tetrahydrothiopyranium, 1-(4-methoxy-1-naphthalenyl)tetrahydrothiopyranium, 1-(2-methoxy-1-naphthalenyl)tetrahydrothiopyranium, 1-(4-cyclohexyloxy-1-naphthalenyl)tetrahydrothiopyranium, 1-(2-cyclohexyloxy-1-naphthalenyl)tetrahydrothiopyranium, 1-(4-methoxyethoxy-1-naphthalenyl)tetrahydrothiopyranium, 1-(2-methoxyethoxy-1-naphthalenyl)tetrahydrothiopyranium, 1-(4-benzyloxy-1-naphthalenyl)tetrahydrothiopyranium, 1-(2-benzyloxy-1-naphthalenyl)tetrahydrothiopyranium, 1-(4-phenethyloxy-1-naphthalenyl)tetrahydrothiopyranium, 1-(2-phenethyloxy-1-naphthalenyl)tetrahydrothiopyranium, 1-[4-(2,2,2-trifluoroethoxy)-1-naphthalenyl]tetrahydrothiopyranium, 1-[2-(2,2,2-trifluoroethoxy)-1-naphthalenyl]tetrahydrothiopyranium, and 1-(4-hydroxy-1-naphthalenyl)tetrahydrothiopyranium; triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 4-tert-butylphenyldiphenylsulfonium, tris(4-tert-butylphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 1-phenylphenoxathiinium, S-phenyldibenzothiophenium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, and (4-n-hexyloxy-3,5-dimethylphenyl)diphenylsulfonium. Of these, preferred are triarylsulfonium cations such as triphenylsulfonium, 4-tert-butylphenyldiphenylsulfonium, 4-tert-butoxyphenyldiphenylsulfonium, 10-phenylphenoxathiinium, and S-phenyldibenzothiophenium. Triarylsulfonium cations are most preferred from the standpoints of stability and sensitivity.

The synthesis of such sulfonium cations is well known in the art. For synthesis, reference may be made to JP-A 2007-145797, for example.

In formula (b), $R^{101d}$ and $R^{101e}$ are each independently a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached. Examples of alkyl, alkoxy and aryl groups are as illustrated above.

Illustrative examples of the iodonium cation include bis(4-methylphenyl)iodonium, bis(4-ethylphenyl)iodonium, bis(4-tert-butylphenyl)iodonium, bis(4-(1,1-dimethylpropyl)phenyl)iodonium, 4-methoxyphenylphenyliodonium, 4-tert-butoxyphenylphenyliodonium, 4-acryloyloxyphenylphenyliodonium, and 4-methacryloyloxyphenylphenyliodonium. Inter alia, bis(4-tert-butylphenyl)iodonium is most preferred.

In formulae (1A) and (1B), L is a single bond or a straight, branched or cyclic $C_1$-$C_{20}$ divalent hydrocarbon group which may be substituted with or separated by a heteroatom. Examples of the divalent hydrocarbon group of L include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,1'-diyl, dodecane-1,12-diyl, tridecane-1,13-diyl, tetradecane-1,14-diyl, pentadecane-1,15-diyl, hexadecane-1,16-diyl, and heptadecane-1,17-diyl; branched alkanediyl groups obtained by combining the foregoing straight alkanediyl groups with a side chain such as methyl, ethyl, propyl, isopropyl, butyl, sec-butyl, or tert-butyl; saturated cyclic hydrocarbon groups such as cyclopentanediyl, cyclohexanediyl, norbornanediyl, and adamantanediyl; unsaturated cyclic hydrocarbon groups such as phenylene and naphthylene. L may be a combination of two or more of the foregoing. Also in the foregoing groups, at least one hydrogen atom may be substituted by a heteroatom such as oxygen, sulfur, nitrogen or halogen atom, and the foregoing groups may be separated by a heteroatom such as oxygen, sulfur or nitrogen atom. As a result of substitution or separation, a hydroxyl, cyano, carbonyl, carboxyl, ether bond, ester bond, sulfonic acid ester bond, carbonate bond, lactone ring, sultone ring, carboxylic anhydride, or haloalkyl may form or intervene.

In formulae (1A) and (1B), X is a $C_1$-$C_5$ divalent alkylene group in which some or all hydrogen atoms may be substituted by fluorine atoms. Suitable alkylene groups include methylene, ethylene, propane-1,3-diyl, butane-1,4-diyl, pentane-1,5-diyl, difluoromethylene, tetrafluoroethylene, 1,1,2-trifluoroethylene, hexafluoropropane-1,3-diyl, and octafluorobutane-1,4-diyl.

In formula (1A), $Z^1$ forms a $C_5$-$C_{15}$ alicyclic group with the carbon atom to which it is attached. Exemplary alicyclic groups are shown below. In the following formulae, the broken line denotes a valence bond, and $R^2$, $R^3$ and L are as defined above.

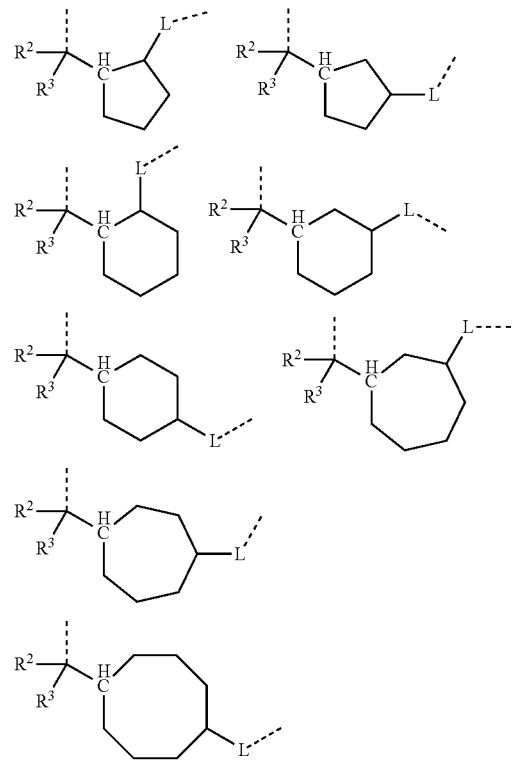

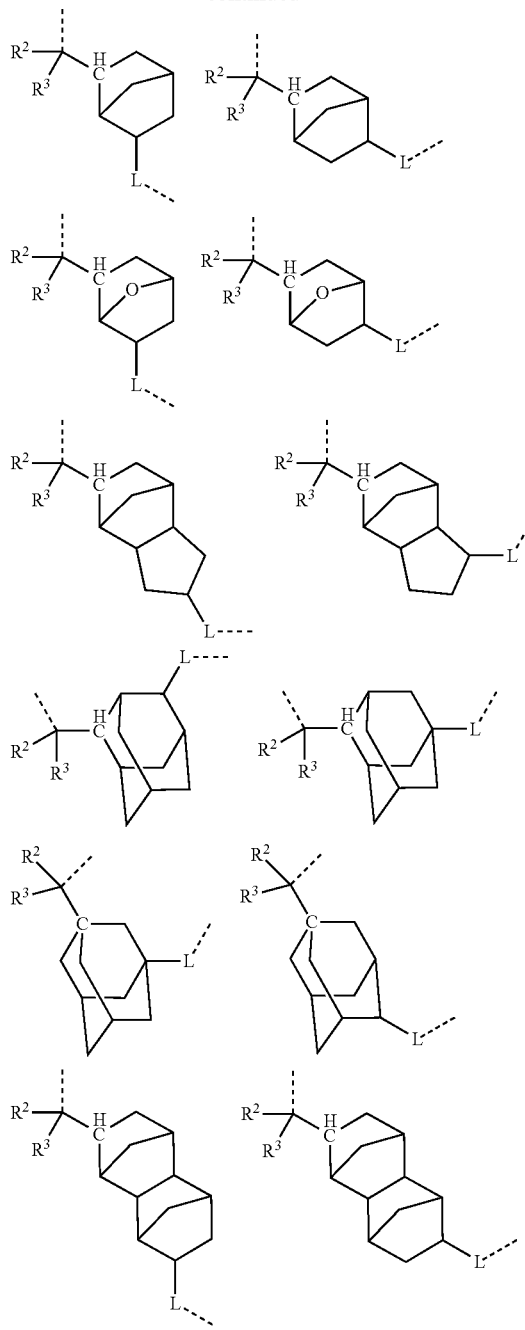

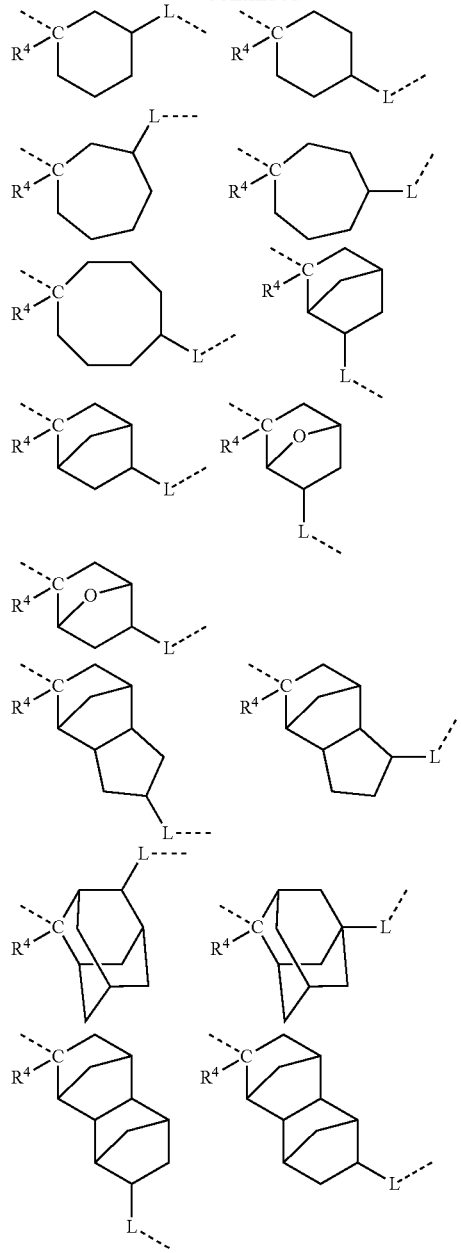

In formula (1B), $Z^2$ forms a $C_5$-$C_{15}$ alicyclic group with the carbon atom to which it is attached. Exemplary alicyclic groups are shown below. In the following formulae, the broken line denotes a valence bond, and $R^4$ and L are as defined above.

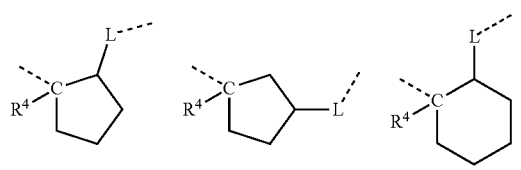

In formula (2), $R^1$ is hydrogen, methyl or trifluoromethyl. L' is a single bond or $C_1$-$C_{10}$ divalent organic group which may be substituted with an oxygen atom. Suitable divalent organic groups include methylene, ethylene, propane-1,3-diyl, butane-1,4-diyl, pentane-1,5-diyl, and hexane-1,6-diyl. Preferably, L' is a single bond, methylene or ethylene. Also in the foregoing groups, at least one hydrogen atom may be substituted by an oxygen atom, and the foregoing groups may be separated by an oxygen atom. As a result of substitution or separation, an ether bond or ester bond may form or intervene. $R^5$ is a halogen atom or $C_1$-$C_{10}$ alkyl group, preferably fluorine or methyl. The subscript m is an integer of 0 to 3, preferably 0, n is an integer of 1 or 2, preferably 1, and N is an integer of 0 to 2, preferably 0 or 1.

Exemplary monomers from which the recurring unit of formula (2) is derived include the following structures.

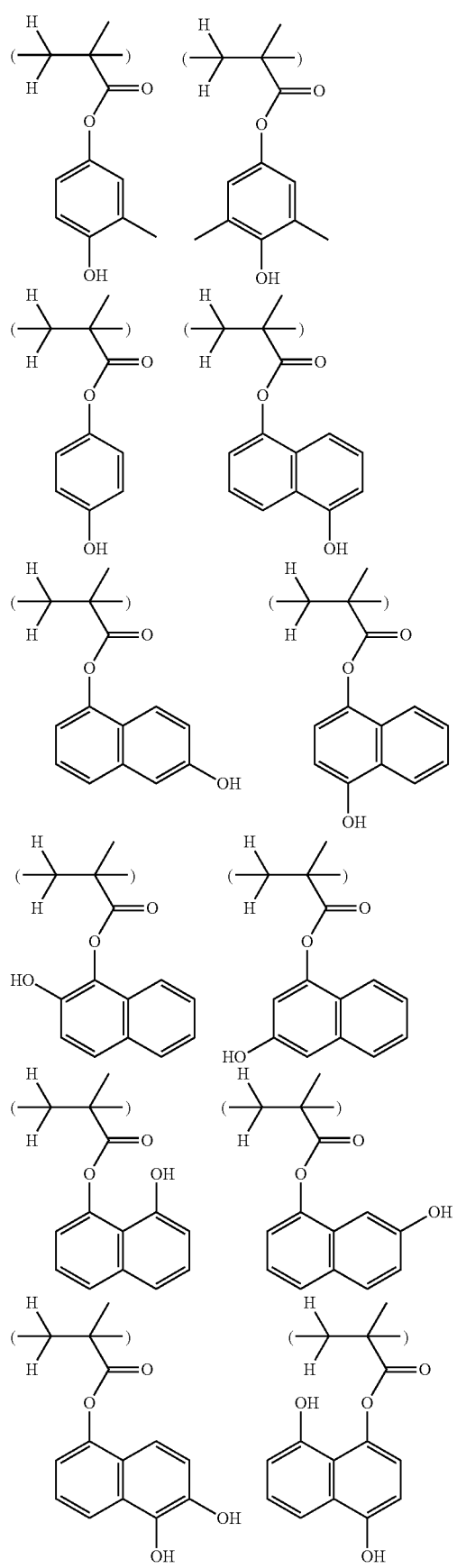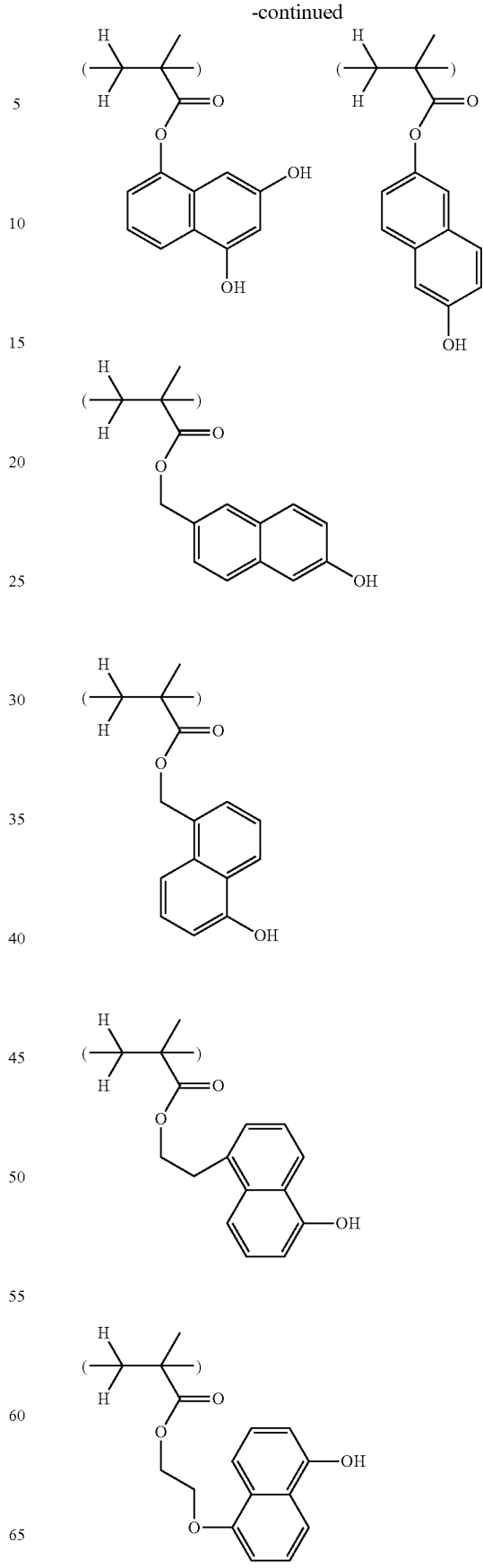

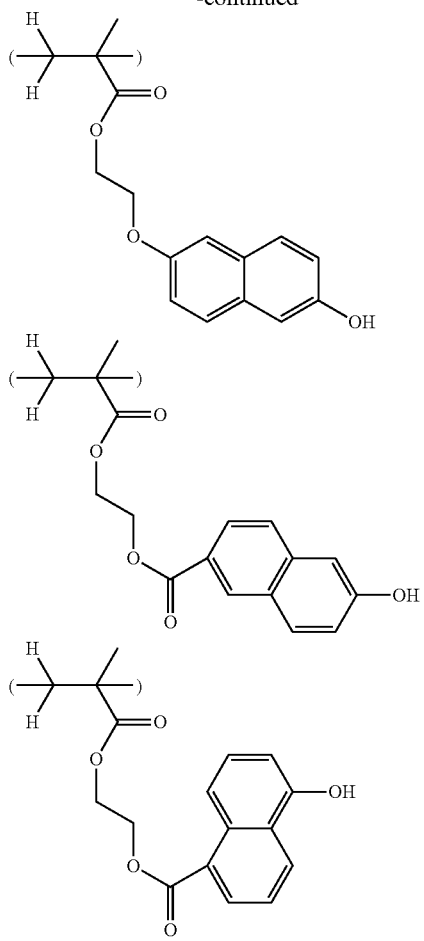

Of the polymerizable anion-containing sulfonium salts having formulae (1A) and (1B), those having the general formulae (3A) and (3B) are preferred.

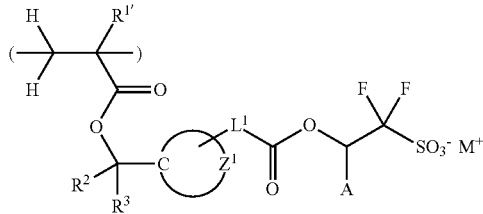

(3A)

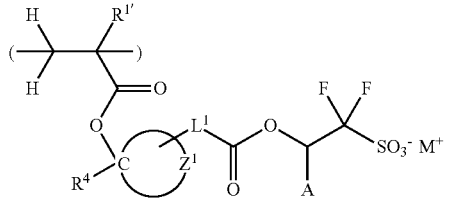

(3B)

Herein $R^1$, $R^2$, $R^3$, $R^4$, $Z^1$, $Z^2$, and $M^+$ are as defined above. $L^1$ is a single bond or a straight, branched or cyclic $C_1$-$C_{20}$ divalent hydrocarbon group which may be substituted with or separated by a heteroatom. A is hydrogen or trifluoromethyl.

In formulae (3A) and (3B), A is hydrogen or trifluoromethyl. $L^{1-}$ is a single bond or a straight, branched or cyclic $C_1$-$C_{20}$ divalent hydrocarbon group which may be substituted with or separated by a heteroatom. Examples of the divalent hydrocarbon group of $L^1$ include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; branched alkanediyl groups obtained by combining the foregoing straight alkanediyl groups with a side chain such as methyl, ethyl, propyl, isopropyl, butyl, sec-butyl, or tert-butyl; saturated cyclic hydrocarbon groups such as cyclopentanediyl, cyclohexanediyl, norbornanediyl, and adamantanediyl; unsaturated cyclic hydrocarbon groups such as phenylene and naphthylene. $L^1$ may be a combination of two or more of the foregoing. Also in the foregoing groups, at least one hydrogen atom may be substituted by a heteroatom such as oxygen, sulfur, nitrogen or halogen atom, and the foregoing groups may be separated by a heteroatom such as oxygen, sulfur or nitrogen atom. As a result of substitution or separation, a hydroxyl, cyano, carbonyl, carboxyl, ether bond, ester bond, sulfonic acid ester bond, carbonate bond, lactone ring, sultone ring, carboxylic anhydride, or haloalkyl may form or intervene.

In formulae (3A) and (3B), $L^1$ is preferably a single bond or a structure having the general formula (4A) or (4B).

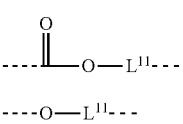

(4A)

(4B)

Herein $L^{11}$ is a $C_1$-$C_5$ alkylene group. The broken line denotes a valence bond. The broken line extending from $L^{11}$ is bonded to the carbonyl group in formula (3A) or (3B).

In formulae (4A) and (4B), exemplary groups of $L^{11}$ include methylene, ethylene, propane-1,3-diyl, butane-1,4-diyl and pentane-1,5-diyl.

While the monomer from which the recurring unit of any one of formulae (1A), (1B), (3A) and (3B) is derived has an anion moiety, exemplary structures of the anion moiety are shown below, but not limited thereto. Note that $R^1$ and A are as defined above.

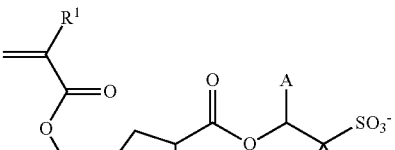

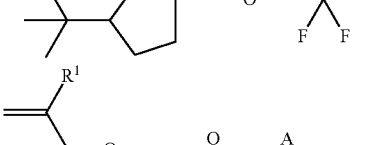

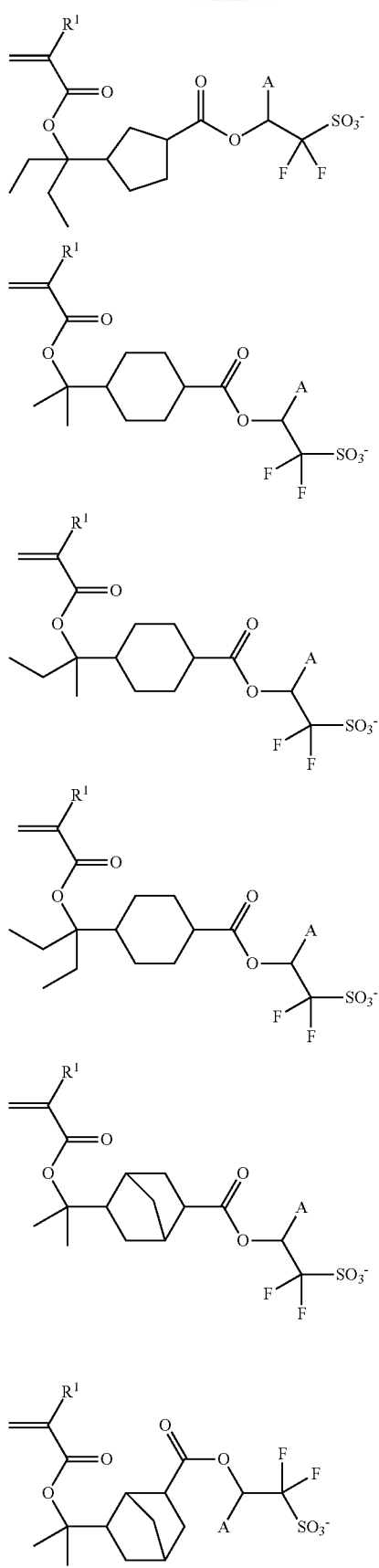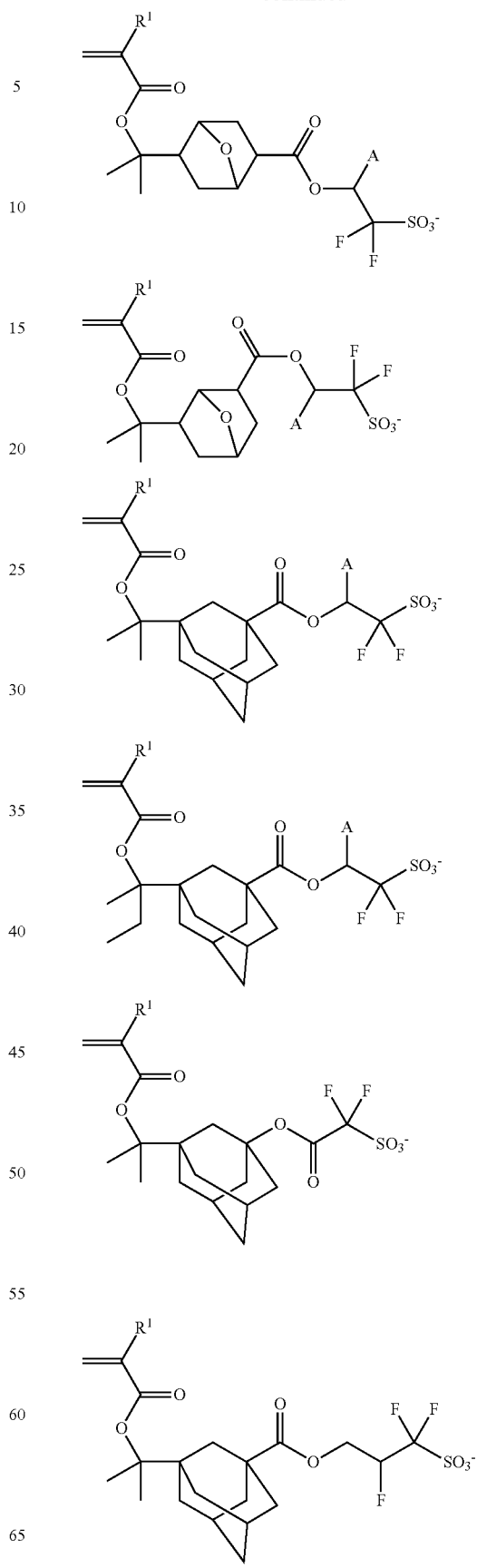

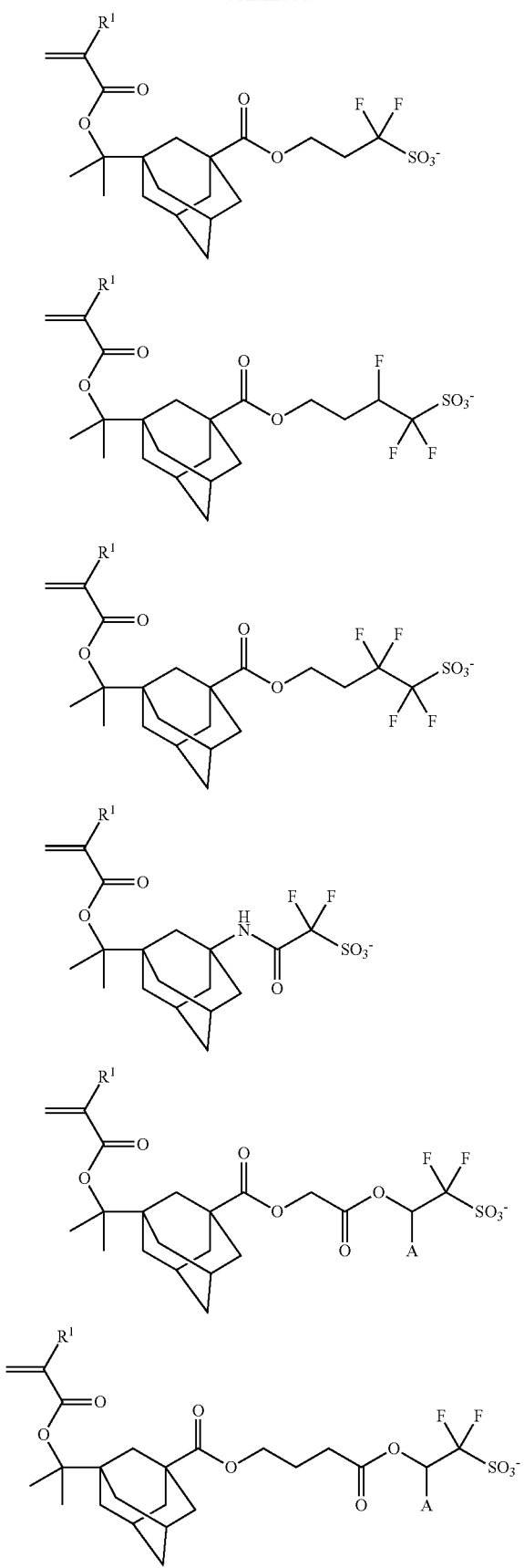
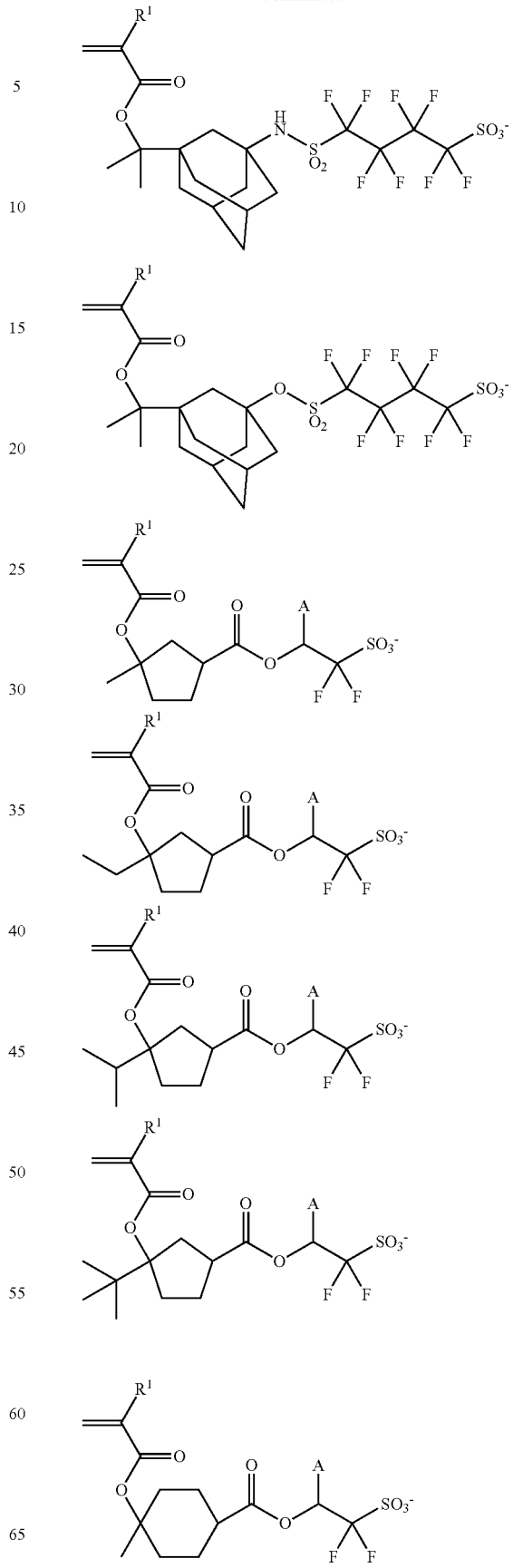

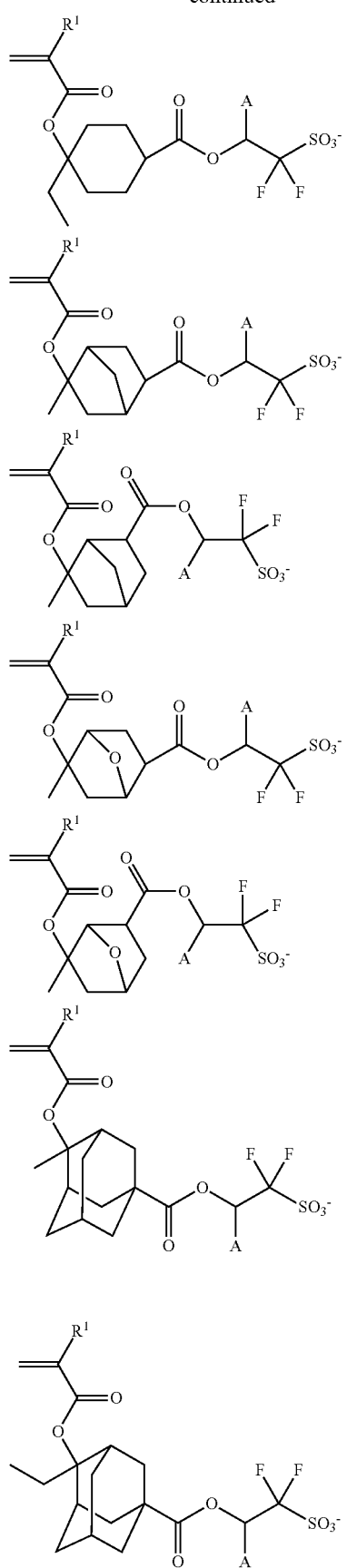
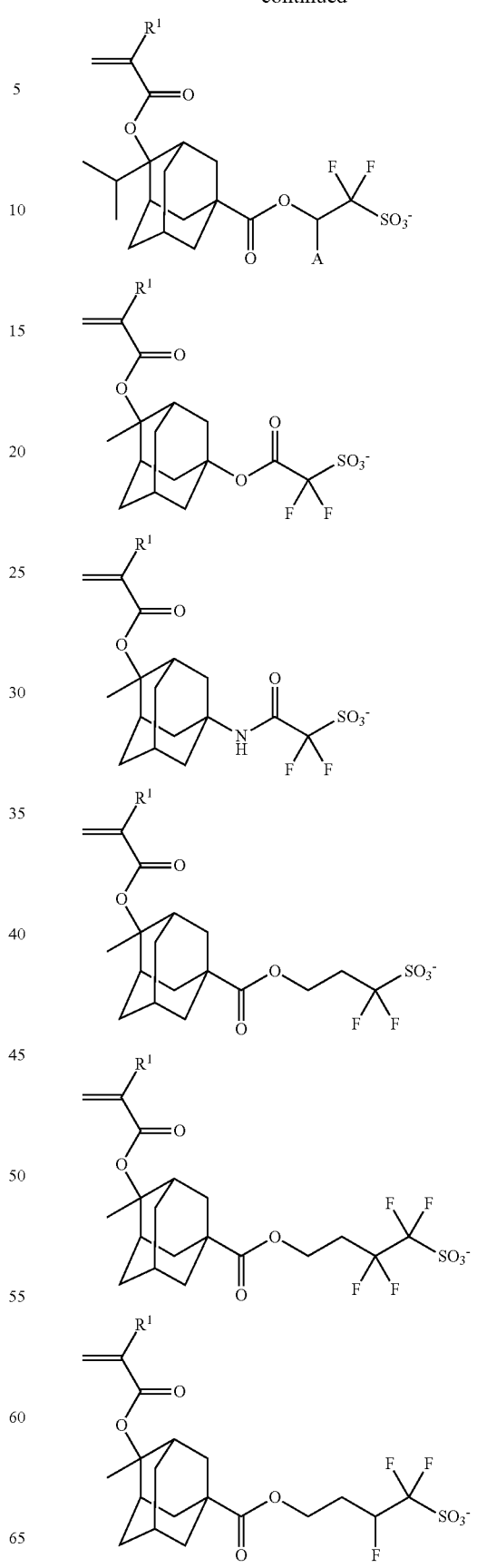

-continued

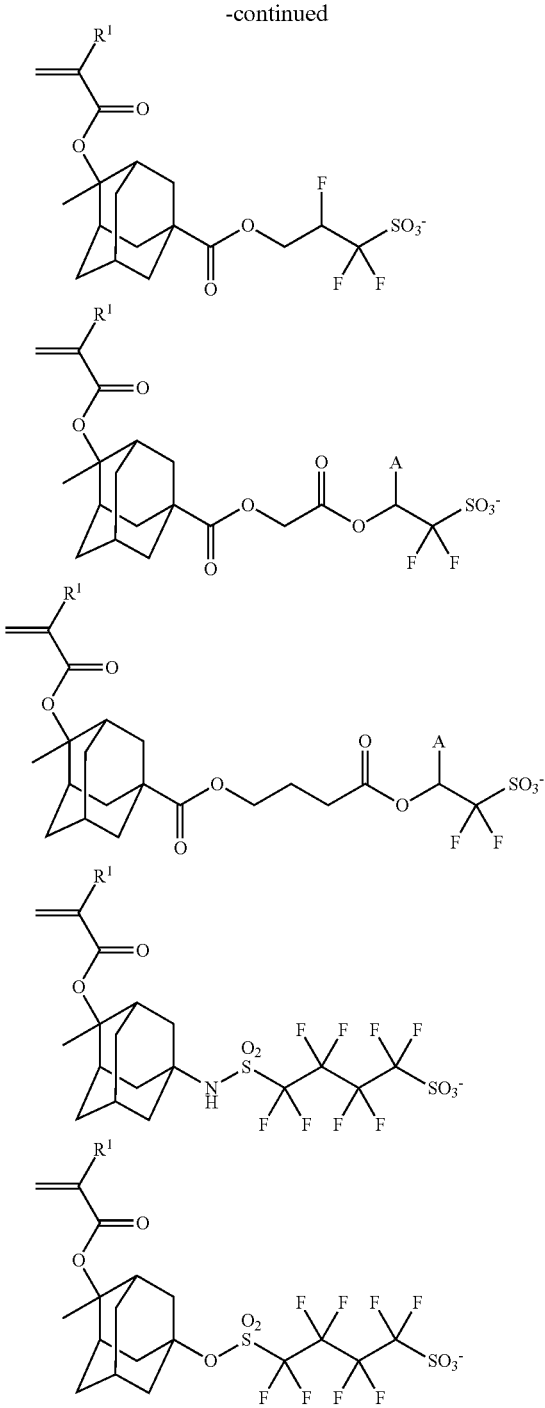

Combinations of cations with anions, both as exemplified above, are exemplary of the monomer from which the recurring unit of any one of formulae (1A), (1B), (3A) and (3B) is derived. Of the cations, sulfonium cations are preferred.

It is now described how to synthesize the monomer from which the recurring unit of any one of formulae (1A), (1B), (3A) and (3B) is derived. As a typical example, the synthesis of a monomer of formula (3A) or (3B) wherein A is hydrogen and $M^+$ is a sulfonium cation is described.

First, a sulfonium salt having 1,1-difluoro-2-hydroxyethanesulfonate is prepared. Specifically, 2-bromo-2,2-difluoroethanol is reacted with carboxylic acid chloride to form 2-bromo-2,2-difluoroethylalkane carboxylate or 2-bromo-2,2-difluoroethylarene carboxylate. By subsequent reaction with a sulfur compound such as sodium dithionite, the bromo group is converted to sodium sulfinate, which is, in turn, converted to sodium sulfonate, using an oxidizing agent such as hydrogen peroxide.

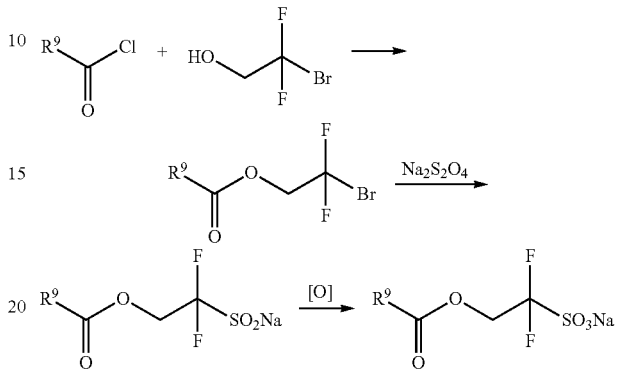

Herein $R^9$ is a straight, branched or cyclic $C_1$-$C_{20}$ alkyl group optionally containing a heteroatom.

The reactions of esterification, conversion of alkane halide to sodium sulfinate, and sulfonation are known, for example, from JP-A 2004-002252.

The resulting sodium sulfonate is subjected to ion-exchange reaction with a sulfonium salt compound, thereby forming the desired sulfonium salt. For the ion-exchange reaction, reference may be made to JP-A 2007-145797, for example.

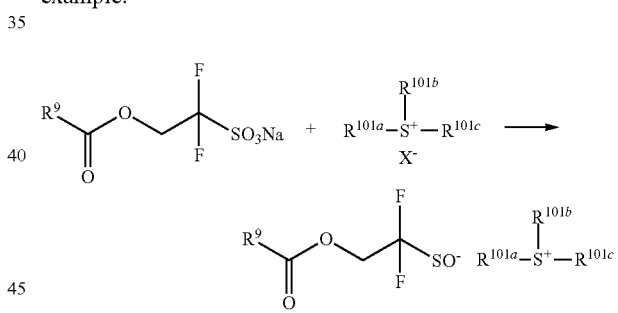

Herein $R^{101a}$, $R^{101b}$, $R^{101c}$ and $R^9$ are as defined above. $X^-$ is a counter anion, examples of which include, but are not limited to, halide ions such as $I^-$, $Br^-$ and $Cl^-$, sulfuric acid or alkylsulfuric acid anions such as sulfate and methylsulfate anions, carboxylic acid anions such as acetate and benzoate, alkane sulfonates such as methanesulfonate and propanesulfonate, arene sulfonates such as benzenesulfonate and p-toluenesulfonate, and hydroxide.

By further subjecting the acyl group: $R^9CO$— introduced as above to ester hydrolysis or solvolysis, a sulfonium salt having 1,1-difluoro-2-hydroxyethanesulfonate can be synthesized. The step is outlined below.

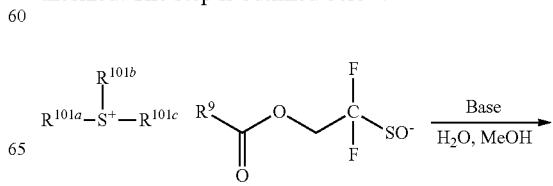

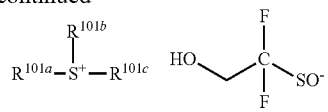

Herein $R^{101a}$, $R^{101b}$, $R^{101c}$, and $R^9$ are as defined above, and Me is methyl.

The starting reactant, sulfonium salt may be synthesized with reference to JP-A H08-311018, H09-015848 and 2001-122850, for example.

By reacting the thus synthesized sulfonium salt having 1,1-difluoro-2-hydroxyethanesulfonate with a corresponding carboxylic acid halide under basic conditions, a compound corresponding to the monomer for the recurring unit having formula (3A) or (3B) wherein A=hydrogen and $M^+$=sulfonium cation can be synthesized.

Next, the synthesis of a sulfonium salt of formula (3A) or (3B) wherein A is trifluoromethyl is described. First, a sulfonium salt having 1,1,3,3,3-pentafluoro-2-hydroxypropanesulfonate is synthesized instead of the sulfonium salt having 1,1-difluoro-2-hydroxyethanesulfonate. By following the same procedure as the above-described procedure where A is hydrogen, a compound corresponding to the monomer for the recurring unit having formula (3A) or (3B) wherein A=trifluoromethyl and $M^+$=sulfonium cation can be synthesized.

Notably, the starting reactant, sulfonium salt having 1,1,3,3,3-pentafluoro-2-hydroxypropanesulfonate may be synthesized with reference to JP-A 2007-145804, for example.

The recurring units in the inventive polymer are not limited to the structure illustrated in the above synthesis example. With reference to JP-A 2008-094835, JP-A 2008-209917, JP-A 2012-72109, and WO 2008/056795, for example, a sulfonium salt having a different structure at the beta-position of sulfonic acid group from that in the above synthesis example can be synthesized.

Although the synthesis example has been described above, it is merely exemplary, and the invention is not limited thereto.

It is noted that by a procedure similar to the above synthesis example, a iodonium or ammonium salt may be introduced instead of the sulfonium salt. When the iodonium salt is used as the counter cation to the inventive anion structure, it functions as photoacid generator like the sulfonium salt and is equally applicable to the polymer, resist composition and patterning process to be described later. While the ammonium salt functions as thermal acid generator, it is also applicable to the polymer, resist composition and patterning process.

In general, when the acid generator is incorporated in a polymer unit (referred to as "polymer-bound PAG", hereinafter) as disclosed herein, acid diffusion is significantly suppressed as compared with additive PAG, and resist properties including mask fidelity, pattern rectangularity and LWR are improved to some extent. On the other hand, the prior art polymer-bound PAG has the drawback that substantial suppression of acid diffusion leads to declines in sensitivity and dissolution contrast, which lead to a shortage of resolution. Particularly when formation of an ultrafine pattern is necessary in EB or EUV lithography, which has a tendency to a low optical contrast, degradation of sensitivity due to a decline in dissolution contrast becomes a problem.

In contrast, the onium salt of the invention has an acid labile group and is characterized in that deprotection reaction takes place under the impetus of generated acid, as understood from the following Scheme 1.

Scheme 1

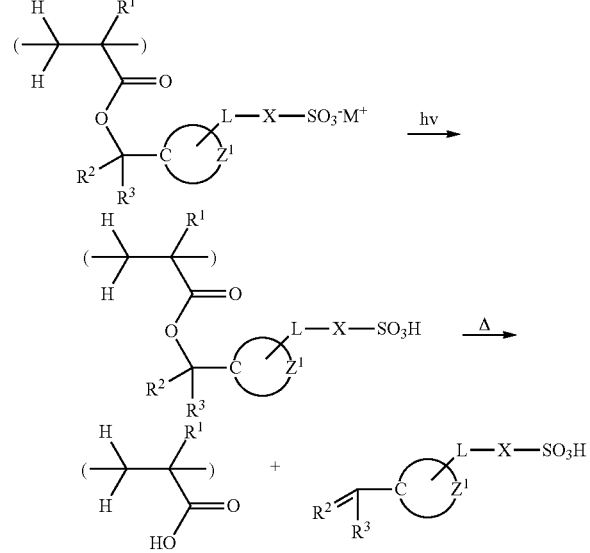

Herein $R^1$, $R^2$, $R^3$, L, X, $Z^1$ and $M^+$ are as defined above.

Accordingly, in a resist composition using a polymer having an onium salt incorporated therein according to the invention, deprotection reaction takes place from the onium salt recurring unit to form a methacrylic acid unit, leading to improved dissolution contrast in developer and higher sensitivity and hence, an improvement in resolution performance. Since the generated acid unit is liberated from the polymer chain, there is possibility that acid diffusion is promoted. It is presumed that in the lithography step, although deprotection reaction proceeds on sulfonium salt recurring units, some remain unreacted. Then the generated acid has an appropriate acid diffusion distance. As a consequence, resolution and sensitivity can be improved without sacrificing resist properties such as mask fidelity and LWR. In addition, the inclusion of recurring units having formula (2) is essential for the invention. It is presumed that phenolic hydroxyl-containing recurring units like recurring units having formula (2) are improved in swell suppression and acid generation efficiency due to the hydroxyl group and aromatic ring structure, especially in EB or EUV lithography, and they are expected to contribute to improvements in LWR and sensitivity. Accordingly, the resist composition using the inventive polymer is very useful in the stage that requires to form a fine pattern using EB or EUV lithography.

Notably, JP-A 2011-215619 describes a resist composition comprising a base resin having a sulfonium salt bound thereto, wherein the sulfonium salt is liberated by the generated acid. However, this patent document refers nowhere to phenolic hydroxyl-containing methacrylate compounds corresponding to the recurring units having formula (2), failing to solve the outstanding problem, i.e., to improve sensitivity in EB or EUV lithography. In contrast, the invention solves the outstanding problem by incorporating both recurring units of onium salt (having an acid labile group and allowing deprotection reaction to take place under the impetus of generated acid) and recurring units of phenolic hydroxyl-containing methacrylate compound, and further improves resolution and roughness.

In addition to the recurring units having formula (3A) or (3B), the polymer may further comprise recurring units having the general formula (4).

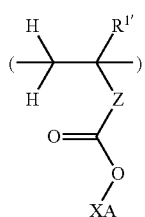

(4)

Herein R[1′] is hydrogen, methyl or trifluoromethyl. Z is a single bond, phenylene group, naphthylene group or (backbone) —C(=O)—O—Z′—, wherein Z′ is a straight, branched or cyclic $C_1$-$C_{10}$ alkylene group which may contain a hydroxyl radical, ether bond, ester bond or lactone ring, or Z′ is a phenylene or naphthylene group. XA is an acid labile group.

Examples of the structure having formula (4) wherein Z is a variant are shown below.

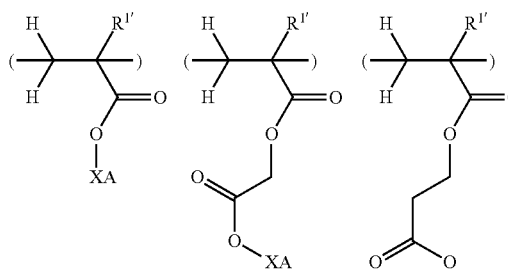

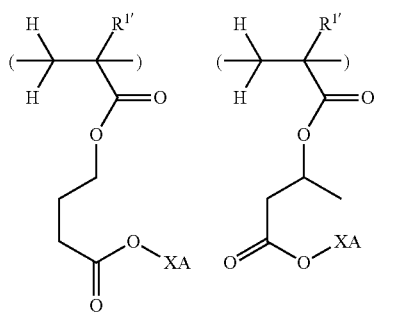

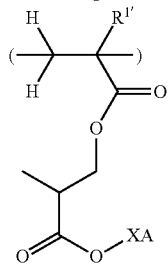

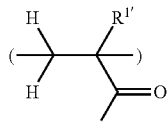

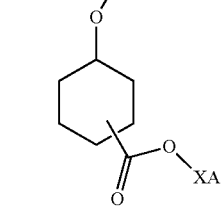

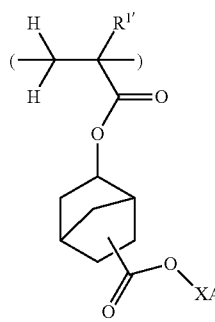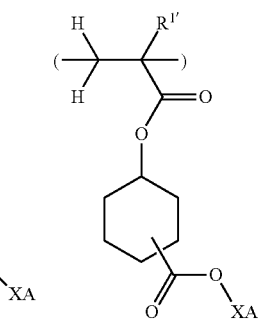

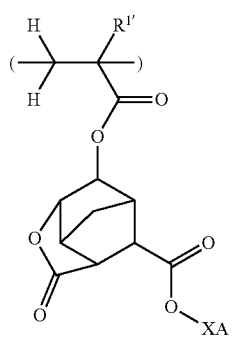

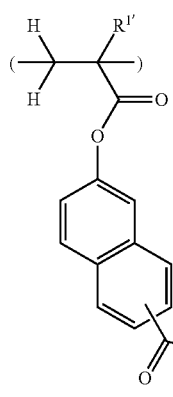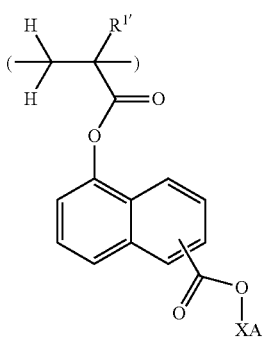

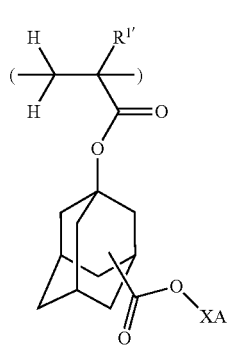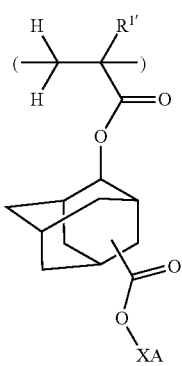

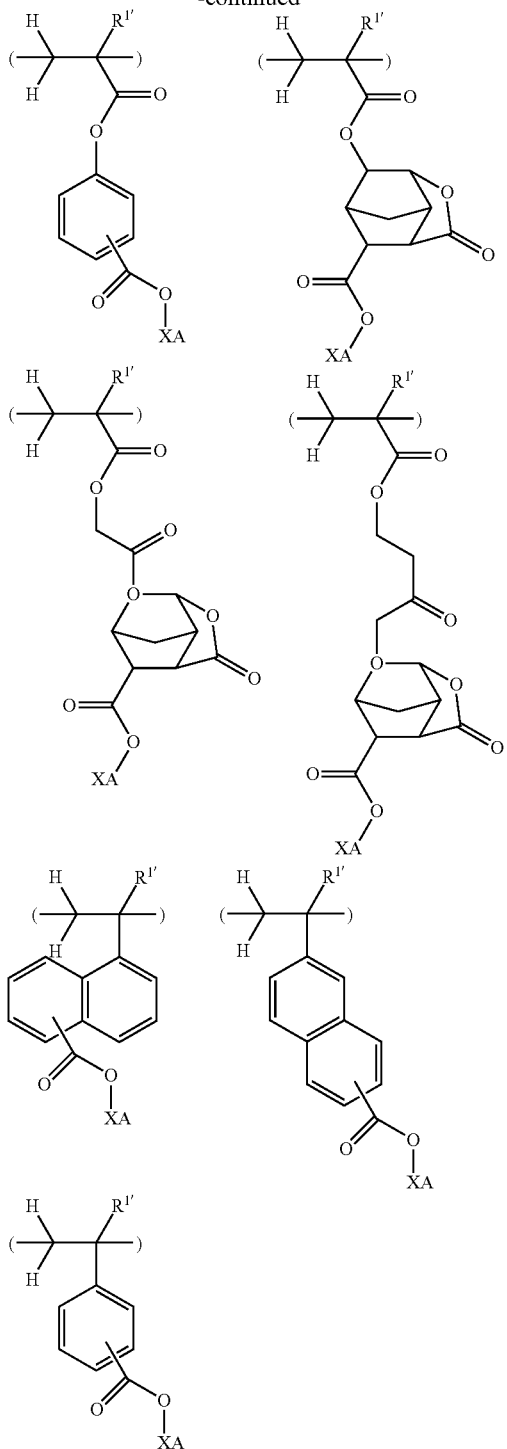

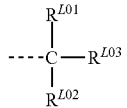
(L1)

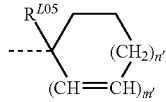
(L2)

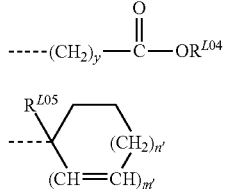
(L3)

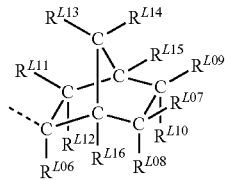
(L4)

In these formulae, the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like, or in which an oxygen atom is interposed between carbon atoms. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

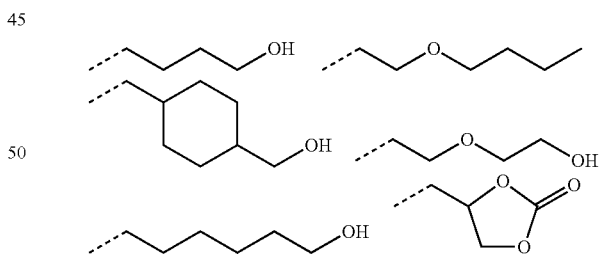

Under the action of acid, a polymer comprising recurring units of formula (4) is decomposed to generate carboxylic acid, turning to be an alkali soluble polymer. The acid labile group represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butyl-cyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_8$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2 m'+n' is equal to 2 or 3.

In formula (L4), $R^{L06}$ is a substituted or unsubstituted, straight, branched or cyclic $C_1$-$C_8$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, $R^{L07}$ to $R^{L16}$ taken together, form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$)

Of the acid labile groups of formula (L1), the straight and branched ones are exemplified by the following groups.

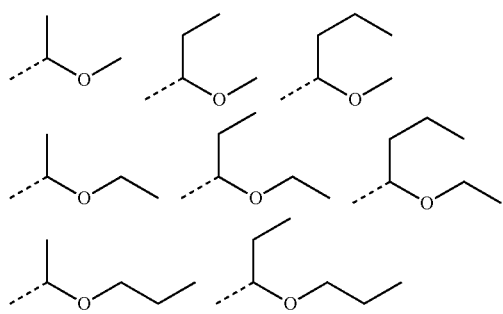

-continued

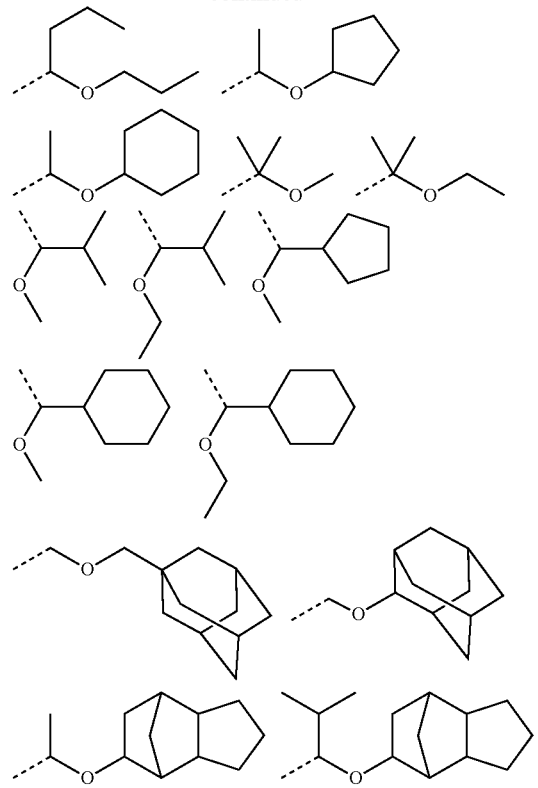

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

(L4-1)

(L4-2)

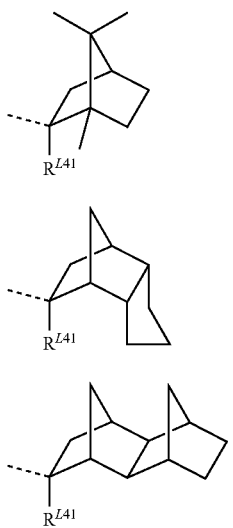

(L4-3)

(L4-4)

(L4-4-2)

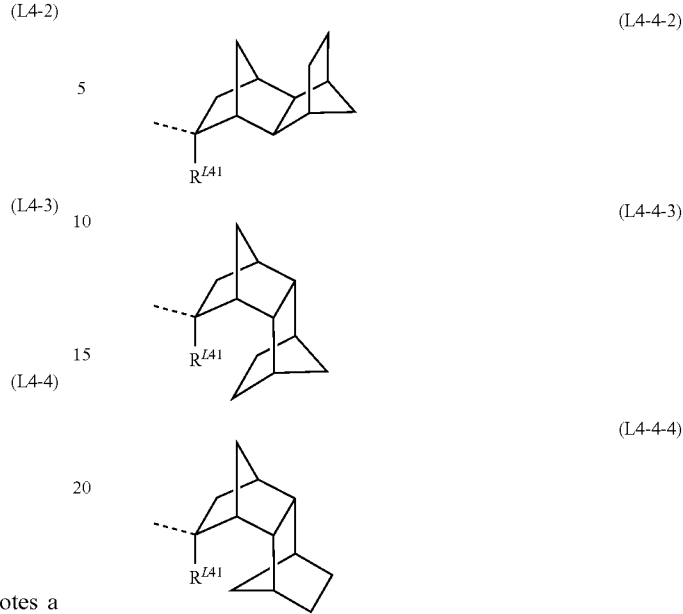

(L4-4-3)

(L4-4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]-heptane ring, which ensures high reactivity for acid catalyzed elimination reaction (see JP-A 2000-336121). In preparing these monomers having a tertiary exo-alkyl group of bicyclo [2.2.1]-heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-3-1)

(L-4-3-2)

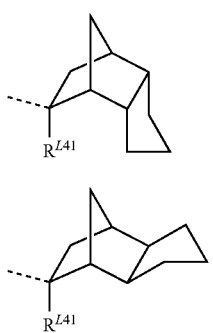

Similarly, the general formula (L4-4) represents one or a mixture of two or more selected from groups having the following general formulas (L4-4-1) to (L4-4-4).

(L4-4-1)

(L4-1-endo)

(L4-2-endo)

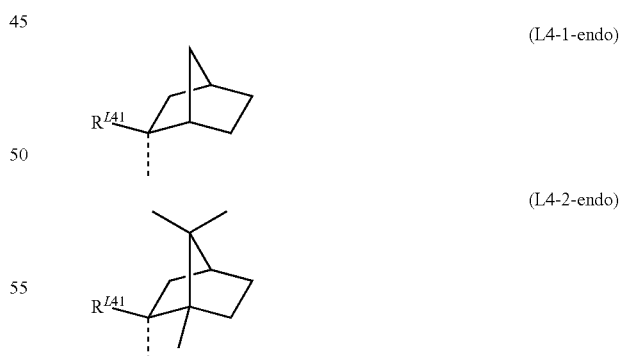

(L4-3-endo)

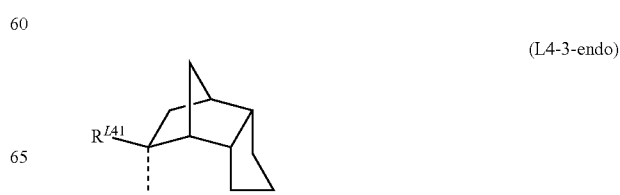

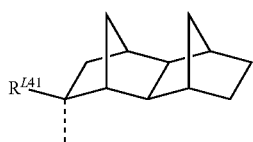
(L4-4-endo)
Illustrative examples of the acid labile group of formula (L4) are given below.
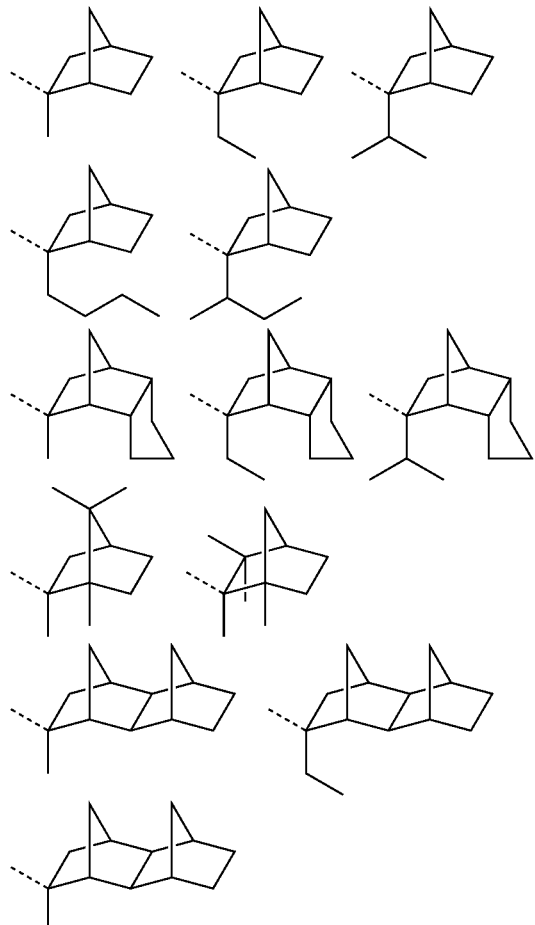
Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{LO4}$.
Illustrative examples of the recurring units of formula (4) are given below, but not limited thereto.
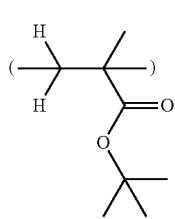 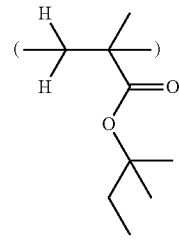
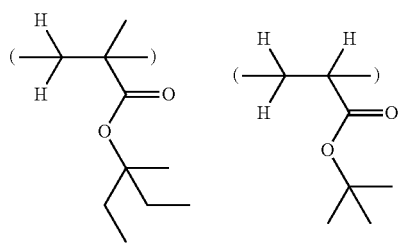
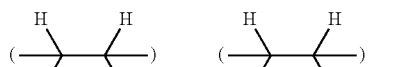
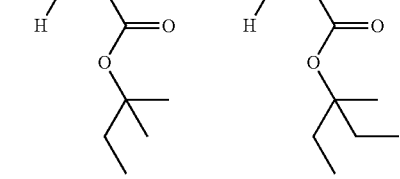
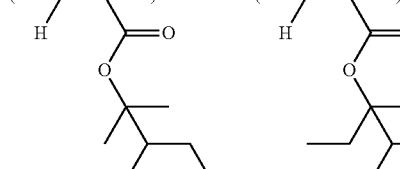
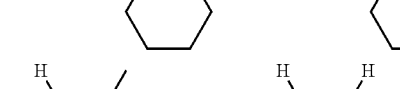
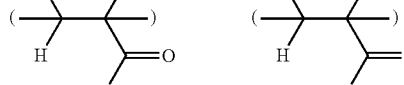
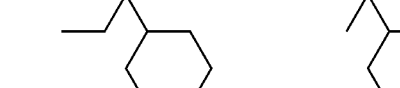
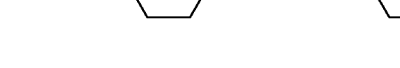
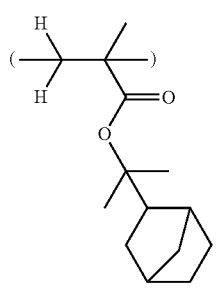 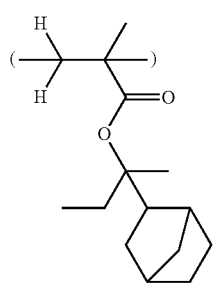

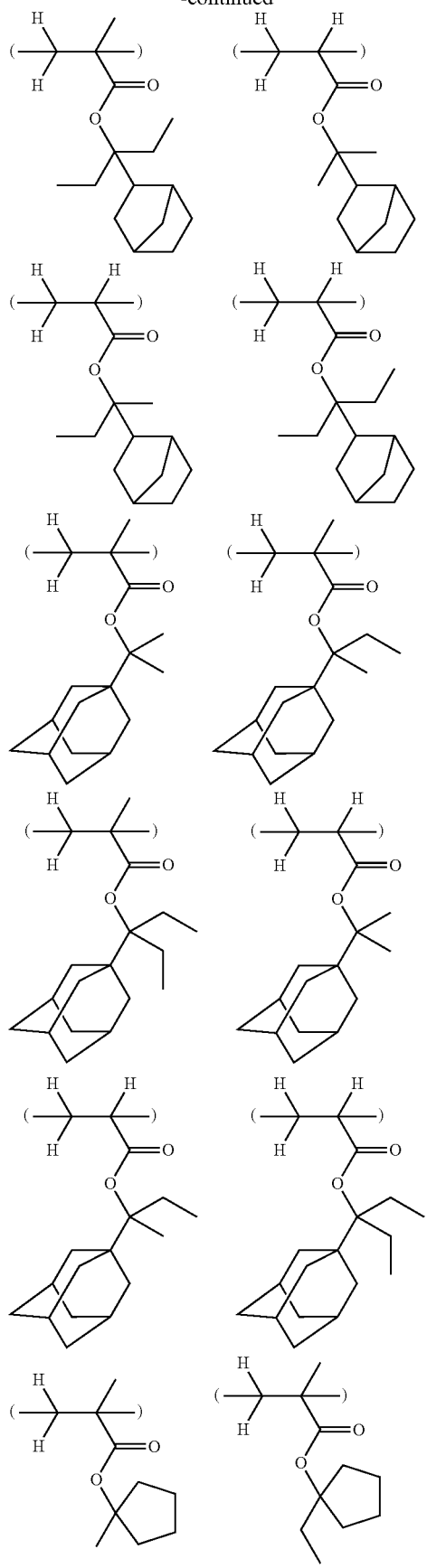
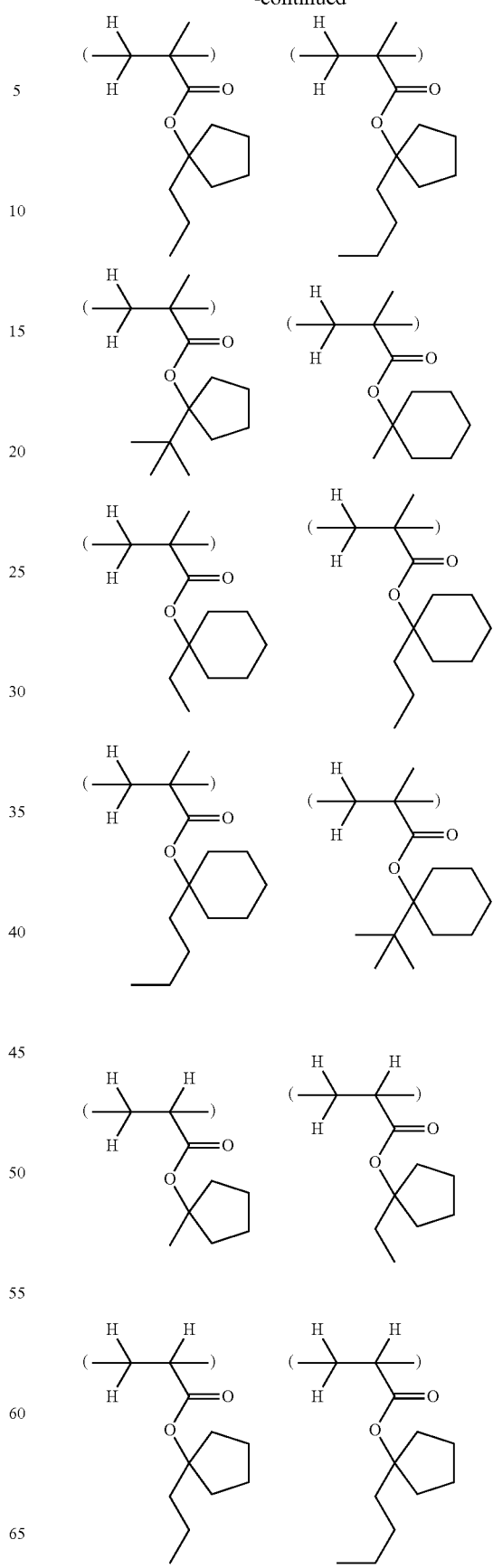

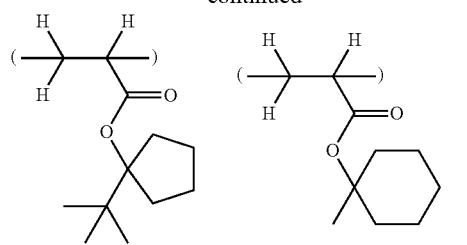
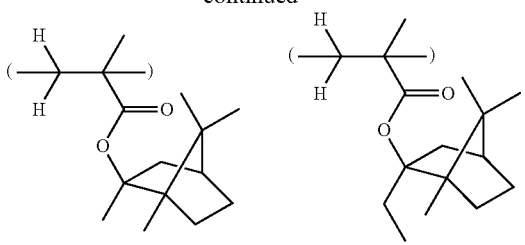
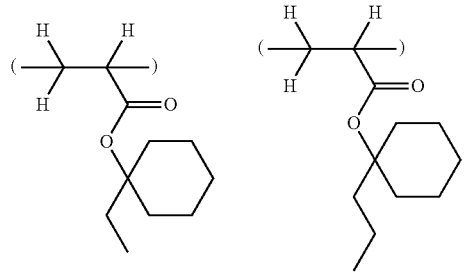
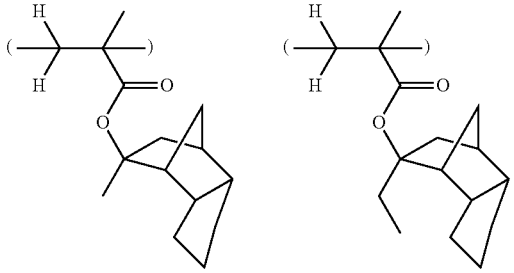
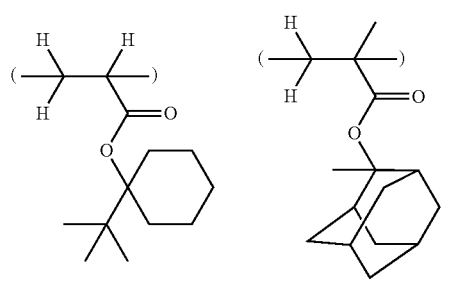
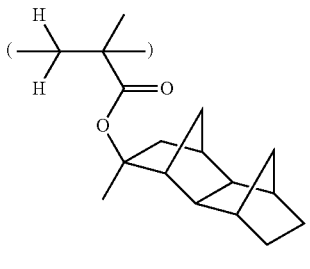
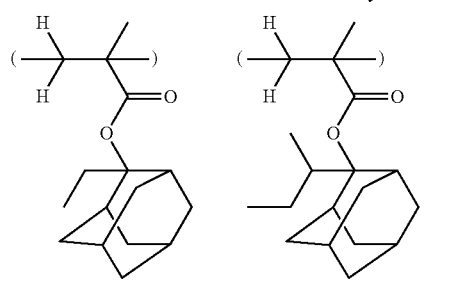
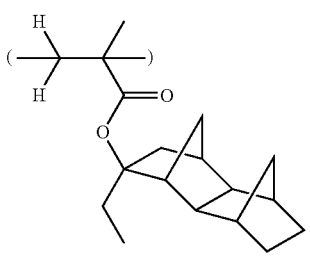
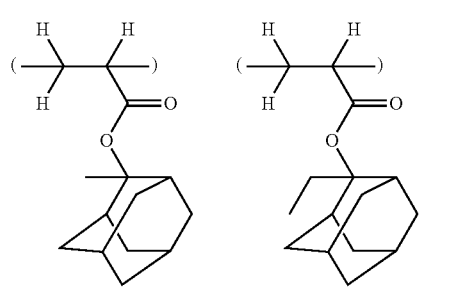
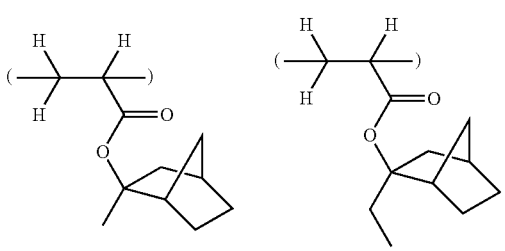
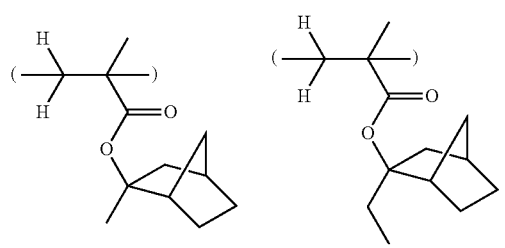
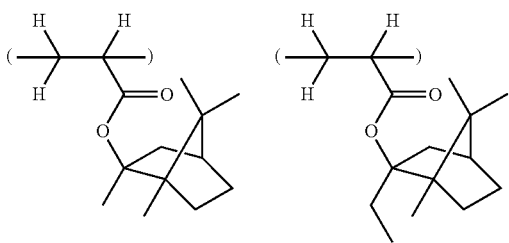

-continued
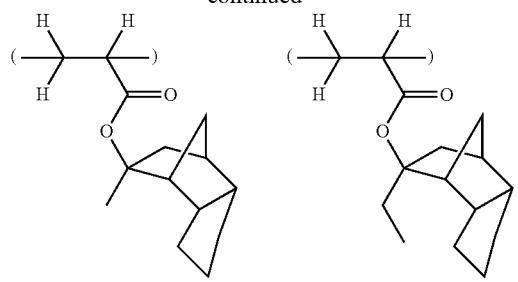
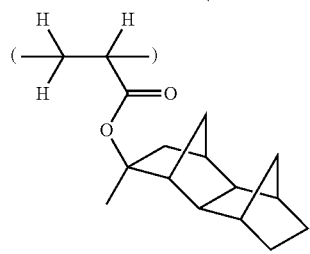
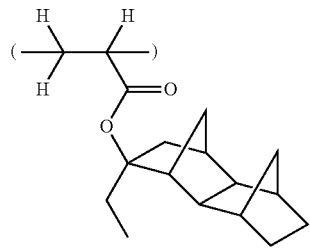
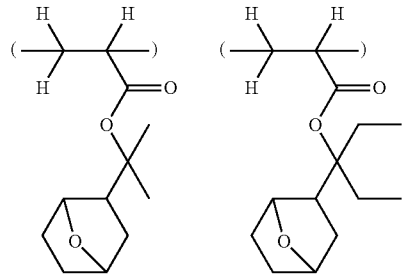
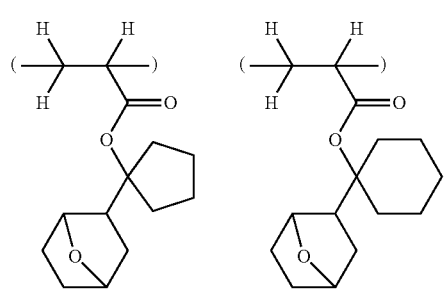
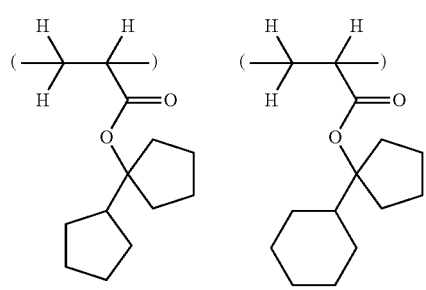
-continued
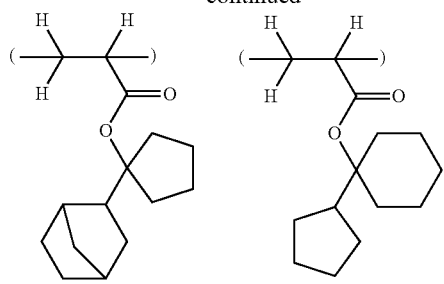
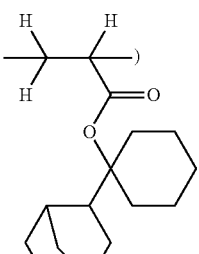
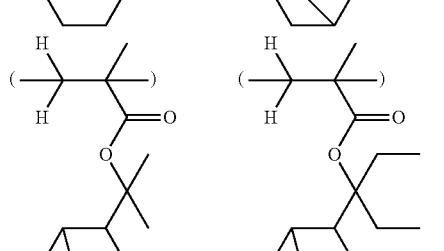
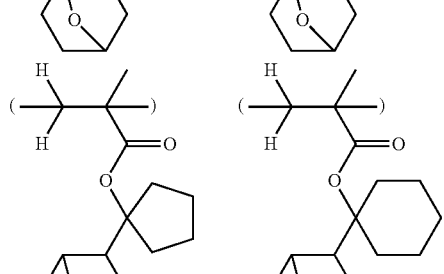
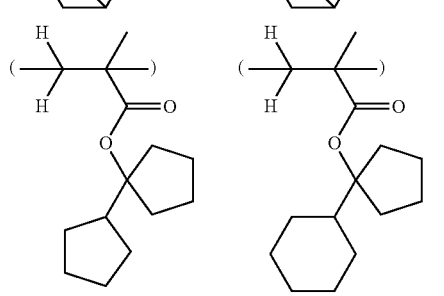
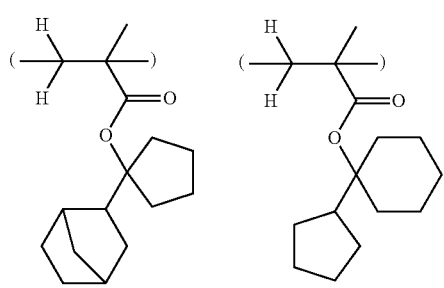

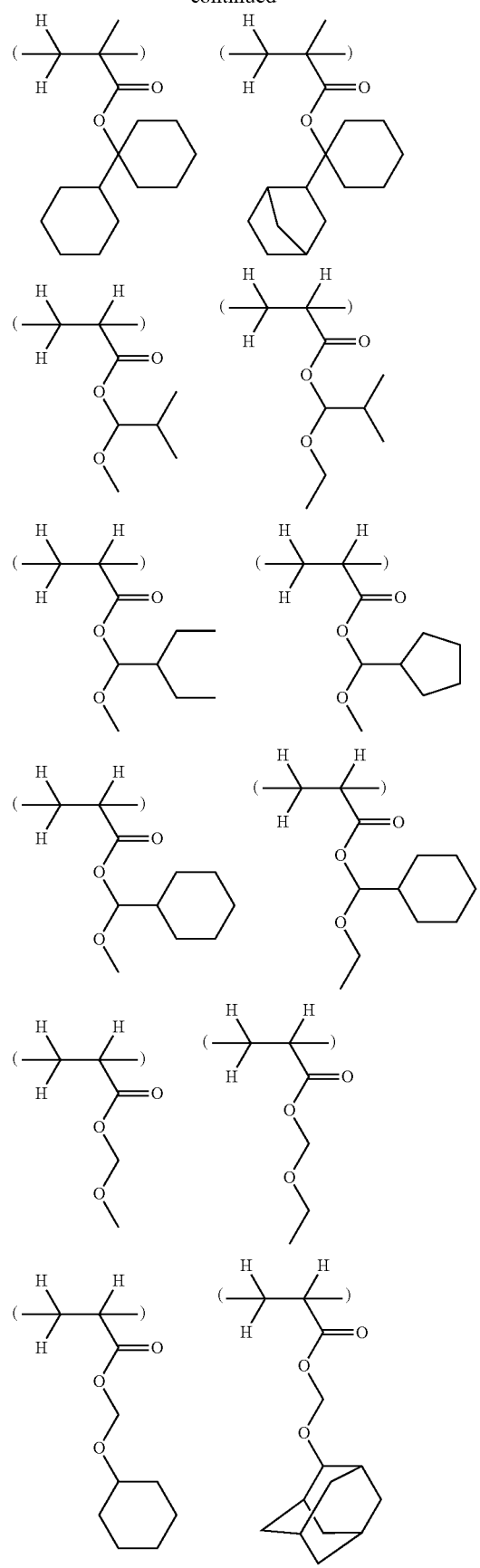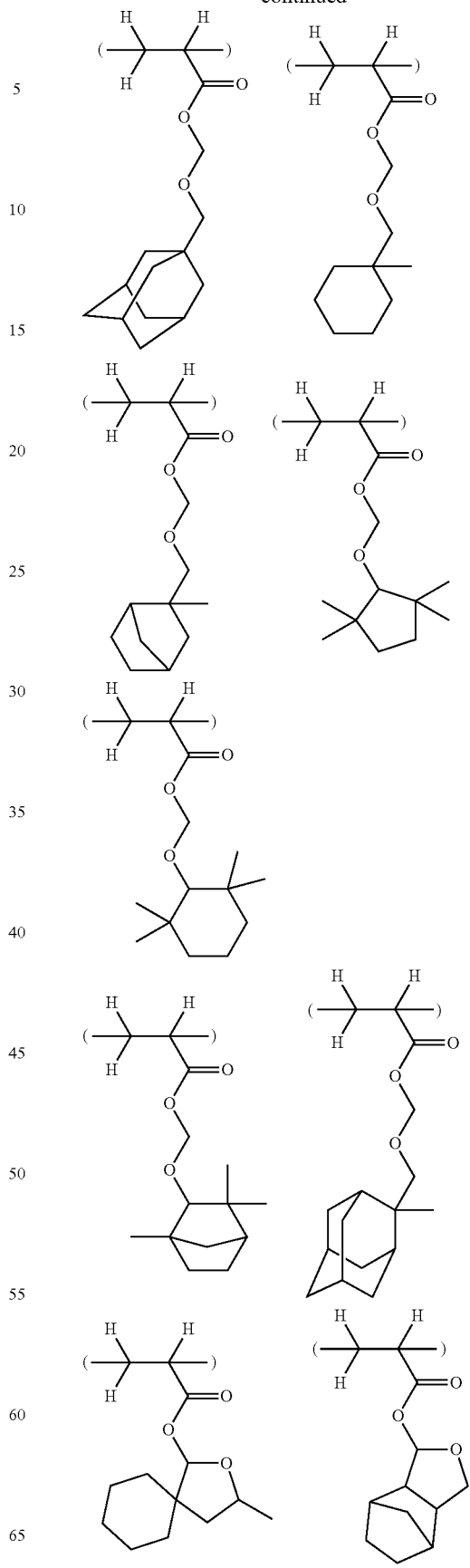

-continued
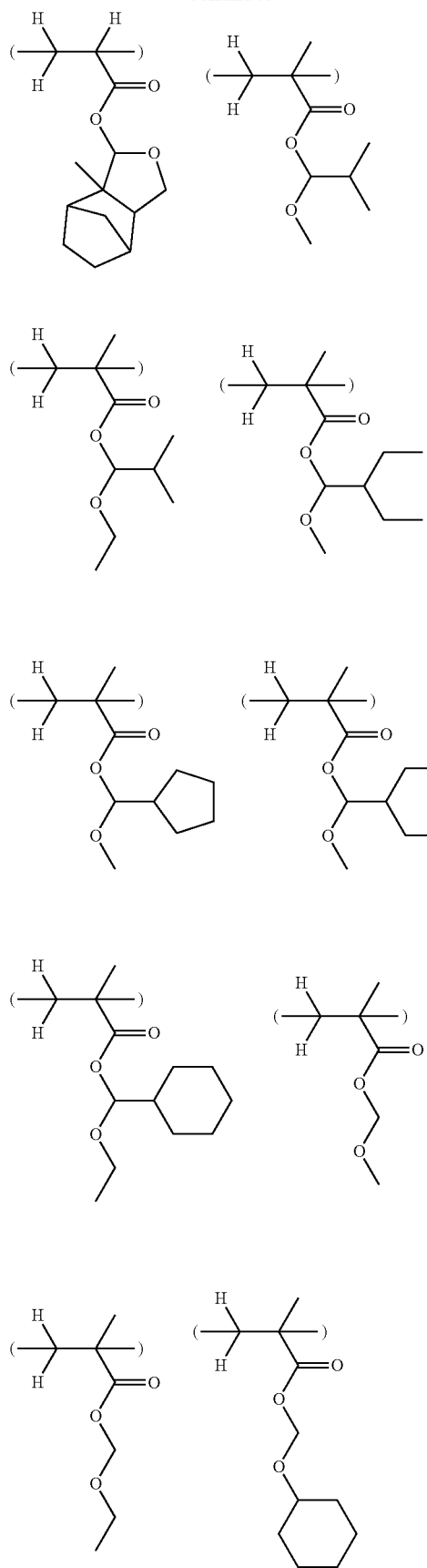
-continued
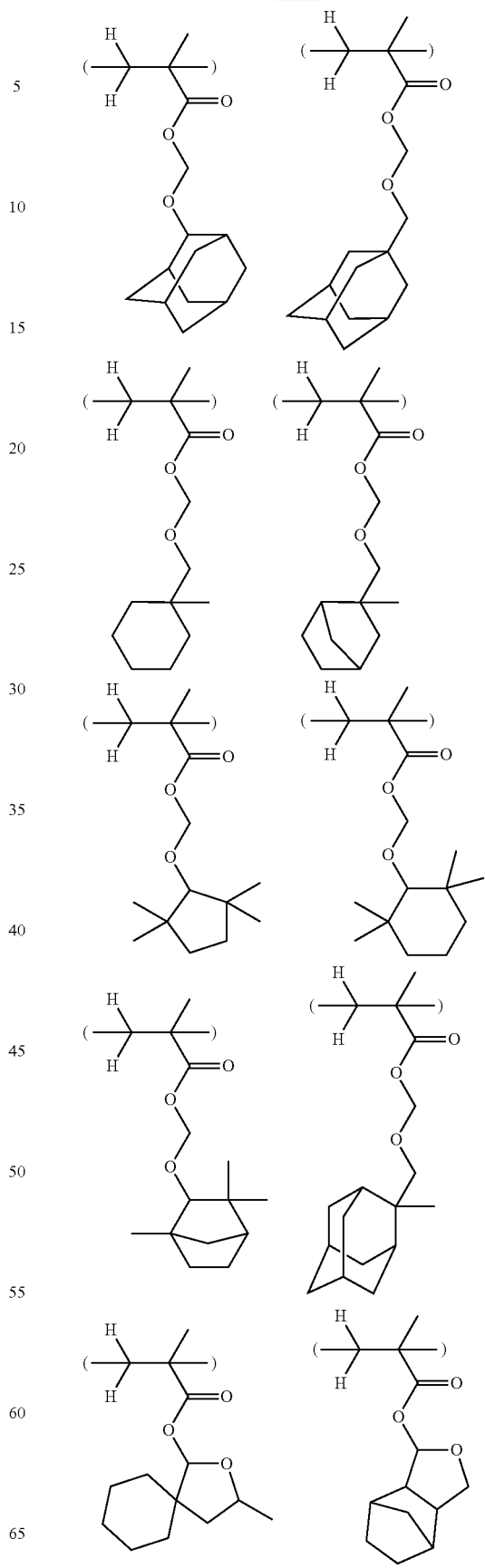

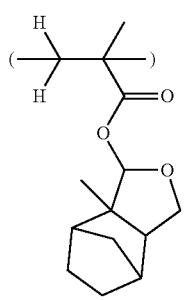

While the foregoing examples correspond to those units wherein Z is a single bond, Z which is other than a single bond may be combined with similar acid labile groups. Examples of units wherein Z is other than a single bond are substantially the same as illustrated above.

Besides the acid labile group-containing units having formula (4), the polymer may further comprise additional units, typically recurring units having the general formula (5).

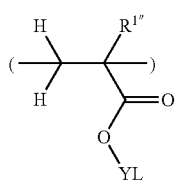

(5)

Herein $R^{1''}$ is hydrogen, methyl or trifluoromethyl. YL is a polar group having one or more structures selected from the group consisting of hydroxyl, cyano, carbonyl, carboxyl, ether bond, ester bond, sulfonic acid ester link, carbonate, lactone ring, sultone ring, and carboxylic anhydride.

Illustrative, non-limiting examples of the recurring units having formula (5) are shown below.

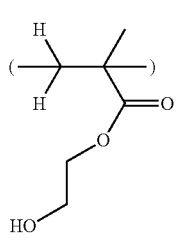 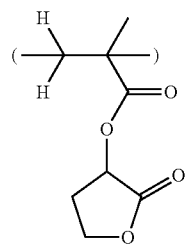

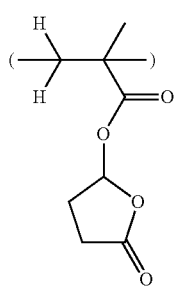 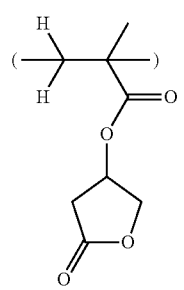

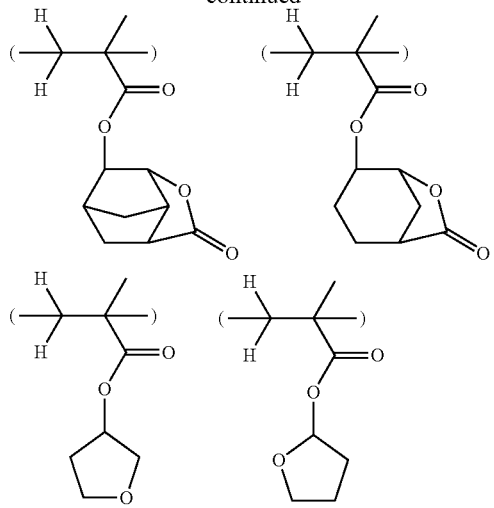

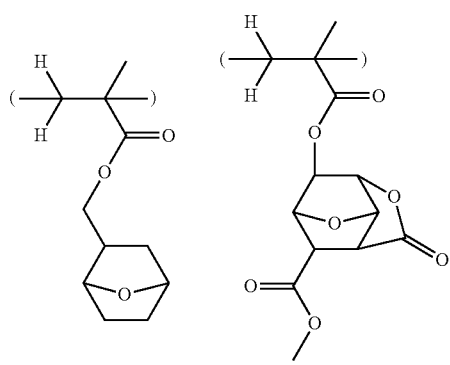

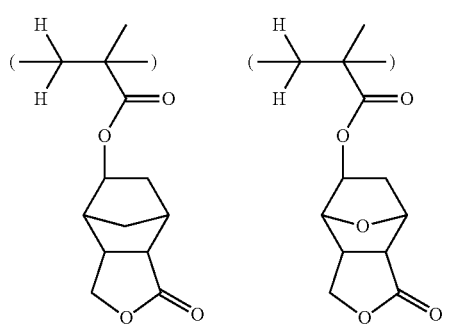

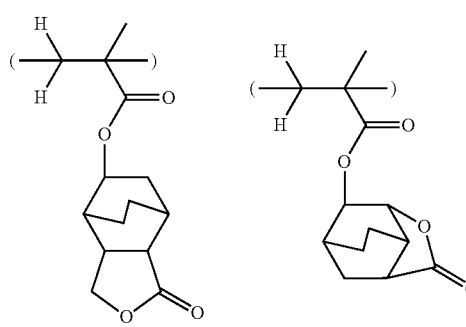

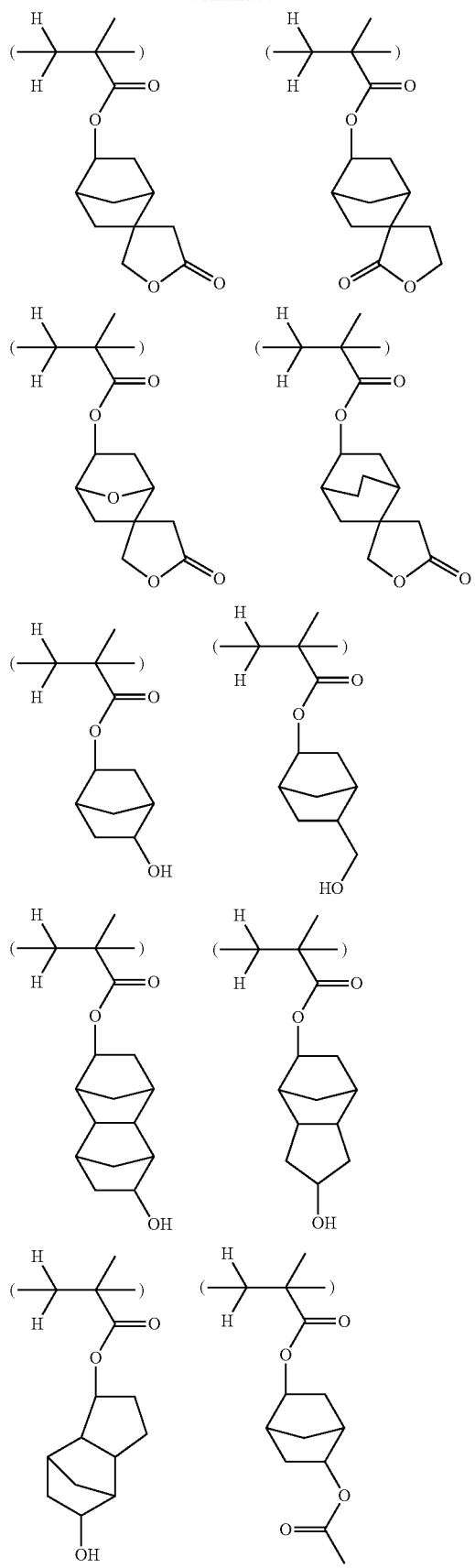
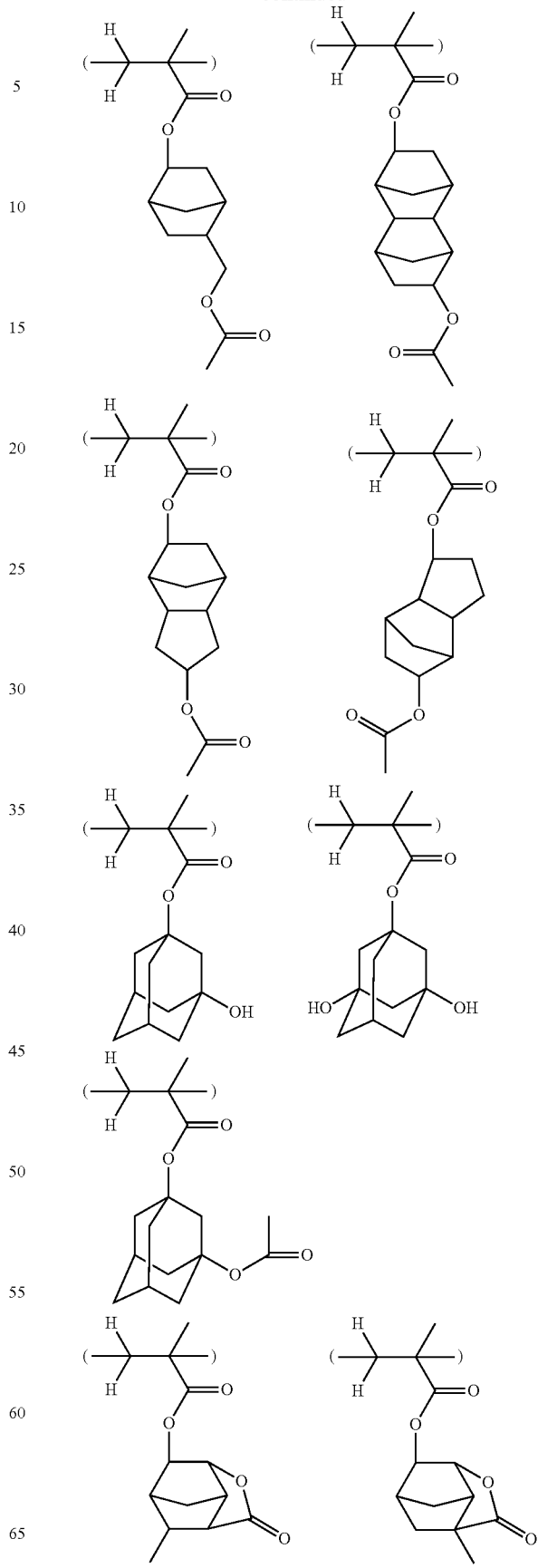

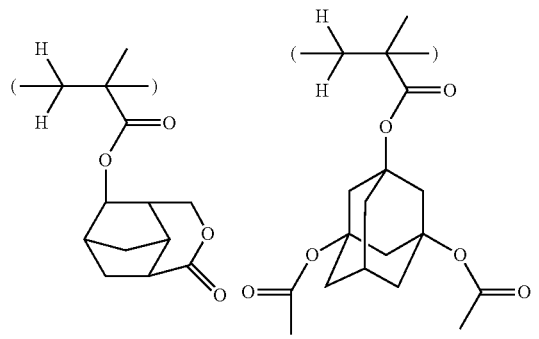
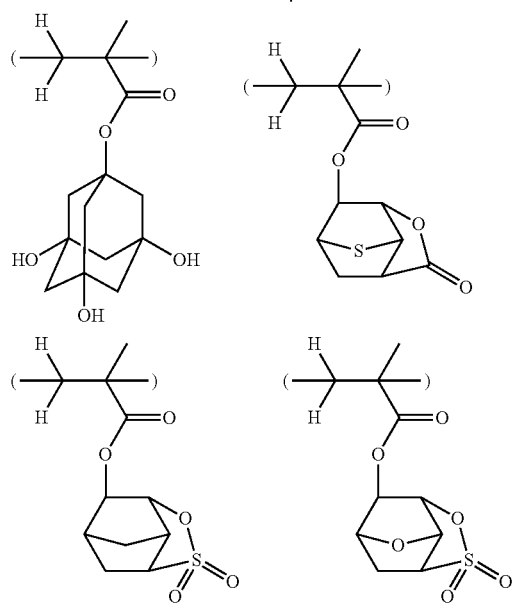
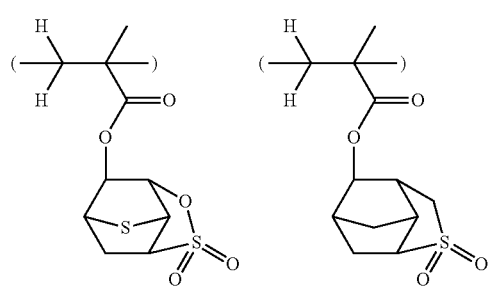
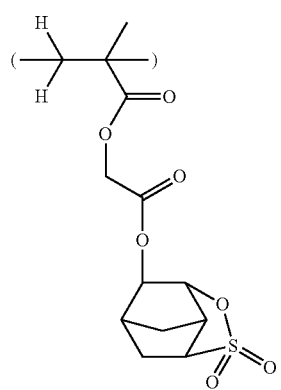
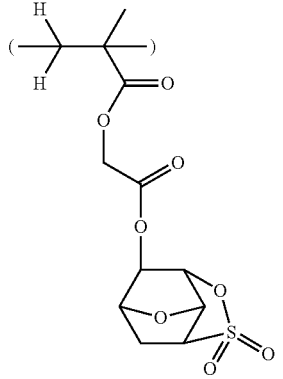
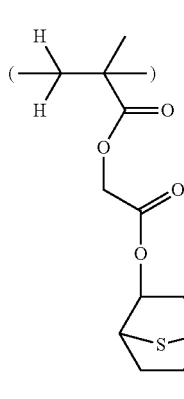
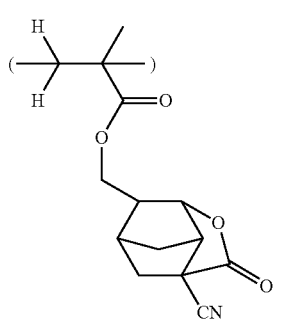
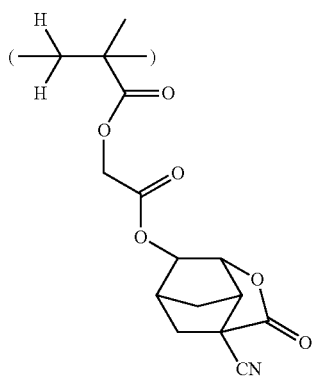

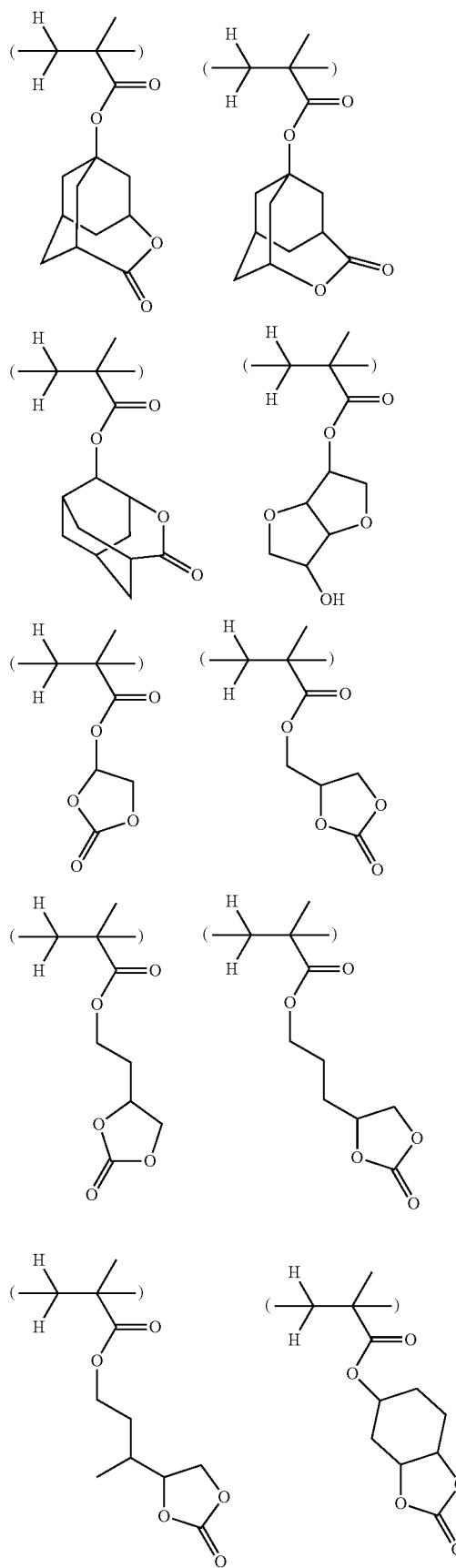
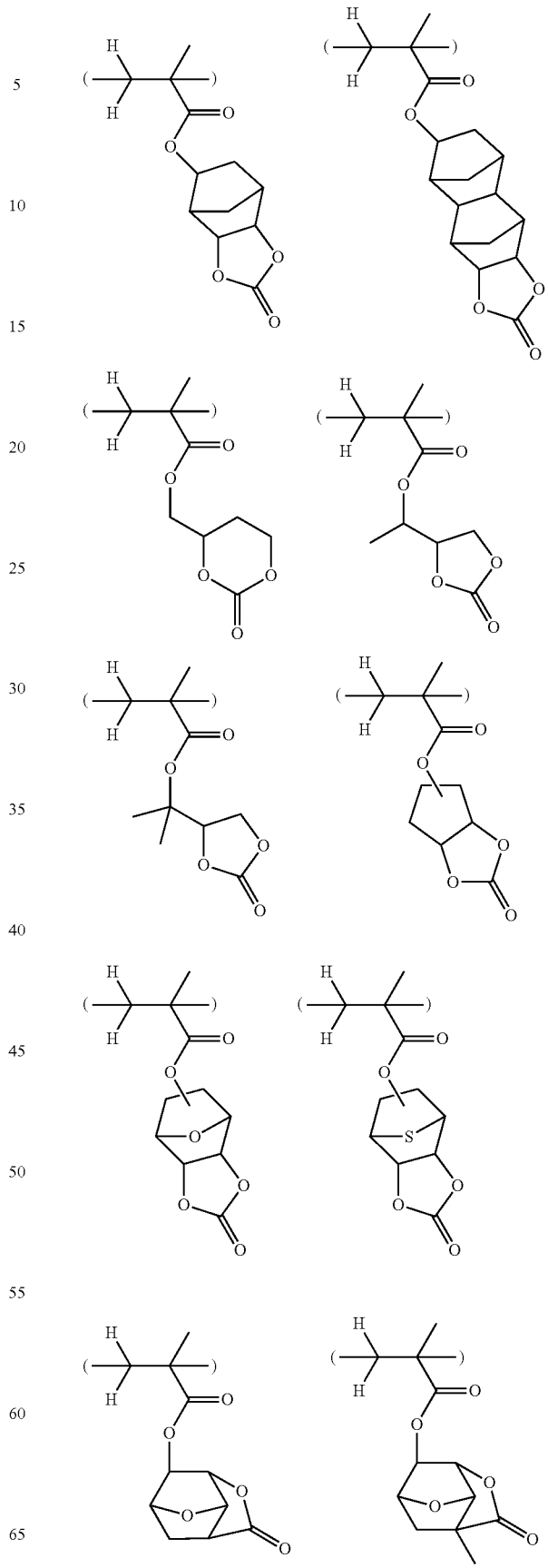

55
-continued
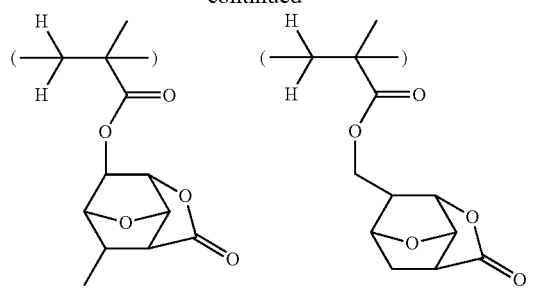
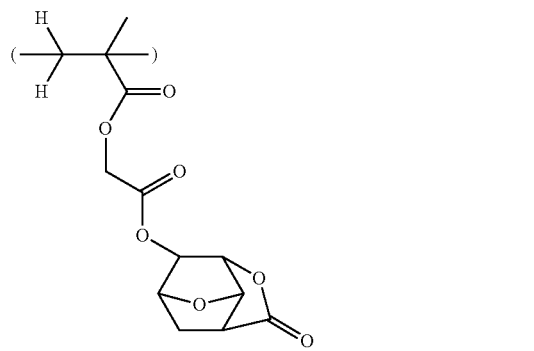
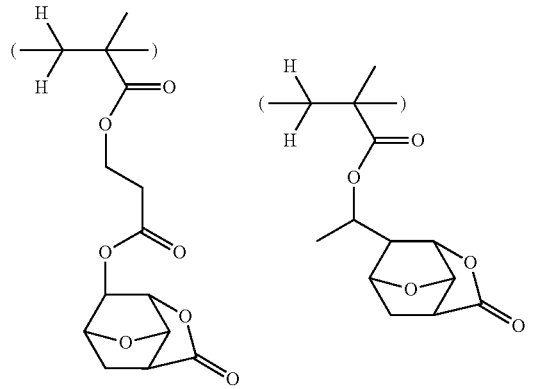
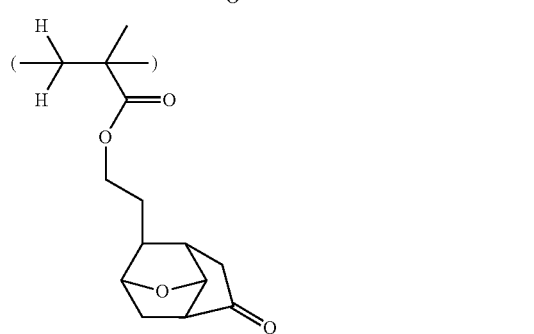
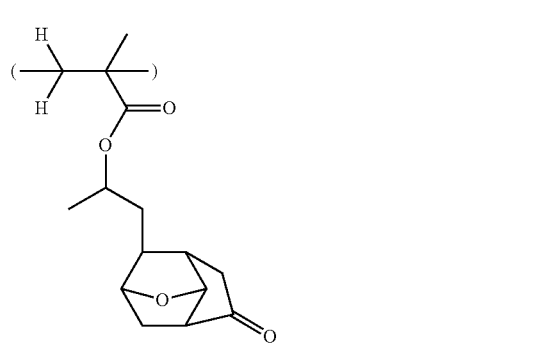
56
-continued
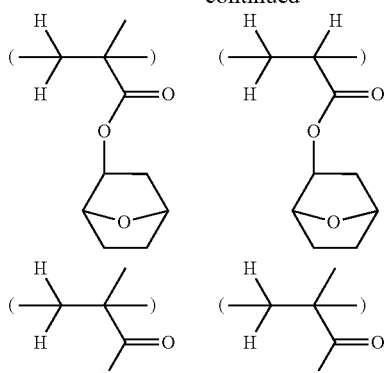
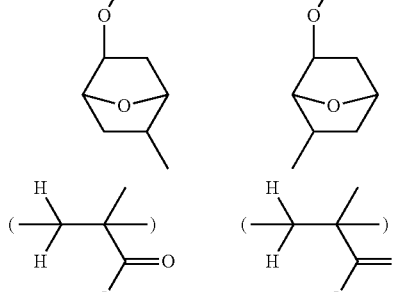
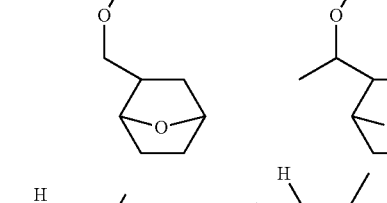
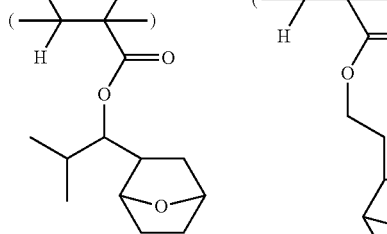
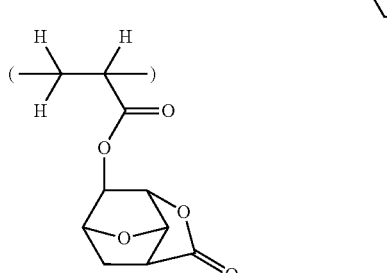
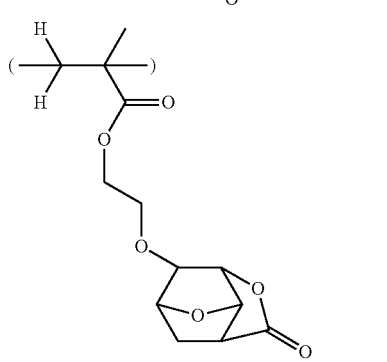

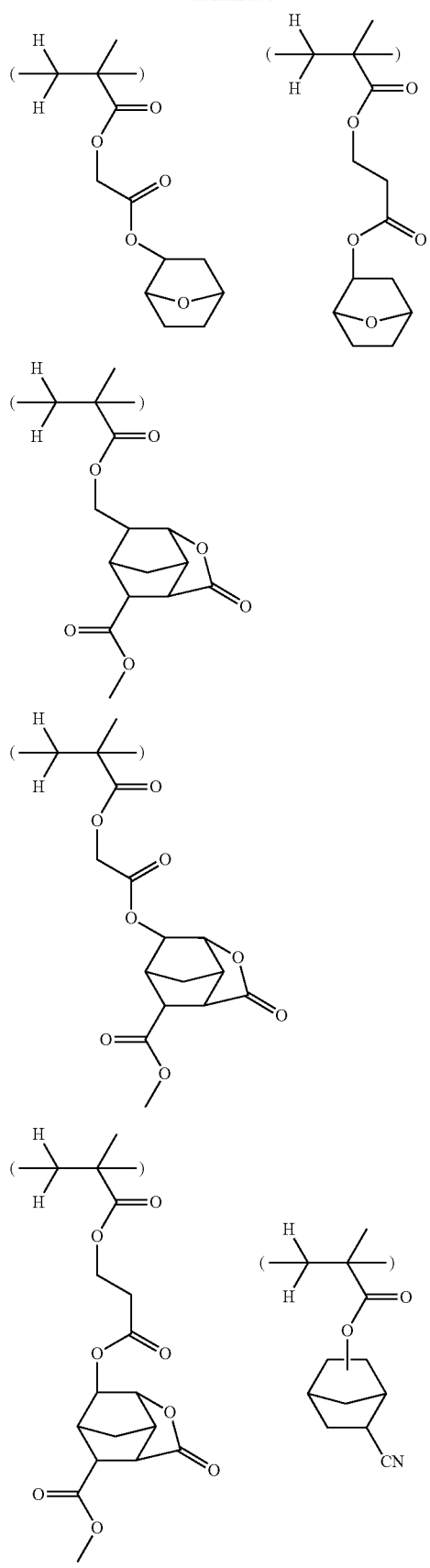
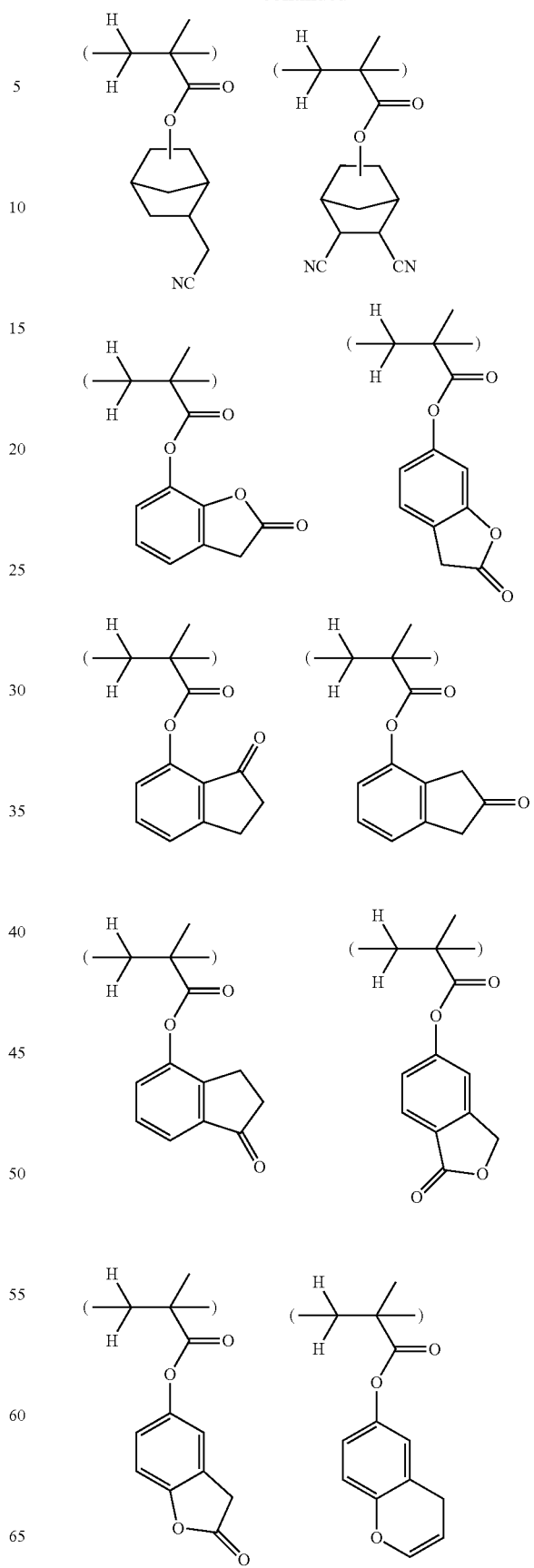

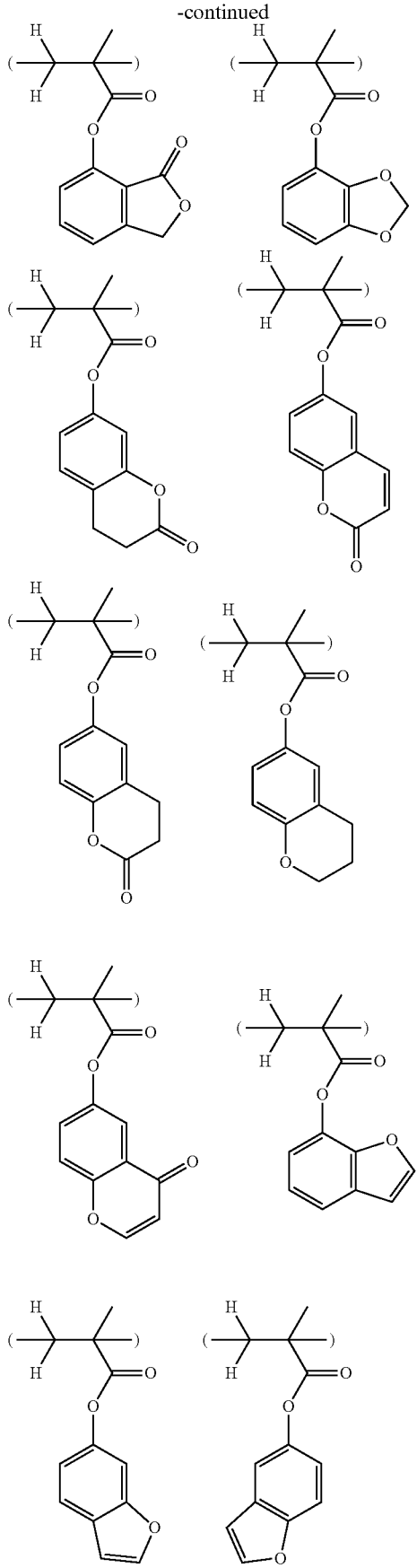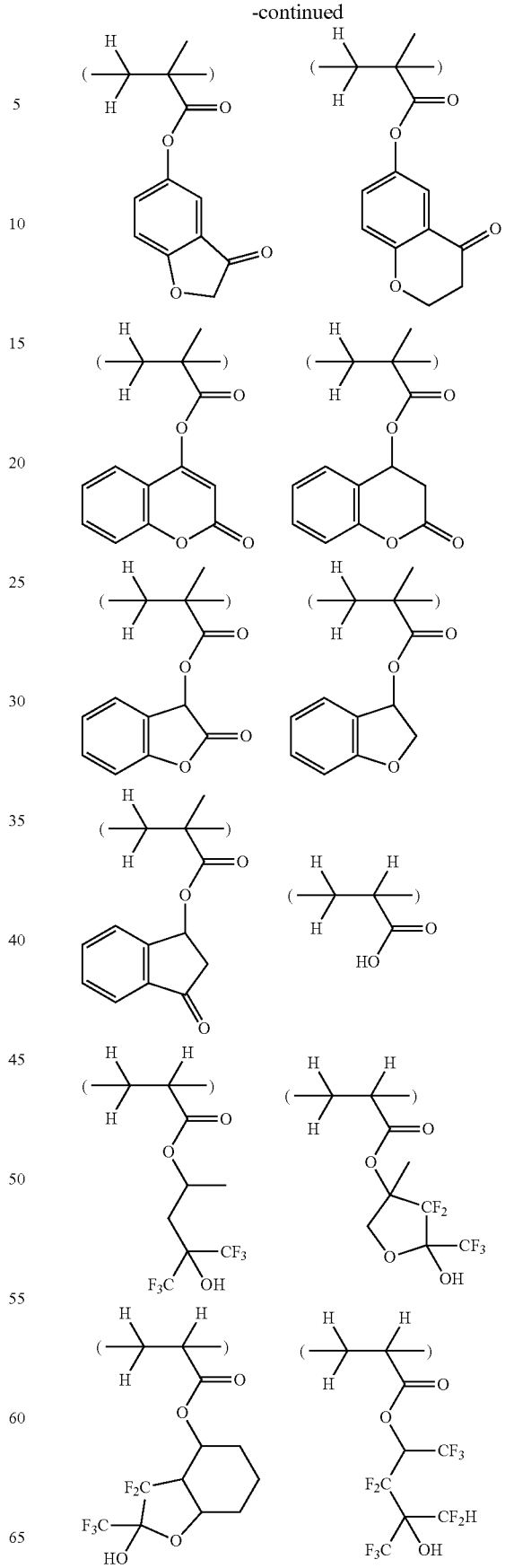

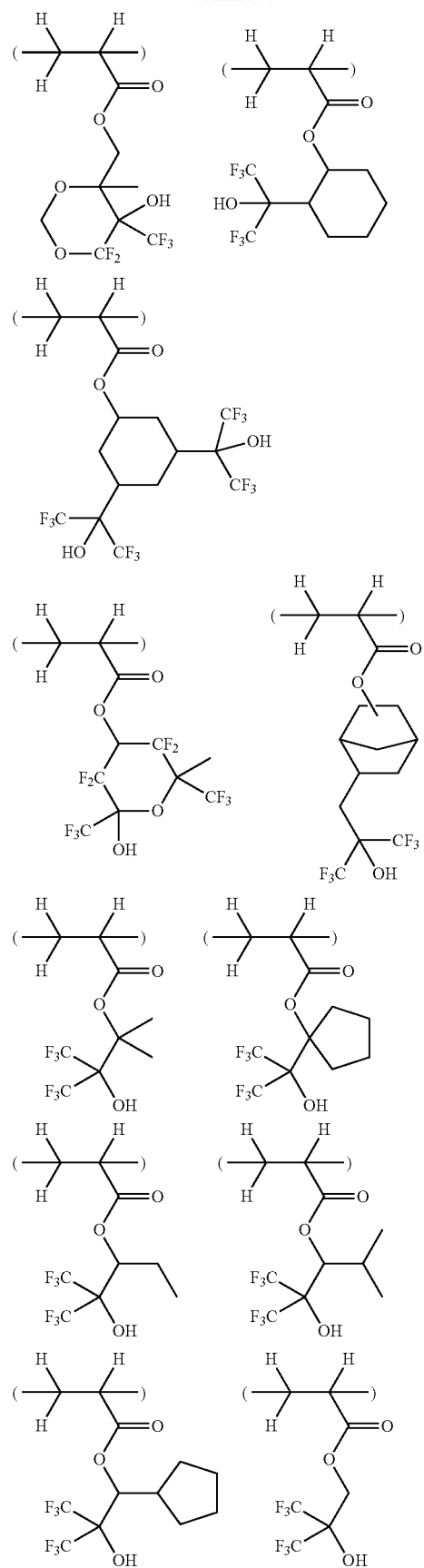
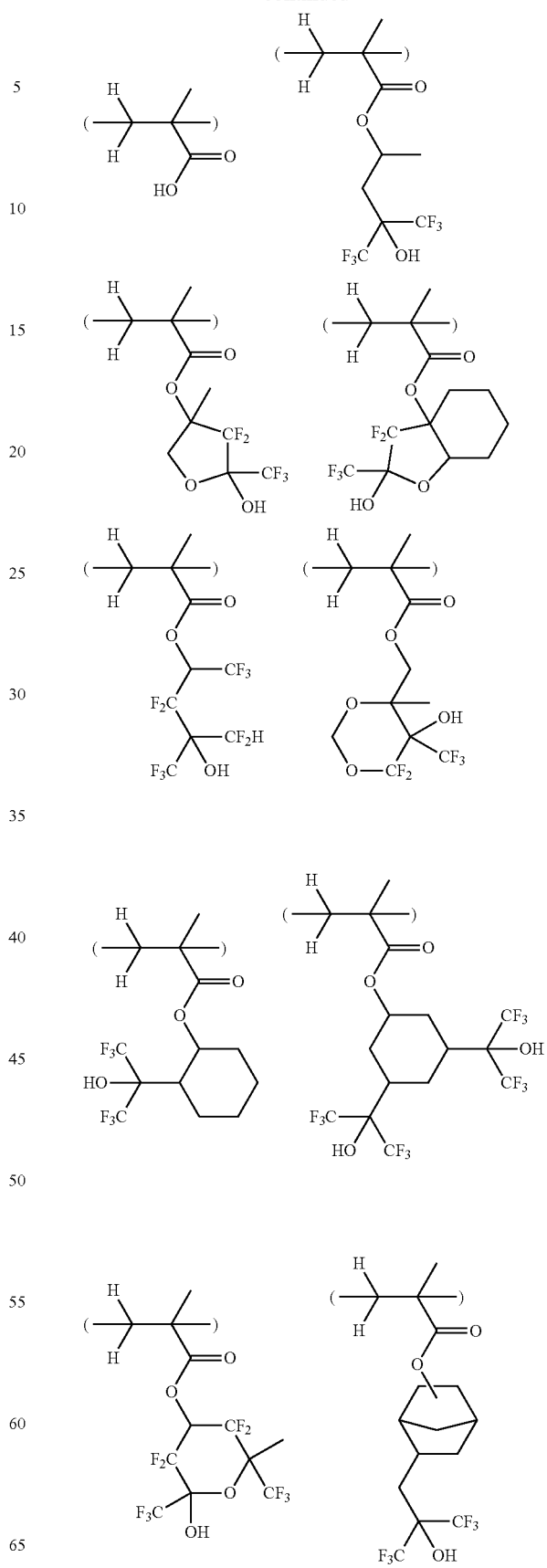

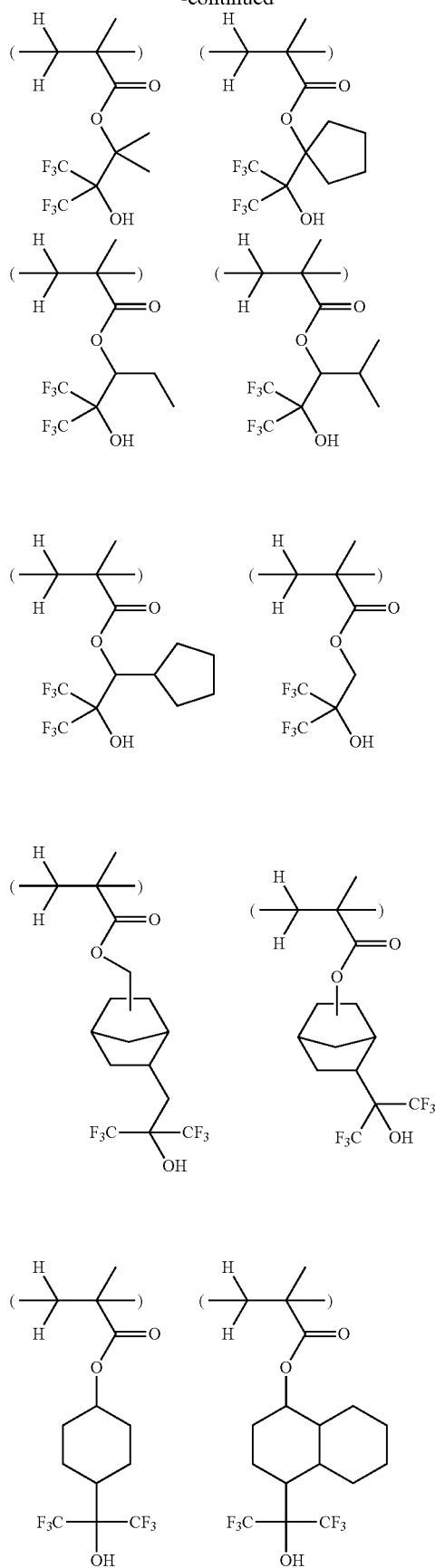
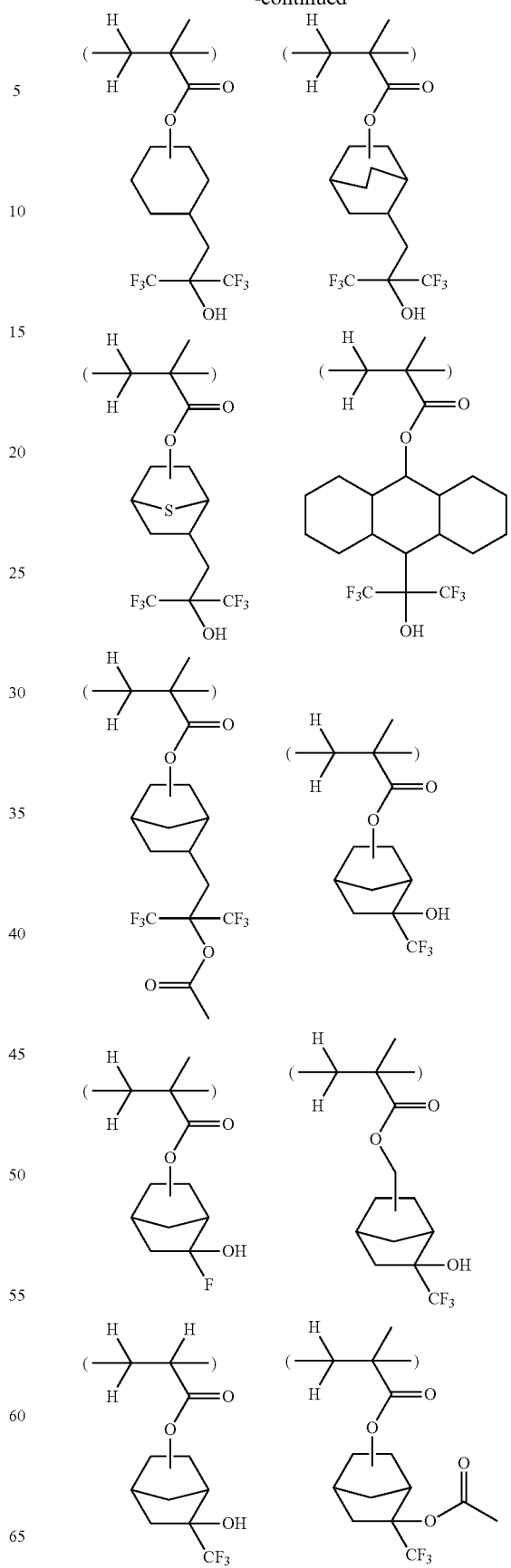

-continued
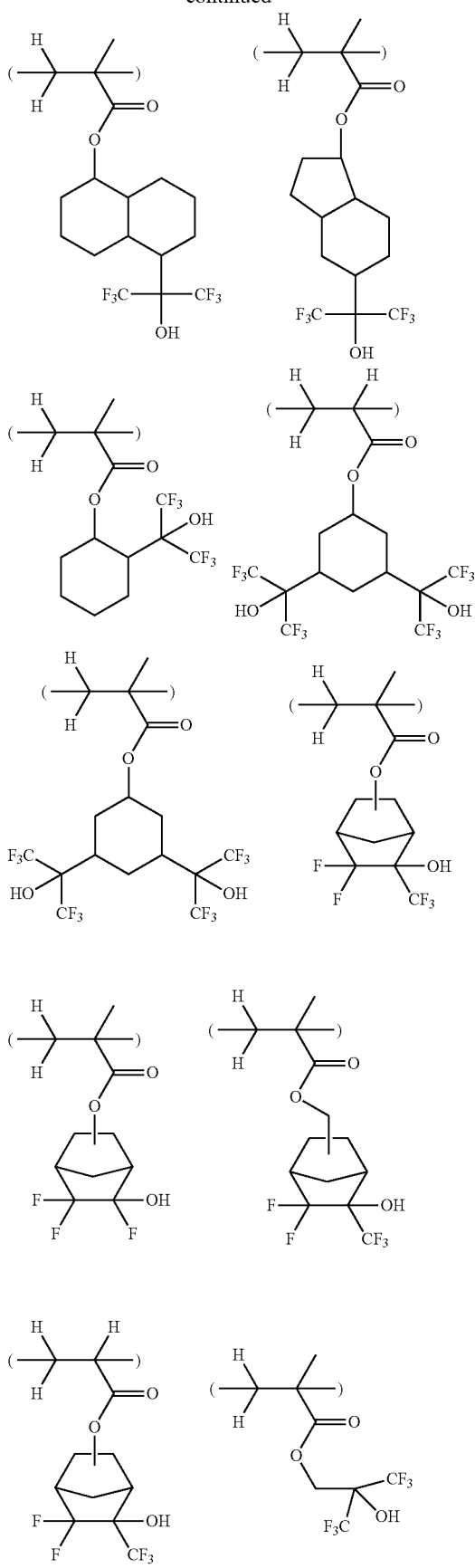
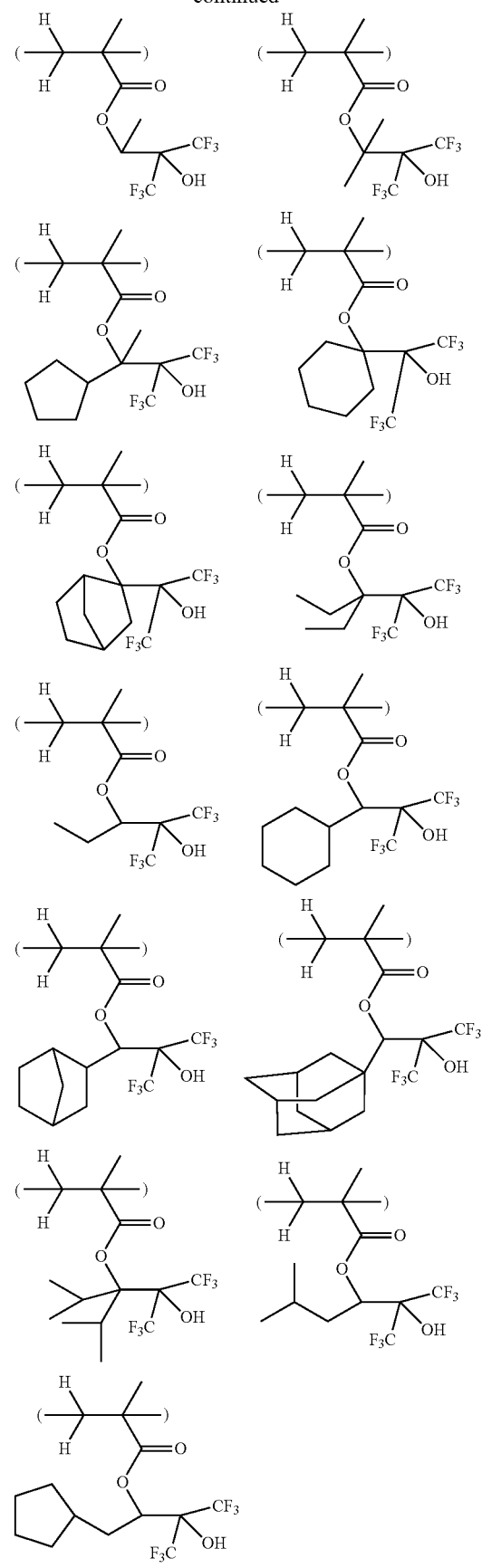

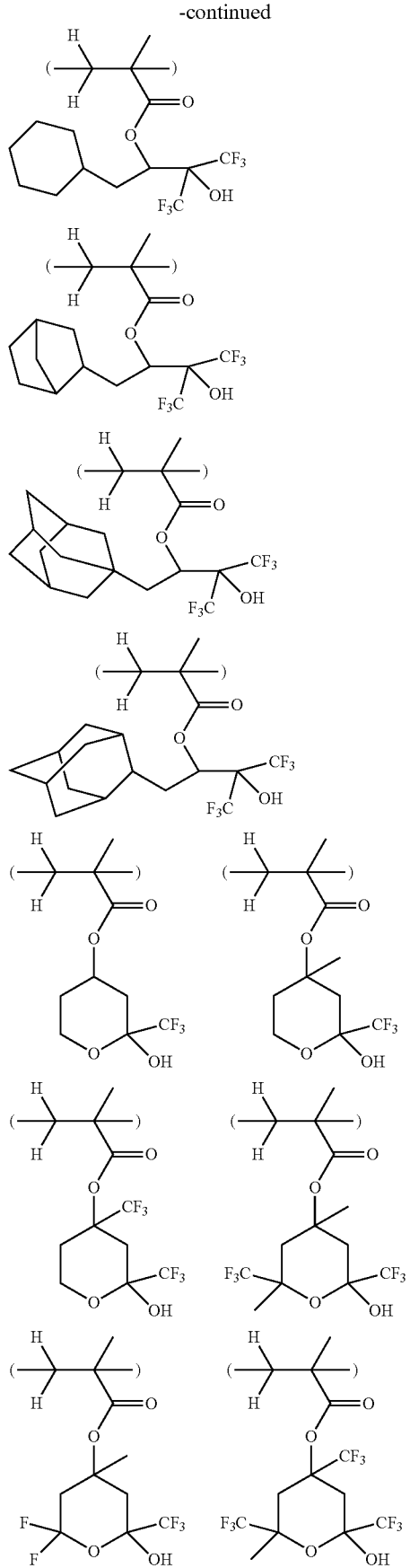
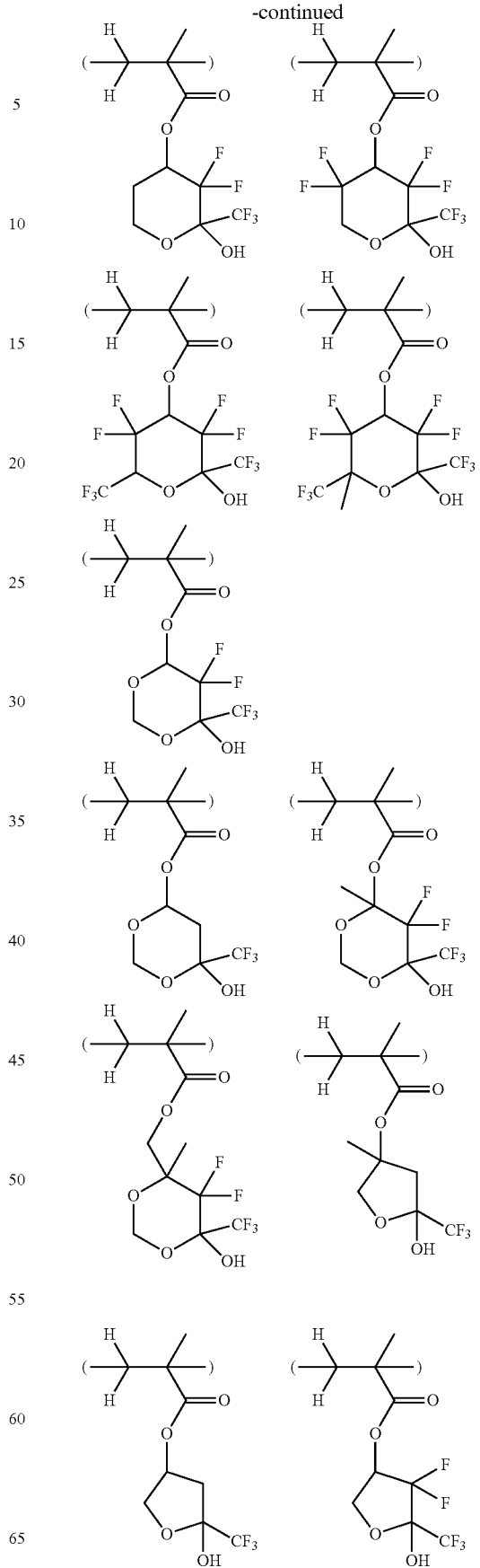

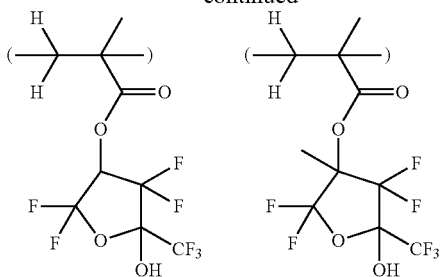
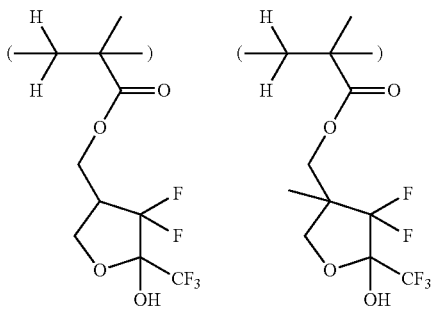
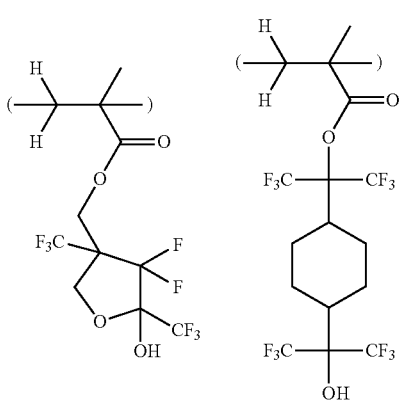
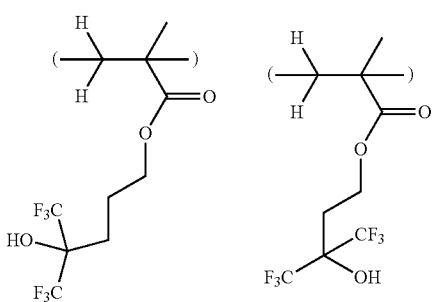
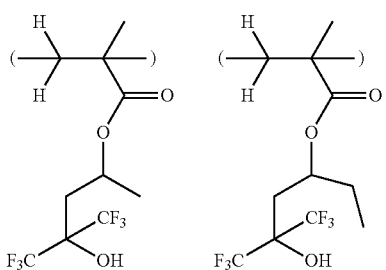

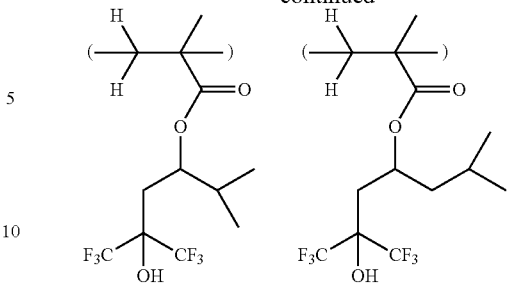

Of the recurring units having formula (5), if used, those units having a lactone ring as the polar group are most preferred.

On use, the recurring units having formula (5) are copolymerized with the recurring units having formula (3A) or (3B) and the optional recurring units having formula (4), although they may be further copolymerized with other recurring units.

In addition to the foregoing units, the polymer may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[$6.2.1.1^{3,6}.0^{2,7}$]dodecene derivatives, unsaturated acid anhydrides such as itaconic anhydride, styrene, 4-hydroxystyrene, 4-hydroxystyrene derivatives whose hydroxyl group is protected, and other monomers. Also, hydrogenated products of ring-opening metathesis polymerization (ROMP) polymers as described in JP-A 2003-066612 may be used.

The polymer generally has a weight average molecular weight (Mw) of 1,000 to 500,000, and preferably 3,000 to 100,000, as measured by gel permeation chromatography (GPC) using polystyrene standards. Outside the range, there may result an extreme drop of etch resistance, and a drop of resolution due to difficulty to gain a dissolution rate difference before and after exposure.

The general method of synthesizing the polymer is, for example, by dissolving two or more unsaturated bond-bearing monomers in an organic solvent, adding a radical initiator, and effecting heat polymerization. Reference may be made to many documents including JP-A 2005-264103. JP-A 2010-077404 describes the synthesis of a polymer comprising copolymerized units having a triphenylsulfonium salt-containing compound whose anion is bound to the polymer backbone, which method is similar to the above-mentioned one.

While the polymer comprises recurring units derived from monomers, the molar fractions of respective units preferably fall in the following range (mol %), but are not limited thereto.

(I) 0.2 to 20 mol %, more preferably 0.5 to 15 mol % of recurring units having formula (1A) or (1B), (II) 1 to 30 mol %, more preferably 5 to 30 mol %, and even more preferably 10 to 30 mol % of recurring units having formula (2), (III) 1 to 50 mol %, more preferably 5 to 40 mol %, and even more preferably 10 to 30 mol % of constituent units of at least one type having formula (4), (IV) 0 to 97.8 mol %, more preferably 15 to 89.5 mol %, and even more preferably 25 to 79.5 mol % of constituent units of at least one type having formula (5), and optionally, (V) 0 to 80 mol %, more preferably 0 to 70 mol %, and even more preferably 0 to 50 mol % of constituent units of at least one type derived from another monomer(s).

The polymer is not limited to one type and a mixture of two or more polymers may be added. The use of plural polymers allows for easy adjustment of resist properties.

Resist Composition

Another embodiment of the invention is a resist composition comprising (A) a polymer comprising recurring units having formula (3A) or (3B) as essential component, and optionally, another polymer free of recurring units having formulae (1A), (1B), (3A) and (3B). The resist composition may further comprise (B) a photoacid generator capable of generating an acid upon exposure, (C) a quencher, and (D) an organic solvent. Optionally, the resist composition may further comprise (E) a surfactant which is insoluble or substantially insoluble in water and soluble in alkaline developer, and/or a surfactant which is insoluble or substantially insoluble in water and alkaline developer (hydrophobic resin), and (F) an organic acid derivative and/or fluorinated alcohol.

(B) Photoacid Generator

The PAG used herein may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxylmide, O-arylsulfonyloxime, and O-alkylsulfonyloxime generators. The acid generators may be used alone or in admixture of two or more.

Sulfonium salts are salts of sulfonium cations with sulfonates, bis(substituted alkylsulfonyl)imides and tris(substituted alkylsulfonyl)methides. Suitable sulfonium cations include those cations having the general formula (10).

Herein $R^{33}$, $R^{44}$ and $R^{55}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or any two of $R^{33}$, $R^{44}$ and $R^{55}$ may bond together to form a ring with the sulfur atom in the formula.

Of the groups represented by $R^{33}$, $R^{44}$ and $R^{55}$, suitable alkyl groups include methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl and thienyl, hydroxyphenyl groups such as 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl. In these hydrocarbon groups, one or more hydrogen atoms may be substituted by fluorine or hydroxyl.

Alternatively, any two of $R^{33}$, $R^{44}$ and $R^{55}$ bond together to form a ring with the sulfur atom in the formula. Exemplary ring structures are given below.

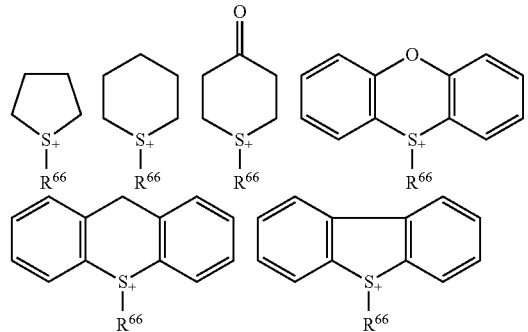

Herein $R^{66}$ is as defined and illustrated for $R^{33}$, $R^{44}$ and $R^{55}$.

As the anion of the sulfonium salt, exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxylmide, O-arylsulfonyloxime, and O-alkylsulfonyloxime (or oximesulfonate) acid generators are described in JP-A 2009-269953.

The preferred structure of PAG includes compounds having the general formula (P1).

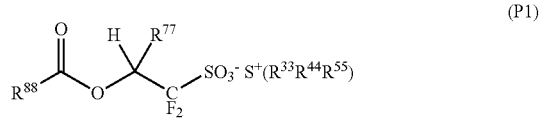

Herein $R^{77}$ is hydrogen or trifluoromethyl, $R^{88}$ is a $C_1$-$C_{30}$ alkyl, alkenyl or aralkyl group which may contain a heteroatom, $R^{33}$, $R^{44}$ and $R^{55}$ are as defined above.

In formula (P1), $R^{88}$ is a $C_1$-$C_{30}$ alkyl, alkenyl or aralkyl group optionally containing a heteroatom. Suitable heteroatoms contained in $R^{88}$ include oxygen, nitrogen, sulfur and halogen atoms, with oxygen being preferred. The $C_1$-$C_{30}$ alkyl, alkenyl or aralkyl group of $R^{88}$ may be straight, branched or cyclic while it is preferred for achieving a high resolution sufficient to form a fine size pattern that these groups have 6 to 30 carbon atoms. It is undesirable that $R^{88}$ be aryl because the resulting resist pattern may have less smooth sidewalls. Exemplary groups of $R^{88}$ include, but are not limited to, methyl, ethyl, propyl, isopropyl, butyl, isobutyl, s-butyl, tert-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having formula (P1), reference may be made to JP-A 2007-145797, 2008-106045, 2009-007327, and 2009-258695, for example.

Illustrative examples of the preferred PAG are given below.

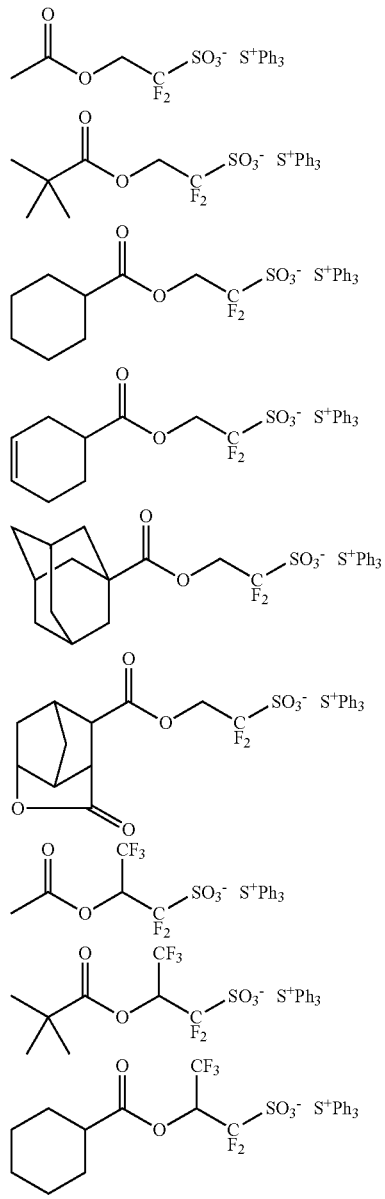

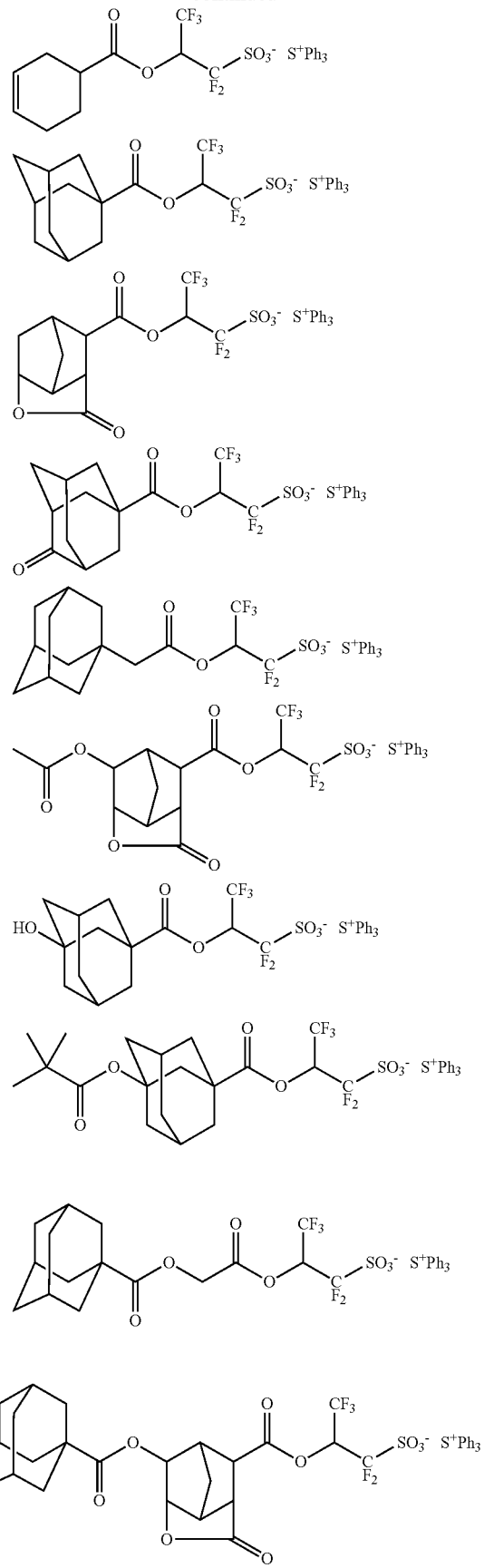

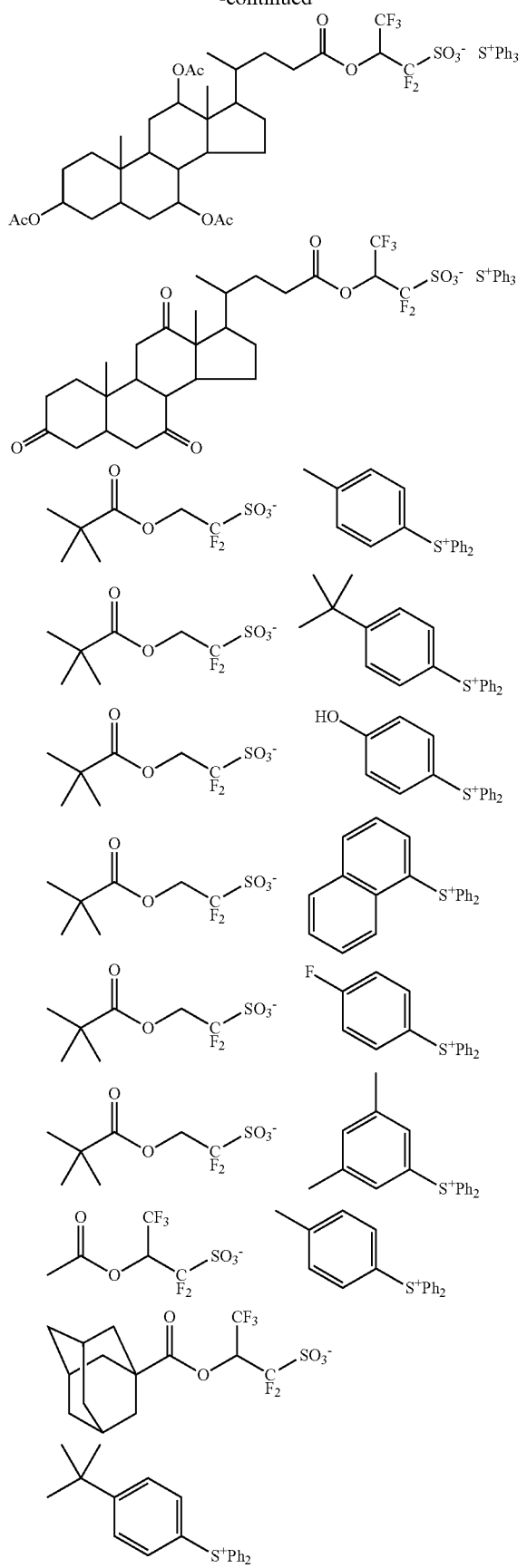
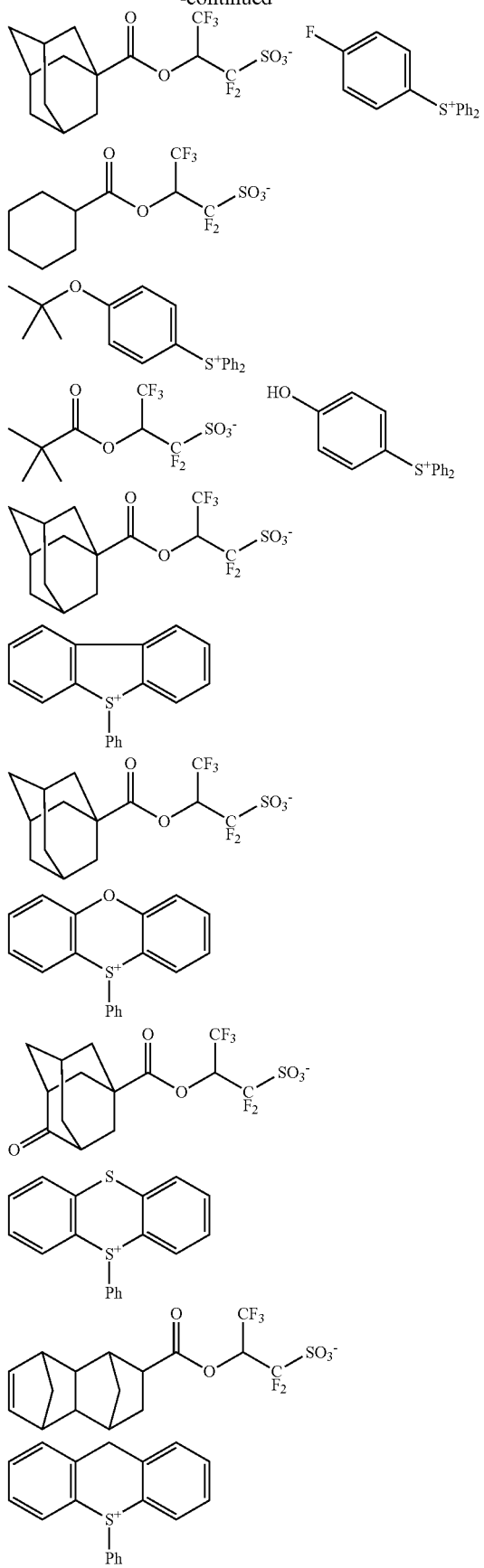

-continued

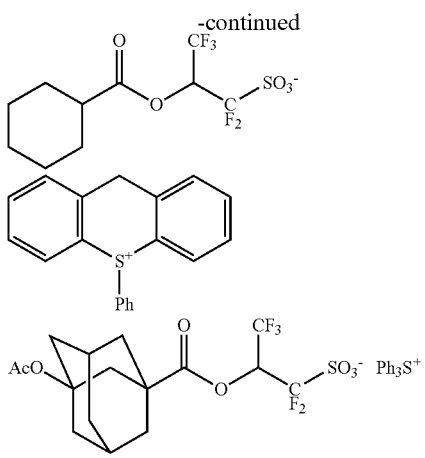

Herein Ac stands for acetyl and Ph stands for phenyl.

An appropriate amount of the PAG having formula (P1) added is 0 to 40 parts by weight, and if added, 0.1 to 40 parts, and more preferably 0.1 to 20 parts by weight per 100 parts by weight of the polymer as base resin. Too high a proportion of the PAG may give rise to problems such as degraded resolution and foreign particles during development and resist film stripping. The PAG having formula (P1) may be used alone or in admixture of two or more or in admixture with another PAG. When the other PAG is added, its amount is arbitrary as long as the objects of the invention are not compromised. Typically the amount of the other PAG is 0 to 20 parts, preferably 0.1 to 10 parts by weight per 100 parts by weight of the polymer.

Notably, the resist composition comprises as base resin (A) a polymer comprising recurring units of sulfonium salt having formula (3A) or (3B), which functions as PAG. Therefore, it is unnecessary to add PAG (B) although it is acceptable to use one or more PAGs (B) in combination with base resin (A).

It is noted that an acid diffusion controlling function may be provided when two or more PAGs are used in admixture provided that one PAG is an onium salt capable of generating a weak acid. Specifically, in a system using a mixture of an onium salt capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

(C) Quencher

The quencher (C) may be a compound capable of suppressing the rate of diffusion when the acid generated by the PAG diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Of these, preferred are tertiary amines, amine oxides, benzimidazoles, and anilines having a polar functional group such as ether, carbonyl, ester or alcohol.

Preferred tertiary amines include 2-morpholinoethyl esters of straight, branched or cyclic $C_2$-$C_{20}$ aliphatic carboxylic acids and trialkylamines having a straight, branched or cyclic $C_2$-$C_{10}$ alkyl moiety. Also included are substituted forms of these amines in which some carbon-bonded hydrogen atoms are replaced by hydroxyl groups. These amines may have an ether or ester linkage. Examples include 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, 2-morpholinoethyl adamantanecarboxylate, 4-[2-[(2-methoxyethoxy)methoxy]ethyl]morpholine, 4-[2-[2-(2-methoxyethoxy)ethoxy]ethyl]morpholine, 4-[2-[2-(2-butoxyethoxy)ethoxy]ethyl]morpholine, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, and tris(2-pivaloyloxyethyl)amine.

Preferred examples of the benzimidazoles include benzimidazole, 2-phenylbenzimidazole, 1-(2-acetoxyethoxy)benzimidazole, 1-[2-(methoxymethoxy)ethyl]benzimidazole, 1-[2-(methoxymethoxy)ethyl]-2-phenylbenzimidazole, and 1-(2-(2-(2-methoxyethoxy)ethoxy)ethyl)benzimidazole.

Preferred examples of the anilines include aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine.

Also included are primary and secondary amines which have been protected with tert-butoxycarbonyl (tBOC). Those compounds described in JP-A 2007-298569 and JP-A 2010-020204 are also useful.

The quenchers may be used alone or in admixture of two or more. The quencher is preferably used in an amount of 0.001 to 8 parts, more preferably 0.01 to 4 parts by weight per 100 parts by weight of the base resin. Less than 0.001 part of the quencher may achieve no addition effect whereas more than 8 parts may lead to too low a sensitivity.

(D) Organic Solvent

The organic solvent (D) used herein may be any organic solvent in which the polymer (or base resin), acid generator, quencher, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in combinations of two or more. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

(E) Surfactant

Component (E) is a surfactant which is insoluble or substantially insoluble in water and soluble in alkaline developer, and/or a surfactant which is insoluble or substantially insoluble in water and alkaline developer (hydrophobic resin). The surfactant (E) may be added to the resist composition. Reference should be made to those compounds defined as component (S) in JP-A 2010-215608 and JP-A 2011-016746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

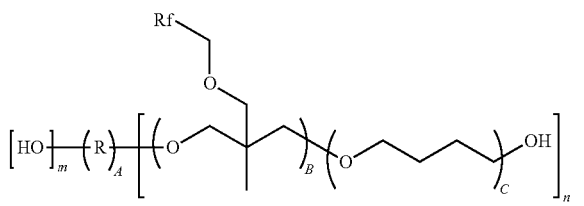
(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

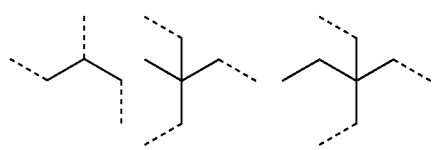

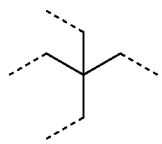

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

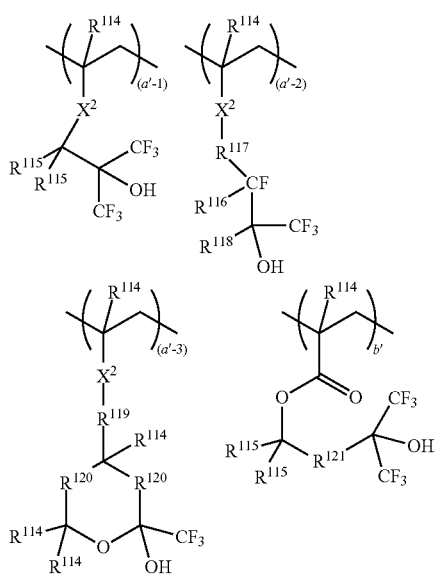

-continued

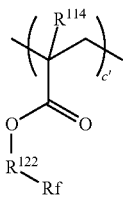

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. $X^2$ is each independently —C(=O)—O—, —O—, or —C(=O)—$R^{123}$—C(=O)—O—. $R^{123}$ is a straight, branched or cyclic $C_1$-$C_{10}$ alkylene group. The subscripts are in the range: $0 \le (a'-1) < 1$, $0 \le (a'-2) < 1$, $0 \le (a'-3) < 1$, $0 < (a'-1) + (a'-2) + (a'-3) < 1$, $0 \le b' < 1$, $0 \le c' < 1$, and $0 < (a'-1) + (a'-2) + (a'-3) + b' + c' \le 1$.

Examples of these units are shown below.

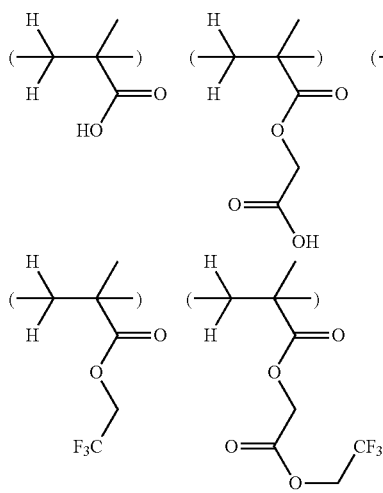

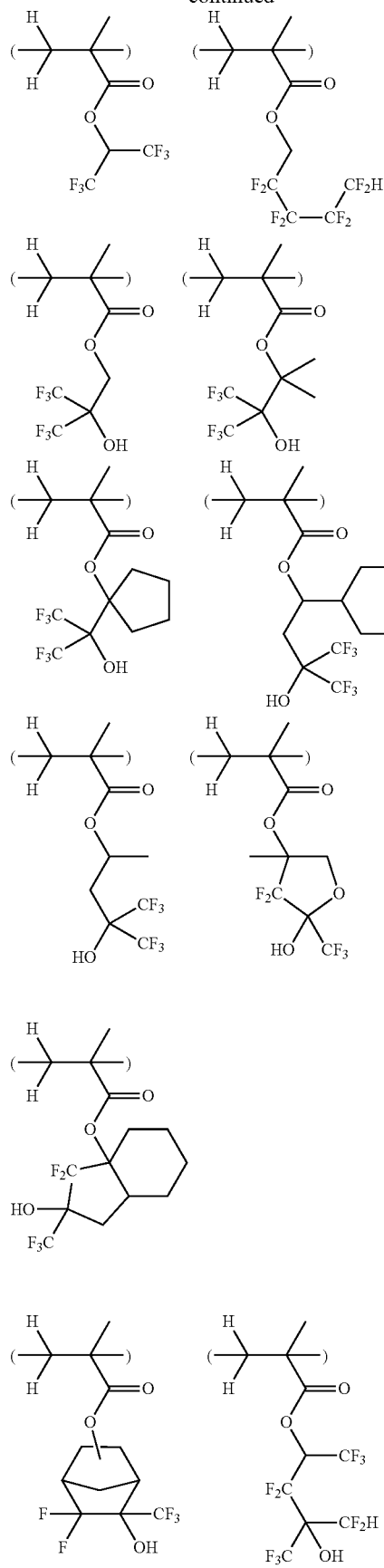

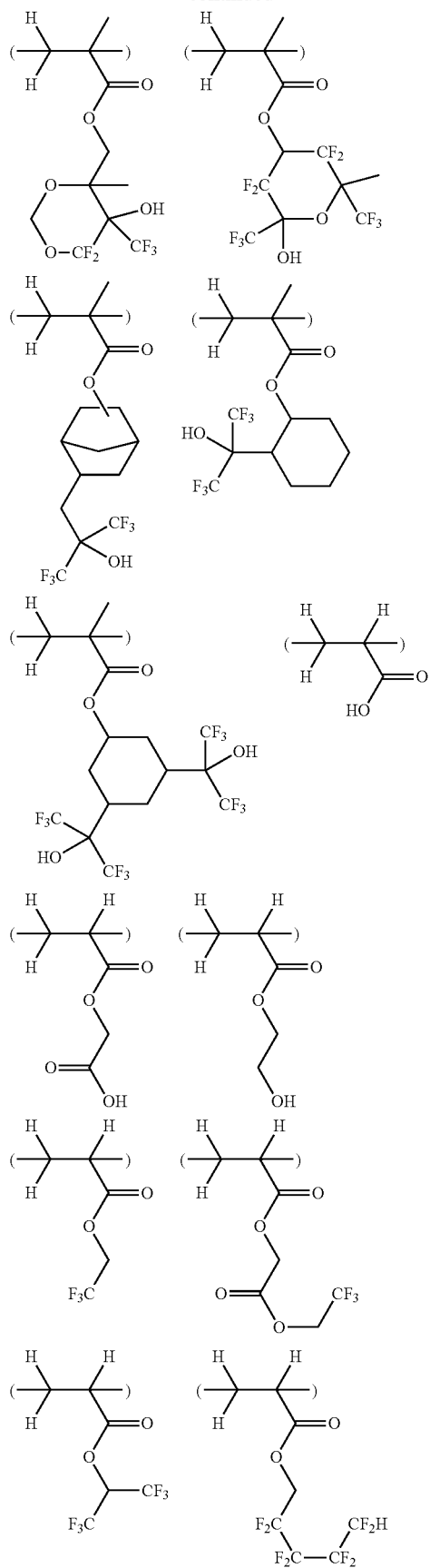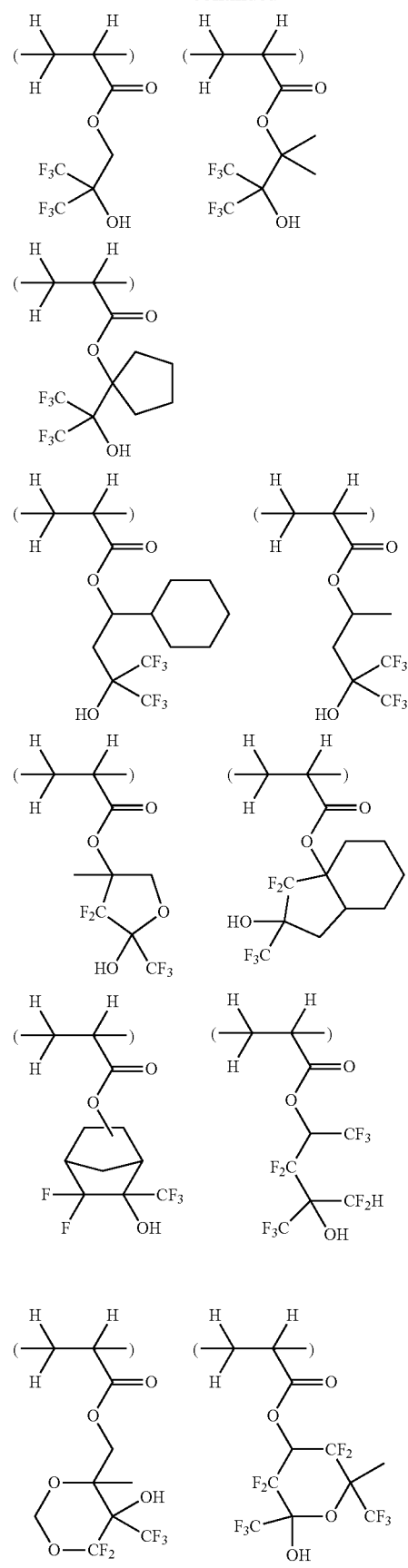

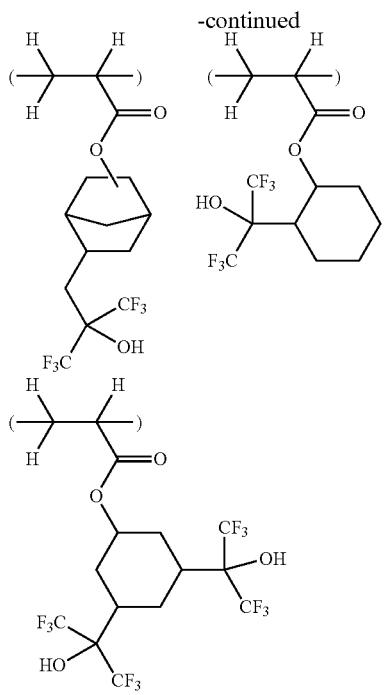

For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-98638, 2010-250105, and 2011-42789.

The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

(F) Organic Acid Derivative and/or Fluorinated Alcohol

To the resist composition, a compound which is decomposed with an acid to generate another acid, that is, acid amplifier compound may be added. For these compounds, reference should be made to JP-A 2009-269953 and 2010-215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Process

A further embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

First the resist composition is applied onto a substrate for integrated circuitry fabrication (e.g., Si, SiO$_2$, SiN, SiON, TiN, WSi, BPSG, SOG, organic antireflective film, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes. The resulting resist film is generally 0.05 to 2.0 μm thick. Through a photomask having a desired pattern disposed over the substrate, the resist film is then exposed to high-energy radiation such as deep-UV, excimer laser or x-ray, or electron beam in an exposure dose preferably in the range of 1 to 200 mJ/cm$^2$, more preferably 10 to 100 mJ/cm$^2$. Alternatively, pattern formation may be performed by writing with an electron beam directly (not through a mask). Light exposure may be done by a conventional lithography process or in some cases, by an immersion lithography process of providing liquid impregnation, typically water, between the projection lens or mask and the resist film. In the case of immersion lithography, a protective film which is insoluble in water may be used. The resist film is then baked (PEB) on a hot plate at 60 to 150° C. for 1 to 5 minutes, and preferably at 80 to 140° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate. Of the various types of high-energy radiation that may be used, the resist composition of the invention is best suited to fine pattern formation with, in particular, deep-UV or excimer laser having a wavelength of 190 to 250 nm, x-ray, or EB. The desired pattern may not be obtainable outside the upper and lower limits of the above range.

While the water-insoluble protective film which is used in the immersion lithography serves to prevent any components from being leached out of the resist film and to improve water slippage at the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution, typically an aqueous solution of 0.1 to 5 wt %, more typically 2 to 3 wt % of tetramethylammonium hydroxide (TMAH) is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples and Comparative Examples are given below by way of illustration and not by way of limitation. Weight average molecular weight (Mw) and number average molecular weight (Mn) are measured by gel permeation chromatography (GPC), and a dispersity (Mw/Mn) is computed therefrom. All parts are by weight (pbw).

Synthesis Example 1-1

Synthesis of triphenylsulfonium 1,1,3,3,3-pentafluoro-2-(4-methacryloyloxy-4-methyladamantane-1-carboxyloxy)-propane-1-sulfonate (PAG-1)

In toluene solvent, 4-methacryloyloxy-4-methyladamantanecarboxylic acid was reacted with oxalyl chloride into a corresponding carboxylic acid chloride. To 1.8 g (6 mmol) of 4-methacryloyloxy-4-methyladamantanecarboxylic acid chloride thus obtained, 2.5 g (5 mmol) of triphenylsulfonium 2-hydroxy-1,1,3,3,3-pentafluoropropane-1-sulfonate (which was synthesized with reference to JP-A 2007-145803) and 20 g of methylene chloride were added, followed by ice cooling. To the solution, a solution of 0.7 g (7 mmol) of triethylamine and 0.06 g (0.5 mmol) of N,N-dimethylaminopyridine in 5 g of methylene chloride was added at such a rate that the temperature might not exceed 10° C., followed by stirring for 12 hours at room temperature. Thereafter, 10 g of 5% dilute hydrochloric acid solution was added to the reaction solution. The organic layer was taken out and washed with water, whereupon methylene chloride was distilled off in vacuum.

The residue was combined with 20 g of methyl isobutyl ketone and washed with dilute ammonia water, then with water, whereupon the methyl isobutyl ketone was distilled off in vacuum. The residue was subjected to column chromatography, to which diisopropyl ether was added. By decantation, the target compound, triphenylsulfonium 1,1,3,3,3-pentafluoro-2-(4-methacryloyloxy-4-methyladamantane-1-carboxyloxy)propane-1-sulfonate was obtained as brown oil, 1.7 g (yield 45%).

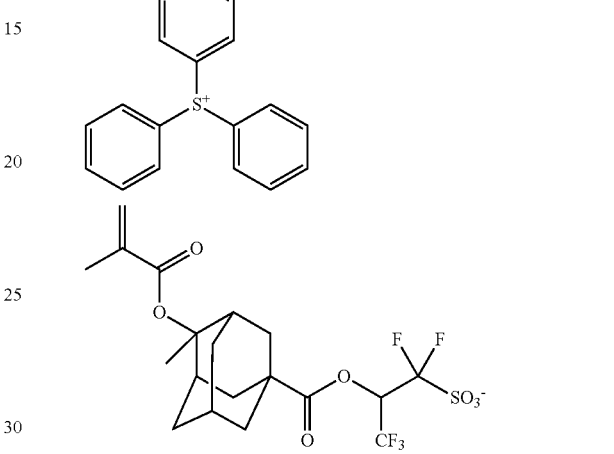

(PAG-1)

Figure 2:
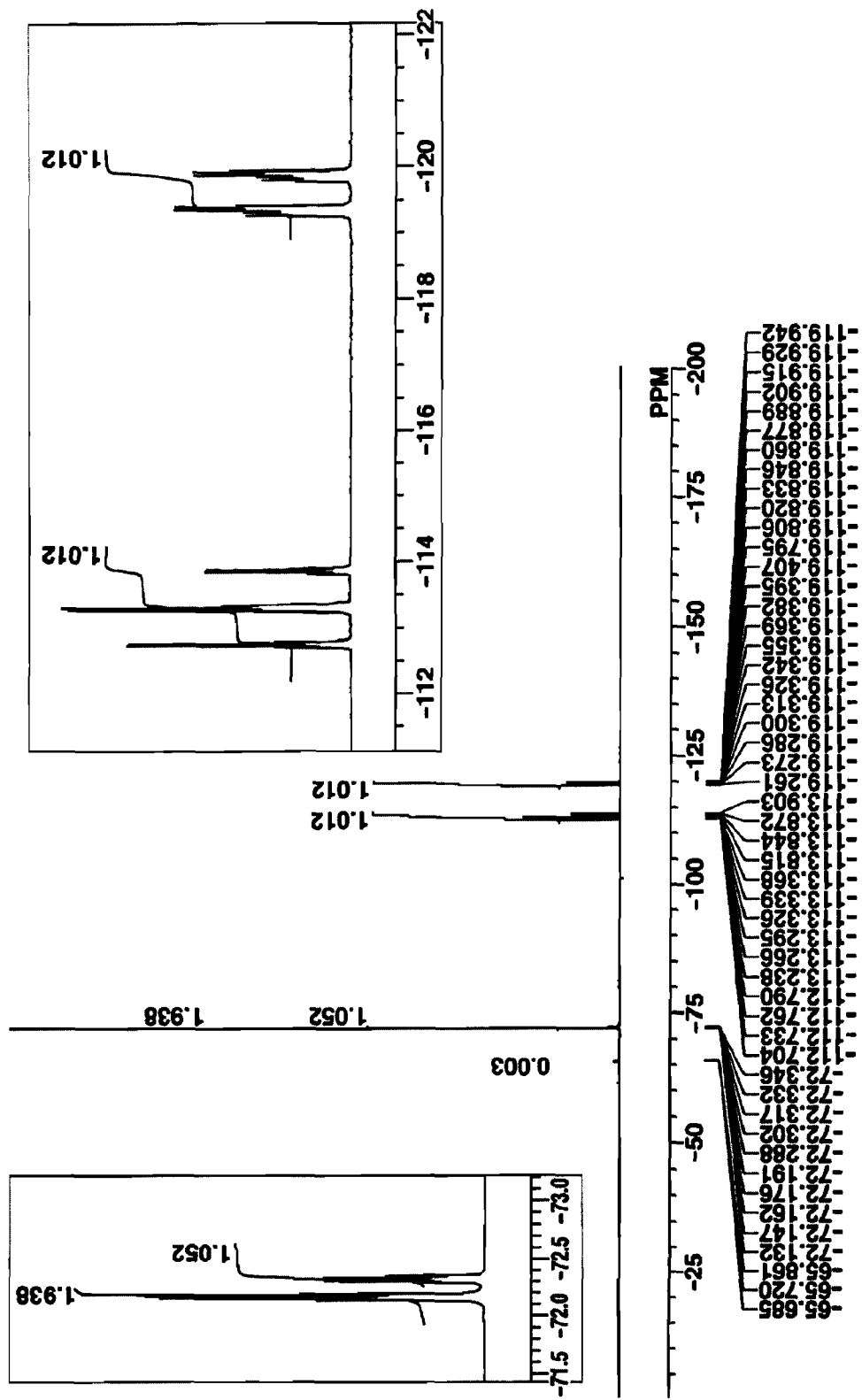
FIG. 2 is a diagram of $^{19}$F-NMR of PAG-1 in Synthesis Example 1-1.

The target compound was analyzed by infrared absorption spectroscopy (IR), nuclear magnetic resonance spectroscopy (NMR), and time-of-flight mass spectrometry (TOFMS). FIGS. 1 and 2 are diagrams of $^1$H-NMR and $^{19}$F-NMR in DMSO-d$_6$, respectively. In $^1$H-NMR analysis, a trace amount of residual solvent (methylene chloride and water) was observed.

IR (D-ATR): 2929, 1755, 1705, 1476, 1447, 1373, 1329, 1304, 1248, 1214, 1180, 1097, 1033, 994, 910, 748, 683, 640 cm$^{-1}$

TOFMS (MALDI): Positive M$^+$ 263 (corresponding to $(C_6H_5)_3S^+$) Negative M$^+$ 489 (corresponding to $CF_3CH(OCO-C_{15}H_{21}O_2)CF_2SO_3^-$)

For comparison purpose, polymerizable group-containing photoacid generators PAG-2 to PAG-4, identified below, were synthesized. For PAG-2, reference may be made to JP-A 2008-133448. For PAG-3, reference may be made to JP-A 2010-077404. For PAG-4, reference may be made to WO 2007/069640 and JP-A 2008-133448.

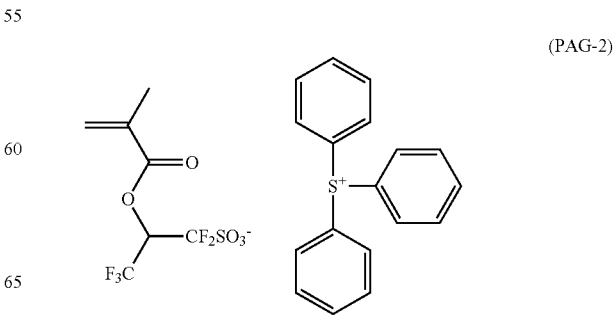

(PAG-2)

(PAG-3)

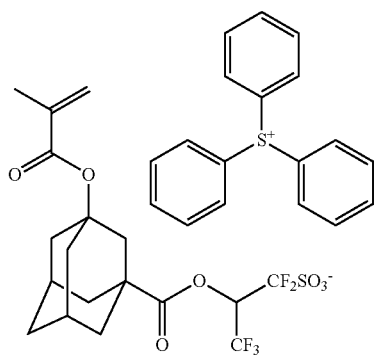

(PAG-4)

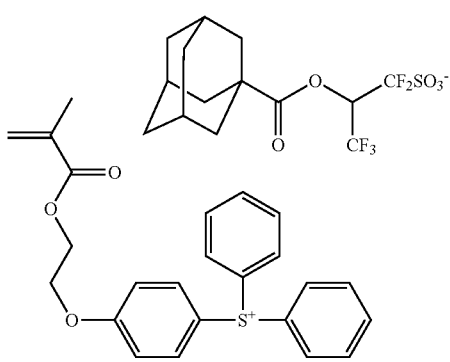

(P-1)

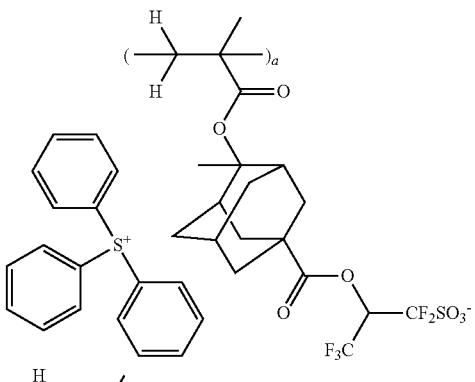

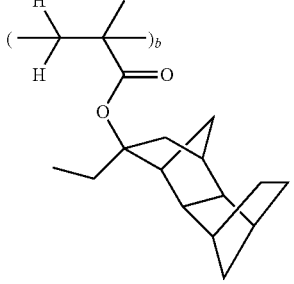

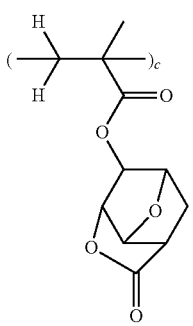

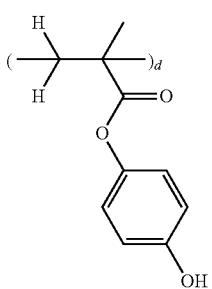

$a = 0.10, b = 0.30, c = 0.30, d = 0.30$

Synthesis Example 2-1

Synthesis of Polymer P-1

In a flask purged with nitrogen, 2.85 g of triphenylsulfonium 1,1,3,3,3-pentafluoro-2-(4-methacryloyloxy-4-methyladamantane-1-carbonyloxy)propane-1-sulfonate, 3.13 g of 3-ethyl-3-exo-tetracyclo[4.4.0.1$^{2,5}$.1$^{7,10}$]dodecanyl methacrylate, 2.02 g of 4-hydroxyphenyl methacrylate, 2.54 g of 4,8-dioxatricyclo[4.2.1.0$^{3,7}$]nonan-5-on-2-yl methacrylate, and 0.31 g of 2,2'-azobisisobutyronitrile were dissolved in 17.5 g of methyl ethyl ketone (MEK) to form a monomer solution. Another flask purged with nitrogen was charged with 5.8 g of MEK, which was stirred and heated at 80° C. Thereafter, the monomer solution was added dropwise over 4 hours. After the completion of dropwise addition, the polymerization solution was stirred for a further 2 hours while maintaining at 80° C. After the polymerization solution was cooled to room temperature, it was added dropwise to a mixture of 10 g of MEK and 90 g of hexane. A precipitating copolymer was filtered. The copolymer was washed 2 times with a mixture of 18.5 g of MEK and 41.5 g of hexane, and vacuum dried at 50° C. for 20 hours. The copolymer was obtained as white powder solid, designated Polymer P-1. Amount 9.54 g, yield 91%.

Synthesis Examples 2-2 to 2-10

Synthesis of Polymers P-2 to P-10

A series of resins as shown in Table 1 were prepared by the same procedure as in Synthesis Example 2-1 except that the type and ratio of monomers were changed. The units in Table 1 have the structure shown in Tables 2 to 4. In Table 1, the ratio of units is a molar ratio.

TABLE 1
| Resin | Unit 1 (ratio) | Unit 2 (ratio) | Unit 3 (ratio) | Unit 4 (ratio) | Unit 5 (ratio) |
|---|---|---|---|---|---|
| P-1 | PAG-1 (0.10) | A-1 (0.30) | B-3 (0.30) | B-4 (0.30) | — |
| P-2 | PAG-1 (0.10) | A-1 (0.30) | B-2 (0.30) | B-4 (0.30) | — |
| P-3 | PAG-1 (0.20) | A-1 (0.30) | B-3 (0.20) | B-4 (0.30) | — |
| P-4 | PAG-1 (0.20) | A-1 (0.30) | B-2 (0.20) | B-3 (0.30) | — |
| P-5 | PAG-1 (0.10) | A-3 (0.20) | A-4 (0.20) | B-3 (0.20) | B-4 (0.30) |
| P-6 | PAG-2 (0.10) | A-1 (0.30) | B-3 (0.30) | B-4 (0.30) | — |
| P-7 | PAG-3 (0.10) | A-1 (0.30) | B-3 (0.30) | B-4 (0.30) | — |
| P-8 | PAG-4 (0.10) | A-1 (0.30) | B-3 (0.30) | B-4 (0.30) | — |
| P-9 | PAG-1 (0.10) | A-2 (0.40) | B-1 (0.20) | B-3 (0.20) | B-5 (0.10) |
| P-10 | A-3 (0.30) | B-3 (0.40) | B-4 (0.30) | — | — |
TABLE 2
PAG-1
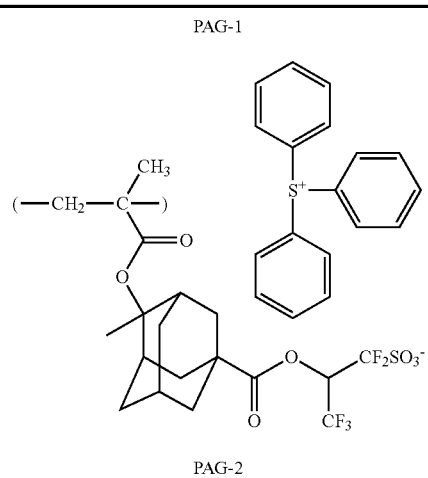
PAG-2
PAG-3
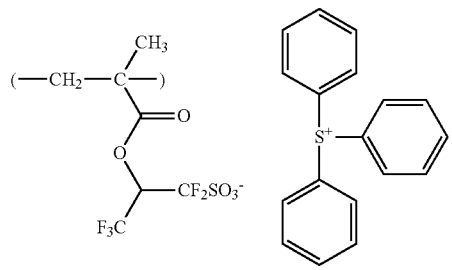
PAG-4
TABLE 2-continued
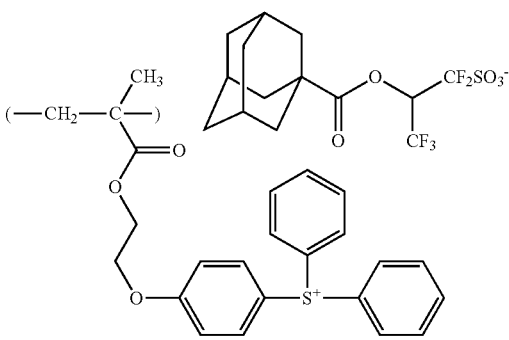
TABLE 3
A-1
A-2
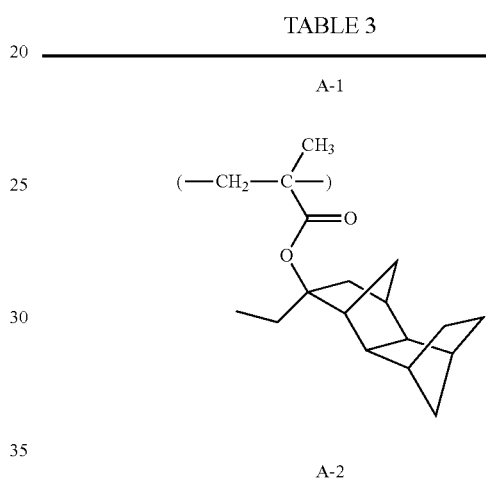
A-3
A-4
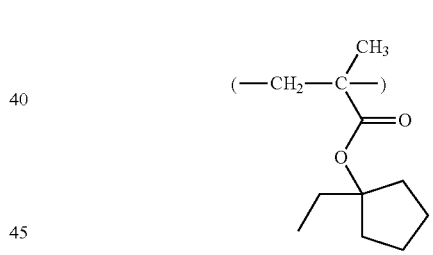

TABLE 3-continued

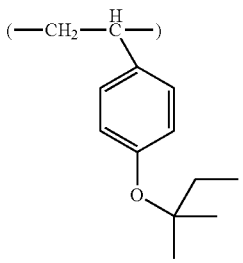

TABLE 4

B-1

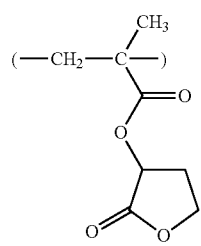

B-2

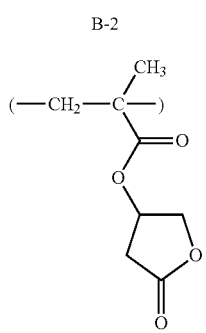

B-3

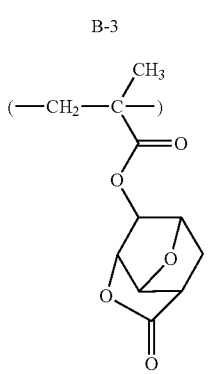

TABLE 4-continued

B-4

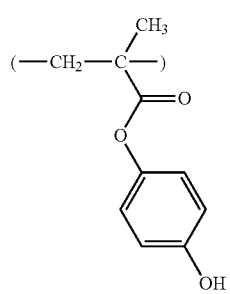

B-5

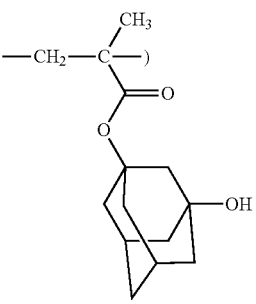

Preparation of Resist Composition

Examples 1-1 to 1-8 & Comparative Examples 1-1 to 1-5

Resist compositions in solution form were prepared by mixing and dissolving a polymer (obtained in Synthesis Examples), PAG, amine quencher, and alkali-soluble surfactant (F-1) in a solvent according to the formulation shown in Table 5 and filtering through a Teflon® filter having a pore size of 0.2 µm. In all runs, the solvent contained 0.01 wt % of surfactant (F-2).

TABLE 5

| | | Resist | Resin (pbw) | PAG (pbw) | Quencher (pbw) | Surfactant (pbw) | Solvent 1 (pbw) | Solvent 2 (pbw) |
|---|---|---|---|---|---|---|---|---|
| Example | 1-1 | R-01 | P-1 (80) | — | Q-1 (0.9) | F-1 (5.0) | PGMEA (576) | CyHO (1,728) |
| | 1-2 | R-02 | P-2 (80) | — | Q-1 (0.9) | F-1 (5.0) | PGMEA (576) | CyHO (1,728) |
| | 1-3 | R-03 | P-3 (80) | — | Q-1 (0.9) | F-1 (5.0) | PGMEA (576) | CyHO (1,728) |
| | 1-4 | R-04 | P-4 (80) | — | Q-1 (0.9) | F-1 (5.0) | PGMEA (576) | CyHO (1,728) |

TABLE 5-continued

|  | Resist | Resin (pbw) | PAG (pbw) | Quencher (pbw) | Surfactant (pbw) | Solvent 1 (pbw) | Solvent 2 (pbw) |
|---|---|---|---|---|---|---|---|
| | 1-5 R-05 | P-5 (80) | — | Q-1 (0.9) | F-1 (5.0) | PGMEA (576) | CyHO (1,728) |
| | 1-6 R-06 | P-1 (80) | PAG-5 (2.0) | Q-1 (0.9) | F-1 (5.0) | PGMEA (576) | CyHO (1,728) |
| | 1-7 R-07 | P-1 (40) P-10 (40) | — | Q-1 (0.9) | F-1 (5.0) | PGMEA (576) | CyHO (1,728) |
| | 1-8 R-08 | P-1 (80) | PAG-6 (5.7) | — | F-1 (5.0) | PGMEA (576) | CyHO (1,728) |
| Comparative Example | 1-1 R-09 | P-6 (80) | — | Q-1 (0.9) | F-1 (5.0) | PGMEA (576) | CyHO (1,728) |
| | 1-2 R-10 | P-7 (80) | — | Q-1 (0.9) | F-1 (5.0) | PGMEA (576) | CyHO (1,728) |
| | 1-3 R-11 | P-8 (80) | — | Q-1 (0.9) | F-1 (5.0) | PGMEA (576) | CyHO (1,728) |
| | 1-4 R-12 | P-9 (80) | — | Q-1 (0.9) | F-1 (5.0) | PGMEA (576) | CyHO (1,728) |
| | 1-5 R-13 | P-10 (80) | PAG-5 (7.6) | Q-1 (0.9) | F-1 (5.0) | PGMEA (576) | CyHO (1,728) |

The PAG, solvent, amine quencher, alkali-soluble surfactant (F-1) and surfactant (F-2) used herein are identified below.

Photoacid Generator

PAG-5: triphenylsulfonium 2-(adamantane-1-carbonyloxy)-1,1,3,3,3-pentafluoropropane-1-sulfonate (see JP-A 2007-145797)

PAG-6: triphenylsulfonium camphorsulfonate

Organic Solvent

PGMEA: propylene glycol monomethyl ether acetate

CyHO: cyclohexanone

Quencher

Q-1: 2,6-diisopropylaniline

Surfactant

F-1: poly(3,3,3-trifluoro-2-hydroxy-1,1-dimethyl-2-trifluoromethylpropyl methacrylate/1,1,1-trifluoro-2-hydroxy-6-methyl-2-trifluoromethylhept-4-yl methacrylate) (described in JP-A 2008-122932) Mw=7,300 Mw/Mn=1.86

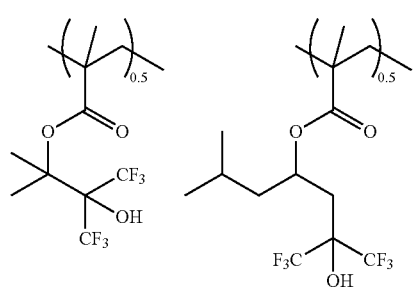

Polymer 1

F-2: 3-methyl-3-(2,2,2-trifluoroethoxymethyl)oxetane/ tetrahydrofuran/2,2-dimethyl-1,3-propane diol copolymer (Omnova Solutions, Inc.)

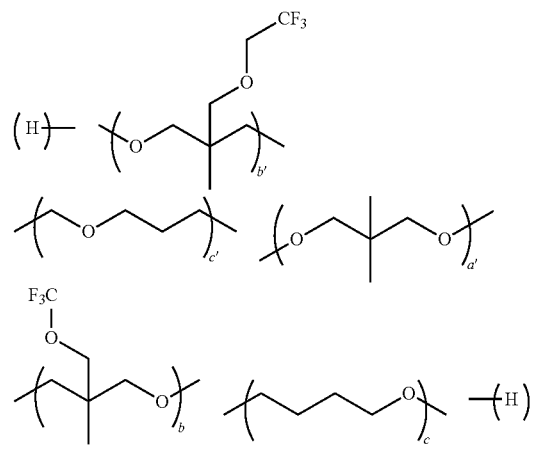

a: (b + b') : (c + c') = 1 : 4-7 : 0.01-1 (molar ratio)
Mw = 1,500

Resist Test 1 (EB Writing)

Examples 2-1 to 2-8 and Comparative Examples 2-1 to 2-5

Using a coater/developer system Clean Track Mark 5 (Tokyo Electron Ltd.), the resist composition was spin coated onto a silicon substrate (diameter 6 inches=150 mm, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the resist film was baked (PEB) on a hot plate at 95° C. for 60 seconds and puddle developed in a 2.38 wt % TMAH aqueous solution for 30 seconds to form a positive pattern.

Sensitivity is the exposure dose that provides a 1:1 resolution of a 100-nm line-and-space pattern. Resolution is a minimum size at the exposure dose. The 100-nm L/S pattern was measured for line width roughness (LWR) under SEM.

Table 6 shows the sensitivity, resolution and LWR of resist compositions on EB lithography.

TABLE 6

| | Resist | Sensitivity (µC/cm²) | Resolution (nm) | LWR (nm) |
|---|---|---|---|---|
| Example | 2-1 R-01 | 24.8 | 75 | 5.4 |
| | 2-2 R-02 | 25.2 | 75 | 5.5 |
| | 2-3 R-03 | 21.8 | 75 | 5.8 |
| | 2-4 R-04 | 22.2 | 75 | 5.8 |
| | 2-5 R-05 | 23.3 | 75 | 6.0 |
| | 2-6 R-06 | 24.6 | 75 | 5.9 |
| | 2-7 R-07 | 26.2 | 80 | 6.0 |
| | 2-8 R-08 | 26.4 | 80 | 5.6 |
| Comparative Example | 2-1 R-09 | 26.8 | 80 | 7.6 |
| | 2-2 R-10 | 26.9 | 80 | 7.2 |
| | 2-3 R-11 | 27.0 | 85 | 7.9 |
| | 2-4 R-12 | 28.4 | 85 | 8.0 |
| | 2-5 R-13 | 26.5 | 85 | 8.2 |

As is evident from Table 6, the resist composition comprising a sulfonium salt-containing polymer within the scope of the invention shows a high resolution and a low LWR on EB lithography.

Resist Test 2 (EUV Exposure)

Examples 3-1 to 3-8 and Comparative Examples 3-1 to 3-5

A positive resist composition was prepared by dissolving selected components in a solvent in accordance with the recipe shown in Table 5, and filtering through a filter having a pore size of 0.2 µm. The resist composition was spin coated on a silicon substrate (diameter 4 inches=100 mm, HMDS vapor primed) and prebaked on a hot plate at 105° C. for 60 seconds to form a resist film of 50 nm thick. EUV exposure was performed by dipole illumination at NA 0.3.

Immediately after the exposure, the resist film was baked (PEB) on a hot plate for 60 seconds and puddle developed in a 2.38 wt % TMAH aqueous solution for 30 seconds to form a positive pattern.

Sensitivity is the exposure dose that provides a 1:1 resolution of a 35-nm line-and-space pattern. Resolution is a minimum size at the exposure dose. The 35-nm L/S pattern was measured for LWR under SEM.

Table 7 shows the sensitivity, resolution and LWR of resist compositions on EUV lithography.

TABLE 7

| | Resist | Sensitivity (µC/cm²) | Resolution (nm) | LWR (nm) |
|---|---|---|---|---|
| Example | 3-1 R-01 | 11 | 28 | 4.6 |
| | 3-2 R-02 | 11 | 28 | 4.7 |
| | 3-3 R-03 | 10 | 26 | 4.3 |
| | 3-4 R-04 | 10 | 26 | 4.5 |
| | 3-5 R-05 | 10 | 26 | 4.4 |
| | 3-6 R-06 | 12 | 32 | 5.2 |
| | 3-7 R-07 | 12 | 30 | 5.1 |
| | 3-8 R-08 | 12 | 30 | 5.0 |
| Comparative Example | 3-1 R-09 | 13 | 38 | 5.6 |
| | 3-2 R-10 | 13 | 36 | 5.4 |
| | 3-3 R-11 | 14 | 40 | 5.8 |
| | 3-4 R-12 | 15 | 40 | 5.8 |
| | 3-5 R-13 | 14 | 38 | 5.9 |

As is evident from Table 7, the resist composition comprising a sulfonium salt-containing polymer within the scope of the invention shows a high resolution and a low LWR on EUV lithography.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2012-127062 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photo or heat-sensitive polymer comprising recurring units having the general formula (1A) or (1B) and recurring units having the general formula (2):

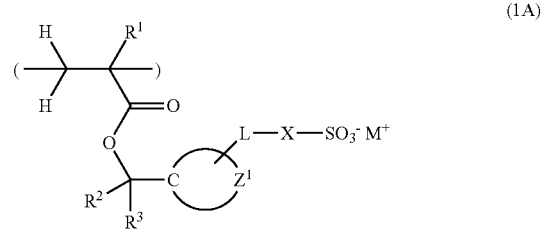

(1A)

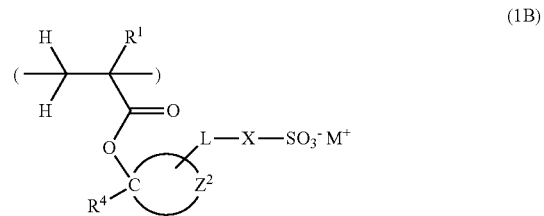

(1B)

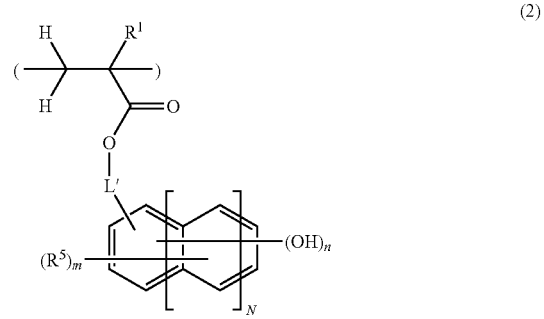

(2)

wherein $R^1$ is hydrogen, methyl or trifluoromethyl, $R^2$, $R^3$ and $R^4$ are each independently a straight, branched or cyclic $C_1$-$C_{15}$ monovalent hydrocarbon group, L is a single bond or a straight, branched or cyclic $C_1$-$C_{20}$ divalent hydrocarbon group which may be substituted with or separated by a heteroatom, X is a $C_1$-$C_5$ divalent alkylene group in which some or all hydrogen atoms may be substituted by fluorine atoms, each of $Z^1$ and $Z^2$ forms a $C_5$-$C_{15}$ alicyclic group with the carbon atom to which it is attached, $R^5$ is a halogen atom or $C_1$-$C_{10}$ alkyl group, L' is a single bond or $C_1$-$C_{10}$ divalent organic group which may be substituted with an oxygen atom, m is an integer of 0 to 3, n is an integer of 1 or 2, N is an integer of 0 to 2, $M^+$ is a sulfonium cation of the general formula (a) or iodonium cation of the general formula (b), (a)
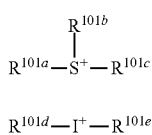

(b)

$R^{101d}$—$I^+$—$R^{101e}$ wherein $R^{101a}$, $R^{101b}$, and $R^{101c}$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^{101a}$, $R^{101b}$, and $R^{101c}$ may bond together to form a ring with the sulfur atom, $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom.

2. The polymer of claim 1 wherein the recurring units (1A) or (1B) have the general formula (3A) or (3B):

(3A)

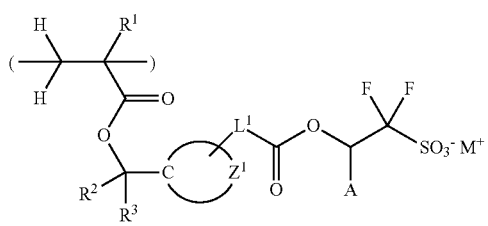

(3B)

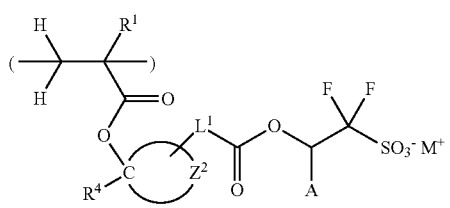

wherein $R^1$, $R^2$, $R^3$, $R^4$, $Z^1$, $Z^2$, and $M^+$ are as defined in claim 1, $L^1$ is a single bond or a straight, branched or cyclic $C_1$-$C_{20}$ divalent hydrocarbon group which may be substituted with or separated by a heteroatom, and A is hydrogen or trifluoromethyl.

3. The polymer of claim 1, further comprising recurring units of at least one type selected from the general formulae (4) and (5):

(4)

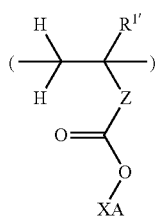

(5)

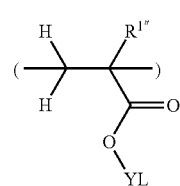

wherein $R^{1'}$ and $R^{1'''}$ are each independently hydrogen, methyl or trifluoromethyl, Z is a single bond, phenylene group, naphthylene group or (backbone) —C(=O)—O—Z'—, Z' is a straight, branched or cyclic $C_1$-$C_{10}$ alkylene group which may contain a hydroxyl radical, ether bond, ester bond or lactone ring, or phenylene group or naphthylene group, XA is an acid labile group, and YL is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

4. A resist composition comprising the polymer of claim 1 as a base resin.

5. The resist composition of claim 4, further comprising a polymer free of the following recurring units having formulae (1A), (1B), (3A) and (3B) as a base resin:

(1A)

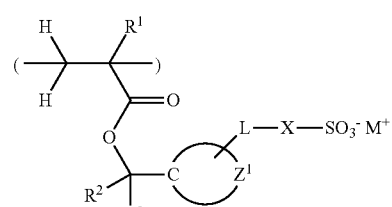

(1B)

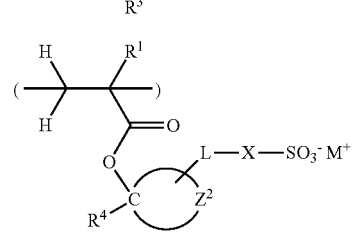

(2)

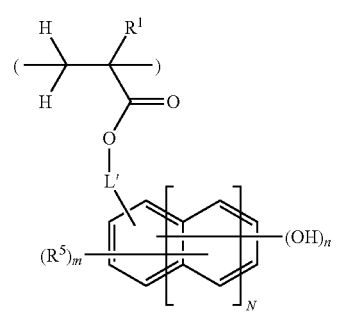

wherein $R^1$ is hydrogen, methyl or trifluoromethyl, $R^2$, $R^3$ and $R^4$ are each independently a straight, branched or cyclic $C_1$-$C_{15}$ monovalent hydrocarbon group, L is a single bond or a straight, branched or cyclic $C_1$-$C_{20}$ divalent hydrocarbon group which may be substituted with or separated by a heteroatom, X is a $C_1$-$C_5$ divalent alkylene group in which some or all hydrogen atoms may be substituted by fluorine atoms, each of $Z^1$ and $Z^2$ forms a $C_5$-$C_{15}$ alicyclic group with the carbon atom to which it is attached, $M^+$ is a sulfonium cation of the general formula (a) or iodonium cation of the general formula (b),

(a)

(b)

wherein $R^{101a}$, $R^{101b}$, and $R^{101c}$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^{101a}$, $R^{101b}$, and $R^{101c}$ may bond together to form a ring with the sulfur atom, $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom,

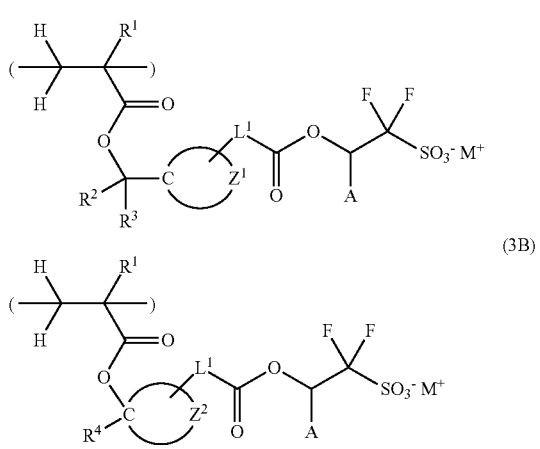

(3A)

(3B)

wherein $R^1$, $R^2$, $R^3$, $R^4$, $Z^1$, $Z^2$, and $M^+$ are as defined above, $L^1$ is a single bond or a straight, branched or cyclic $C_1$-$C_{20}$ divalent hydrocarbon group which may be substituted with or separated by a heteroatom, and A is hydrogen or trifluoromethyl.

6. A pattern forming process comprising the steps of applying the resist composition of claim 5 onto a substrate to form a coating, baking, exposing the coating to high-energy radiation, and developing the exposed coating in a developer.

7. The resist composition of claim 4, further comprising a basic compound and an organic solvent.

8. A pattern forming process comprising the steps of applying the resist composition of claim 7 onto a substrate to form a coating, baking, exposing the coating to high-energy radiation, and developing the exposed coating in a developer.

9. The resist composition of claim 4, further comprising a non-polymeric acid generator.

10. A pattern forming process comprising the steps of applying the resist composition of claim 9 onto a substrate to form a coating, baking, exposing the coating to high-energy radiation, and developing the exposed coating in a developer.

11. The resist composition of claim 4, further comprising a surfactant which is insoluble in water and soluble in alkaline developer.

12. A pattern forming process comprising the steps of applying the resist composition of claim 11 onto a substrate to form a coating, baking, exposing the coating to high-energy radiation, and developing the exposed coating in a developer.

13. A pattern forming process comprising the steps of applying the resist composition of claim 4 onto a substrate to form a coating, baking, exposing the coating to high-energy radiation, and developing the exposed coating in a developer.

14. The process of claim 13 wherein the exposure step is carried out by immersion lithography using a liquid having a refractive index of at least 1.0 between the resist coating and a projection lens.

15. The process of claim 14, further comprising the step of coating a protective film on the resist coating prior to the exposure step, wherein immersion lithography is carried out while the liquid is held between the protective film and the projection lens.

16. The process of claim 13 wherein the high-energy radiation is electron beam or soft X-ray having a wavelength of 3 to 15 nm.

* * * * *